United States Patent
Lewis et al.

(10) Patent No.: US 10,643,010 B2
(45) Date of Patent: May 5, 2020

(54) SCALABLE SIMULATION SYSTEM WITH SCALABLE DATA PROPAGATION

(71) Applicant: Improbable Worlds Ltd, London (GB)

(72) Inventors: Matthew John Reveley Lewis, London (GB); Rok Strnisa, London (GB); Charles Micou, London (GB); Michal Witkowski, London (GB)

(73) Assignee: Improbable Worlds Ltd, London (GB)

( * ) Notice: Subject to any disclaimer, the term of this patent is extended or adjusted under 35 U.S.C. 154(b) by 0 days.

(21) Appl. No.: 16/054,038

(22) Filed: Aug. 3, 2018

(65) Prior Publication Data

US 2018/0373825 A1    Dec. 27, 2018

Related U.S. Application Data

(63) Continuation-in-part of application No. 16/008,125, filed on Jun. 14, 2018, which is a continuation of
(Continued)

(51) Int. Cl.
*G06F 13/10* (2006.01)
*G06F 30/20* (2020.01)
(Continued)

(52) U.S. Cl.
CPC ............ *G06F 30/20* (2020.01); *G06F 9/4856* (2013.01); *G06F 9/5061* (2013.01);
(Continued)

(58) Field of Classification Search
CPC .......................... G06F 17/5009; G06F 30/20
(Continued)

(56) References Cited

U.S. PATENT DOCUMENTS 5,173,939 A    12/1992    Abadi et al.
6,826,523 B1    11/2004    Guy et al.
(Continued)

FOREIGN PATENT DOCUMENTS

CN    101005514 A    7/2007
CN    101582850 A    11/2009
(Continued)

OTHER PUBLICATIONS

Morse, K., et al. "Interest Management in Large-Scale Virtual Environments" Presence, vol. 9, No. 1, pp. 52-68 (2000) (Year: 2000).
(Continued)

*Primary Examiner* — Hugh M Jones
(74) *Attorney, Agent, or Firm* — Banner & Witcoff, Ltd.

(57) ABSTRACT

Methods, systems, computer-readable media, and apparatuses for grouping bridges in a simulation are presented. In some examples, grouping bridges may result in more efficient usage of data connections in a simulation and less duplicative data being sent during the simulation. The simulation may be performed by receiving an indication of a streaming query for each worker of a plurality of workers in a worker layer. A plurality of bridges in a bridge layer may be run, and the plurality of bridges may be configured to facilitate data communications between the plurality of workers in the worker layer and one or more databases in a database layer. Each worker of the plurality of workers may be assigned to a different bridge of the plurality of bridges. Based on the streaming query for each worker, the plurality of bridges may be grouped into different groups of bridges.

20 Claims, 26 Drawing Sheets

Related U.S. Application Data application No. 15/361,874, filed on Nov. 28, 2016, now Pat. No. 10,025,892.

(60) Provisional application No. 62/378,715, filed on Aug. 24, 2016.

(51) Int. Cl.
  *G06F 9/50*   (2006.01)
  *G06F 9/54*   (2006.01)
  *G06F 9/48*   (2006.01)
  *G06F 30/15*  (2020.01)

(52) U.S. Cl.
  CPC ............ *G06F 9/5083* (2013.01); *G06F 9/541* (2013.01); *G06F 30/15* (2020.01)

(58) Field of Classification Search
  USPC ......................................................... 703/21
  See application file for complete search history.

(56) References Cited

U.S. PATENT DOCUMENTS

| | | | |
|---|---|---|---|
| 7,076,493 | B2 | 7/2006 | Myers et al. |
| 7,383,253 | B1 | 6/2008 | Tsimelzon et al. |
| 7,853,615 | B2 | 12/2010 | Liu et al. |
| 8,135,018 | B1 | 3/2012 | Kandekar et al. |
| 9,239,739 | B2 | 1/2016 | Semin et al. |
| 10,025,892 | B2 | 7/2018 | Whitehead et al. |
| 10,146,877 | B1 | 12/2018 | Zolnieryk et al. |
| 2006/0053163 | A1 | 3/2006 | Liu et al. |
| 2012/0179855 | A1 | 7/2012 | Tsirkin et al. |
| 2012/0317624 | A1 | 12/2012 | Monjas Llorente et al. |
| 2013/0304903 | A1 | 11/2013 | Mick et al. |
| 2014/0157259 | A1 | 6/2014 | Dow et al. |
| 2014/0379775 | A1 | 12/2014 | Korangy et al. |
| 2016/0293133 | A1 | 10/2016 | Dutt |
| 2017/0180338 | A1 | 6/2017 | Hanatani et al. |
| 2018/0048532 | A1 | 2/2018 | Poort et al. |
| 2018/0060138 | A1 | 3/2018 | Whitehead |
| 2018/0060461 | A1 | 3/2018 | Whitehead |
| 2018/0060462 | A1 | 3/2018 | Whitehead |
| 2019/0045232 | A1 | 2/2019 | Sharif-Ahmadi et al. |

FOREIGN PATENT DOCUMENTS

| | | | |
|---|---|---|---|
| CN | 103593516 A | 2/2014 |
| CN | 104267676 A | 1/2015 |
| WO | 9944130 A1 | 9/1999 |

OTHER PUBLICATIONS

Carlos Eduardo Benevides Bezerra et al., "A Load Balancing Scheme for Massively Multiplayer Online Games," Multimedia Tools and Applications, Kluwer Academic Publishers, vol. 45, No. 1-3, May 21, 2009, pp. 263-270.

Ta Nguyen Binh Duong et al. "A Dynamic Load Sharing Algorithm for Massively Multiplayer Online Games" School of Computer Engineering, Nanyang Technological University, Singapore 639798, IEEE 2003, pp. 131-136.

Aug. 21, 2019—U.S. Non-Final Office Action—U.S. Appl. No. 15/795,322 (pp. 1-32).

Aug. 21, 2019—U.S. Non-Final Office Action—U.S. Appl. No. 16/008,125—pp. 1-26.

Aug. 30, 2019—U.S. Notice of Allowance—U.S. Appl. No. 16/134,372 (pp. 1-22).

Jul. 9, 2019—U.S. Final Office Action—U.S. Appl. No. 16/054,102, 28 pp.

May 20, 2019 (CN) Notice of Allowance—App. 2017800038250, 1 pg.

GameHorizon 2014—Games Development: A Different Path (Herman Narula, Improbable) http://www.youtube.com/watch?v=1fpaoKLxSE4 Jun. 3, 2014 (pp. 1-3).

Unity3D White Paper "A Guide to Moving From Internal Game Engine Technology" Oct. 16, 2015 (pp. 1-28).

Masaki Kohana, "Dynamic Data Allocation Method for Web-Based Multiserver Systems," Jan. 1, 2012. (pp. 1-74).

Roman Chertov et al., "Optimistic Load Balancing in a Distributed Virtual Environment," Network and Operating Systems Support for Digital Audio and Video, May 26, 2006. (pp. 1-6).

Fengyun Lu et al., "Load Balancing for Massively Multiplayer Online Games," The 5th Workshop on Network & System Support for Games 2006—Netgames 2006. (pp. 1-11).

"What We Found When We Simulated the Backbone of the Entire Internet on SpatialOS" Published Mar. 24, 2016, https://improbable.io/company/news/2016/03/24/what-we-found-when-we-simulated-the-backbone-of-the-entire-internet-on-spatialos (pp. 1-10).

Jul. 4, 2017 (WO) International Search Report and Written Opinion—PCT/GB2017/051231 (pp. 1-11).

Feb. 21, 2019—U.S. Non-Final Office Action—U.S. Appl. No. 16/134,372 (pp. 1-25).

Ricci, L. & Carlini, E. "Distributed Virtual Environments: From Client Server to Cloud and P2P Architectures" IEEE Int'l Conf. on High Performance Computing & Simulation (2012) available from <https://ieeexplore.ieee.org/document/6266885> (Year: 2012) (pp. 1-1).

Smed, J., T. Kaukoranta, & H. Hakonen, "A Review on Networking and Multiplayer Computer Games" TUCS Technical Report No. 454 (2002) (Year: 2002) (pp. 1-30).

Ali, A. et al. "An Overview of Networking Infrastructure for Massively Multiplayer Online Games" (2013) available at <https://pdfs.semanticscholar.org/887b/374b1010ca23a01bb89b71e40fd31e34ce92.pdf> (Year: 2013) (pp. 1-10).

Feb. 26, 2019—U.S. Non-Final Office Action—U.S. Appl. No. 16/054,102 (pp. 1-19).

Feb. 5, 2019 (PCT)—Search Report and Written Opinion—App. PCT/GB2018/053058 (pp. 1-13).

Mar. 18, 2019—U.S. Notice of Allowance—U.S. Appl. No. 15/361,921 (pp. 1-11).

Mar. 27, 2019—U.S. Notice of Allowance—U.S. Appl. No. 16/054,135 (pp. 1-22).

Feb. 28, 2019—Second Office Action—App. 2017800028250 (pp. 1-8 of original document; pp. 1-10 of translated document).

Nov. 7, 2019—International Search Report and Written Opinion—App PCT/GB2019/052627, 19 pages.

Dec. 26, 2019—(CN) First Office Action—App 2019101052932 (pp. 1-5 of original document; pp. 1-8 of translated document).

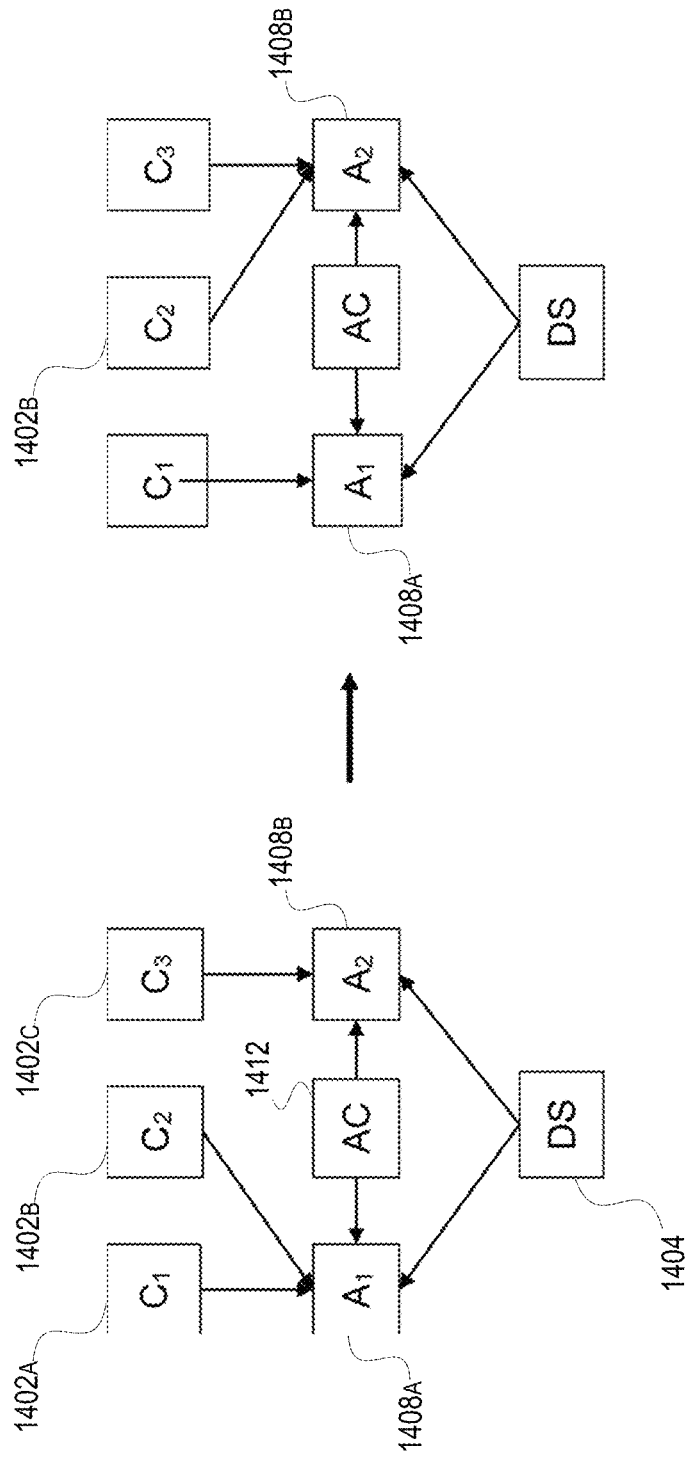

SCALABLE SIMULATION SYSTEM WITH SCALABLE DATA PROPAGATION

CROSS REFERENCE TO RELATED CASES

This application claims priority to and is a continuation-in-part of U.S. application Ser. No. 16/008,125, filed Jun. 14, 2018, entitled "Simulation Systems and Methods," which claims priority to and is a continuation of U.S. application Ser. No. 15/361,874, filed Nov. 28, 2016, entitled "Simulation Systems and Methods," which claims priority to U.S. provisional application No. 62/378,715, filed Aug. 24, 2016, entitled "Simulation Systems and Methods", by Robert James Frederick Whitehead et al., each of which is incorporated by reference herein for all purposes.

FIELD

Aspects described herein generally relate to computers, networking, hardware, and software. More specifically, some aspects described herein relate to a distributed and persistent computer-based simulation, including load balancing of data subscriptions via hierarchical aggregators and connection migrations, a networked system architecture for controlling the simulation, and/or distributable and customizable load-balancing.

BACKGROUND

Conventional simulation systems are unable to scale to support very large numbers of objects to simulate those objects in real-time. Such systems have typically relied on a single instance of a simulation engine, running on a single physical or virtual computer system, to simulate the entire simulated world. Consumers of these simulation systems have had to choose between correctness, graphical fidelity, and real-time-interaction, with no solution offering the ability for all three on a large scale system. The magnitude and complexity of the situation is further increased if the consumer desires to simulate complex real-world problems which may require more computing power than a single simulation engine can provide. For example, a simulation of a city may require simulation of a large number of vehicles, pedestrians, bicyclists, traffic patterns, traffic lights, subway systems, transit vehicles, airplanes, and a multitude of other entities that affect and contribute to city life.

In one known approach, computing resources have been statically assigned to a portion of the simulated world. A disadvantage of this approach may be that as the simulated objects, actors, etc. move across the simulated world as the simulation progresses, the simulated objects may congregate on a very small region of the simulated world. If sufficient objects move to the very small region, the computing resources may be overloaded (resulting in slower processing), the simulation may terminate unexpectedly, and/or simulation data may be lost. Another disadvantage of this approach may be that state information of the simulation for a region may be concentrated on a single computing resource and may not be shared or spread across several resources, making fault tolerance or recovery from an unexpected termination difficult and time-consuming. In addition, this approach may not lend itself to easily support stateful migration of simulated objects across region boundaries, and thus simulations usually limit stateful migrations to only players.

These and other problems are addressed herein.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

To overcome limitations in the prior art described above, and to overcome other limitations that will be apparent upon reading and understanding the present specification, aspects described herein are directed towards systems, computer-readable media, apparatuses, and methods comprising connecting a first node to a first aggregator. The first aggregator may be connected to a second node. Based on a determination that a first streaming query subscription of the first node connected to the first aggregator has changed to a second streaming query subscription, an aggregator controller device may determine to migrate the first node to another aggregator. Based on the second streaming query subscription, the aggregator controller device may determine a second aggregator for the first node to migrate to. An indication of the migration of the first node to the second aggregator may be sent to one or more of the first node or the first aggregator. The first node may be disconnected from the first aggregator, and the first node may be connected to the second aggregator.

In some examples, the first node may comprise a client or an aggregator. Additionally or alternatively, the second node may comprise a third aggregator or a data source. Optionally, the method may comprise subscribing the first node to a streaming query subscription comprising the second streaming query subscription after connecting the first node to the second aggregator.

In some examples, determining the second aggregator for the first node to migrate to may be based on a determination that the migration of the first node to the second aggregator would reduce an amount of data sent via a plurality of connections of a network comprising at least the first node and the second node. Additionally or alternatively, determining the second aggregator for the first node to migrate to may be based on an amount of data corresponding to an overlapping portion of the second streaming query subscription and one or more other streaming query subscriptions associated with the second aggregator. Additionally or alternatively, determining the second aggregator for the first node to migrate to may be based on an amount of overlap of the second streaming query subscription to one or more other streaming query subscriptions associated with the second aggregator.

In some examples, the one or more other streaming query subscriptions may comprise a third streaming query subscription of a third node connected to the second aggregator. The method may further comprise determining a fourth streaming query subscription comprising the second streaming query subscription and the third streaming query subscription. The second aggregator may be subscribed to the fourth streaming query subscription of the second node.

In some examples, the method may further comprise receiving, by the second aggregator, updated data associated with the fourth streaming query subscription. The second aggregator may determine a portion of the updated data corresponding to the second streaming query subscription and a portion of the updated data corresponding to the third streaming query subscription. The second aggregator may send, to the first node, the portion of the updated data corresponding to the second streaming query subscription. The second aggregator may also send, to the third node, the portion of the updated data corresponding to the third streaming query subscription.

In some examples, the second node may comprise a data source. Sending the indication of the migration may comprise sending, to the first node, a request to temporarily store data for updating the data source. The method may further comprise receiving, by the second aggregator and from the first node, data temporarily stored by the first node during migration after connecting the first node to the second aggregator.

In some examples, the method may comprise determining that the second node is overloaded. Based on determining that the second node is overloaded, the second aggregator may be combined with one or more other aggregators to generate a combined aggregator. Clients connected to the second aggregator and clients connected to the one or more other aggregators may be caused to connect to the combined aggregator.

In some examples, the method may comprise determining that the second node is overloaded. Based on determining that the second node is overloaded, a third aggregator may be generated at a layer between the second aggregator and the second node. The third aggregator may be connected to the second aggregator. The third aggregator may also be connected to one or more other aggregators at a layer of the second aggregator. The third aggregator may also be connected to the second node.

In some examples, the method may comprise determining that the aggregator controller device is overloaded. Based on determining that the aggregator controller device is overloaded, a second aggregator controller device may be generated. The second aggregator controller device may be assigned to one or more aggregators monitored by the aggregator controller device.

In some examples, the method may comprise sending, to the second aggregator, an indication of a current view of data for the first node.

Aspects described herein are directed towards methods, systems, apparatuses, and computer-readable media storing computer executable instructions that, when executed, cause a system to perform a simulation by receiving an indication of a streaming query for each worker of a plurality of workers in a worker layer of the simulation. The simulation may run, on a plurality of machines, a plurality of bridges in a bridge layer of the simulation, and the plurality of bridges may be configured to facilitate data communications between the plurality of workers in the worker layer and one or more databases in a database layer of the simulation. Each worker of the plurality of workers may be assigned to a different bridge of the plurality of bridges. Based on the streaming query for each worker, the plurality of bridges may be grouped into different groups of bridges. Each group of bridges may run on a different machine of the plurality of machines.

In some examples, the plurality of bridges may comprise a first plurality of bridges. The one or more non-transitory computer readable media may store computer executable instructions that, when executed, cause the system to perform the simulation by running, on a second plurality of machines, a second plurality of bridges. The first plurality of bridges may be configured to facilitate data communications between the plurality of workers in the worker layer and the second plurality of bridges. The second plurality of bridges may be configured to facilitate data communications between the first plurality of bridges and the one or more databases.

In some examples, a first worker, of the plurality of workers, may comprise an unmanaged worker, and a second worker, of the plurality of workers, may comprise a managed worker. Optionally, the one or more databases may comprise a plurality of database shards, and each database shard may be configured to store data from distinct data domains. Optionally, the plurality of machines may comprise a plurality of virtual machines.

In some examples, grouping the plurality of bridges into different groups of bridges may be based on an amount of data corresponding to an overlapping portion of streaming queries in each of the different groups of bridges.

In some examples, the one or more non-transitory computer readable media may store computer executable instructions that, when executed, cause the system to perform the simulation by running, on a machine of the plurality of machines, a database client. Each bridge running on the machine may be connected to the database client. The database client may be configured to subscribe to a streaming query for receiving, from the one or more databases, streaming data corresponding to the streaming query.

In some examples, the one or more non-transitory computer readable media may store computer executable instructions that, when executed, cause the system to perform the simulation by combining streaming queries on the machine into a combined streaming query. The database client may be configured to subscribe to the combined streaming query for receiving, from the one or more databases, streaming data corresponding to the combined streaming query.

In some examples, the database client may be configured to divide the streaming data corresponding to the streaming query into a plurality of portions of streaming data. The database client may be configured to send, to each bridge running on the machine, one of the plurality of portions of the streaming data.

In some examples, the one or more non-transitory computer readable media may store computer executable instructions that, when executed, cause the system to perform the simulation by determining to migrate, to a first machine of the plurality of machines, a first bridge of the plurality of bridges and running on a second machine of the plurality of machines. A first worker may be assigned to the first bridge. A second bridge may run on the first machine of the plurality of machines. The first worker may be assigned to the second bridge running on the first machine. Optionally, determining to migrate the first bridge may be based on an amount of data corresponding to an overlapping portion of a streaming query for the first worker with streaming queries for workers assigned to bridges running on the first machine.

Aspects described herein are directed towards methods, systems, computer-readable media, and apparatuses comprising one or more computer processor controlling some operations of the apparatus, and memory storing computer-executable instructions that, when executed by the one or more computer processor, cause the apparatus to perform one or more steps. For example, the apparatus may determine a plurality of partitions of a simulated world. Each partition, of the plurality of partitions, may correspond to a different metric, of a plurality of metrics, for one or more of entities in the simulated world or components of the entities in the simulated world. The apparatus may determine a plurality of virtual processes for the simulated world. The apparatus may assign, to each partition of the plurality of partitions, a different virtual process of the plurality of virtual processes. An indication of the plurality of partitions and an assignment for each partition of the plurality of partitions may be sent to one or more partition enforcer services. An indication of the plurality of virtual processes may be sent to a virtual process manager.

In some examples, the plurality of partitions of the simulated world may comprise a first partition and a second partition. Optionally, the plurality of metrics may comprise a first bounded region of the simulated world and a second bounded region of the simulated world. Optionally, the first bounded region of the simulated world may be different from the second bounded region of the simulated world. Optionally, the first partition may correspond to entities in the first bounded region of the simulated world. Optionally, the second partition may correspond to entities in the second bounded region of the simulated world. In some examples, entities in the simulated world may be capable of moving between different bounded regions of the simulated world.

In some examples, the plurality of partitions of the simulated world may comprise a third partition. The plurality of metrics may comprise a component type, and the third partition may correspond to entities having the component type. Optionally, the virtual process manager may be configured to start or stop virtual processes in a virtual process layer based on data received from the apparatus.

In some examples, the plurality of virtual processes may comprise a plurality of virtual workers. The apparatus may receive, from an external computing device, a request to replace a first virtual worker, of the plurality of virtual workers, with an external virtual worker running on the external computing device. The apparatus may send, to a worker layer, a request to disconnect the first virtual worker from a bridge in a bridge layer. The external virtual worker may be connected to the bridge in the bridge layer to replace the first virtual worker.

In some examples, the apparatus may receive, from a configuration database, data indicative of configuration data for the simulated world. The apparatus may additionally or alternatively receive external data from an external services database. Determining the plurality of partitions of the simulated world may be based on the configuration data and the external data.

In some examples, a first partition, of the plurality of partitions, may overlap a second partition of the plurality of partitions. In other examples, a first partition, of the plurality of partitions, might not overlap a second partition of the plurality of partitions.

BRIEF DESCRIPTION OF THE DRAWINGS

A more complete understanding of aspects described herein and the advantages thereof may be acquired by referring to the following description in consideration of the accompanying drawings, in which like reference numbers indicate like features, and wherein:

FIGS. 14A-B show an example system comprising an aggregator controller in accordance with one or more illustrative aspects described herein.

DETAILED DESCRIPTION

In the following description of the various embodiments, reference is made to the accompanying drawings identified above and which form a part hereof, and in which is shown by way of illustration various embodiments in which aspects described herein may be practiced. It is to be understood that other embodiments may be utilized and structural and functional modifications may be made without departing from the scope described herein. Various aspects are capable of other embodiments and of being practiced or being carried out in various different ways. Additionally, the phraseology and terminology used herein are for the purpose of description and should not be regarded as limiting. Rather, the phrases and terms used herein are to be given their broadest interpretation and meaning.

As will be appreciated by one of skill in the art upon reading the following disclosure, various aspects described herein may be embodied as a method, a computer system, or a computer program product. Accordingly, those aspects may take the form of an entirely hardware embodiment, an entirely software embodiment or an embodiment combining software and hardware aspects. Furthermore, such aspects may take the form of a computer program product stored by one or more computer-readable storage media having computer-readable program code, or instructions, embodied in or on the storage media. Any suitable computer-readable storage media may be utilized, including hard disks, CD-ROMs, optical storage devices, magnetic storage devices, and/or any combination thereof. Particular data structures may be used to more effectively implement one or more aspects described herein, and such data structures are contemplated within the scope of computer executable instructions and computer-usable data described herein. In addition, various signals representing data or events as described herein may be transferred between a source and a destination in the form of electromagnetic waves traveling through signal-conducting media such as metal wires, optical fibers, and/or wireless transmission media (e.g., air and/or space.)

As a general introduction to the subject matter described in more detail below, aspects described herein are directed towards systems, methods, and techniques for providing a distributed and persistent simulation development environment. In some examples, the simulation development environment may also be spatially-optimized. In some other examples, the simulation development environment might not be spatially-optimized. Other aspects described herein may allow for the integration of existing non-distributed simulation programs into a large-scale distributed simulation. Yet other aspects described herein may be used to automatically and spatially balance and distribute the simulation workload.

Figure 1:
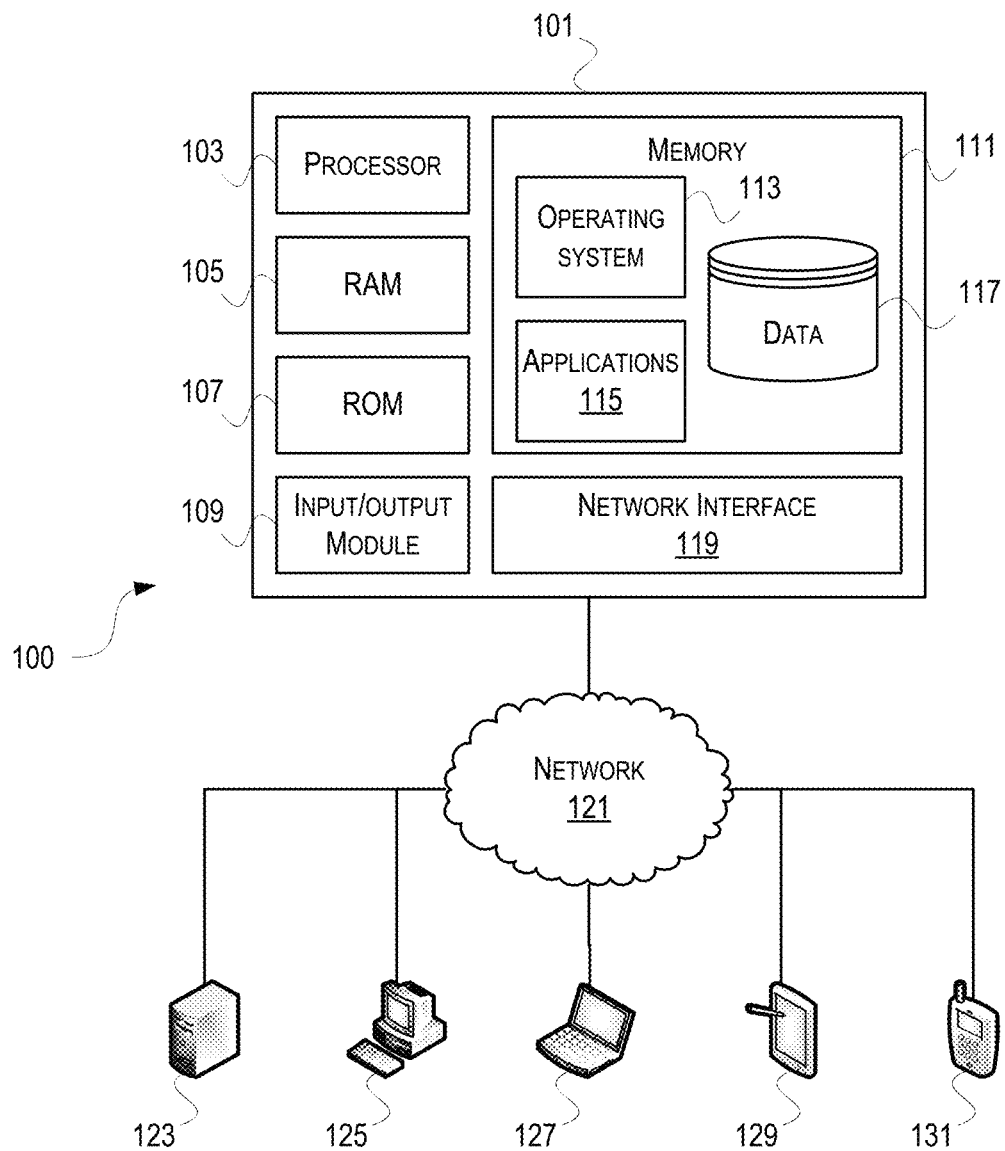
FIG. 1 depicts an illustrative computer system architecture that may be used in accordance with one or more illustrative aspects described herein.

Computer software, hardware, and networks may be utilized in a variety of different system environments, including standalone, networked, virtualized, and/or cloud-based environments, among others. FIG. 1 illustrates one example of a block diagram of a simulation computing device (or system) 101 in a simulation computing system 100 that may be used according to one or more illustrative embodiments of the disclosure. For example, the simulation computing device 101 may be a spatially-optimized simulation computing device, and the simulation computing system 100 may be a spatially-optimized simulation computing system. The simulation computing device 101 may comprise a processor 103 for controlling overall operation of the simulation computing device 101 and its associated components, including RAM 105, ROM 107, input/output module 109, and memory 111. The simulation computing device 101, along with one or more additional computing devices (e.g., network nodes 123, 125, 127, 129, and 131) may correspond to any one of multiple systems or devices described herein, such as personal mobile devices, client computing devices, proprietary simulation systems, additional external servers and other various devices in a simulation computing system 100, such as a spatially-optimized simulation computing system. These various computing systems may be configured individually or in combination, as described herein, for providing a simulation computing system 100. In addition to the features described above, the techniques described herein also may be used for allowing integration of existing simulation programs, and for load-balancing the simulation workload across the simulation computing system 100, as will be discussed more fully herein. Those of skill in the art will appreciate that the functionality of simulation computing device 101 (or devices 123, 125, 127, 129, and 131) as described herein may be spread across multiple processing devices, for example, to distribute processing load across multiple computers, to segregate transactions based on processor load, location within a simulated world, user access level, quality of service (QoS), and the like.

The various network nodes 123, 125, 127, 129, and 131 may be interconnected via a network 121, such as the Internet. Other networks may also or alternatively be used, including private intranets, corporate networks, local area networks (LAN), wide area networks (WAN), metropolitan area networks (MAN), wireless networks, personal networks (PAN), and the like. Network 121 is for illustration purposes and may be replaced with fewer or additional computer networks. Network 121 may have one or more of any known network topology and may use one or more of a variety of different protocols, such as Ethernet. Devices 123, 125, 127, 129, 131, and other devices (not shown) may be connected to one or more of the networks via twisted pair wires, coaxial cable, fiber optics, radio waves, or other communication media.

It will be appreciated that the network connections shown are illustrative and other means of establishing a communications link between the computers may be used. The existence of any of various network protocols such as TCP/IP, Ethernet, FTP, HTTP and the like, and of various wireless communication technologies such as GSM, CDMA, Wi-Fi, and WiMAX, is presumed, and the various computing devices in simulation system components described herein may be configured to communicate using any of these network protocols or technologies.

The term "network" as used herein and depicted in the drawings refers not only to systems in which remote computing devices are coupled together via one or more communication paths, but also to stand-alone devices that may be coupled, from time to time, to such systems that have storage capability. Consequently, the term "network" includes not only a "physical network" but also a "content network," which is comprised of the data which resides across all physical networks.

The Input/Output (I/O) module 109 may include a microphone, keypad, touch screen, game controller, joystick, and/or stylus through which a user of the simulation computing device 101 may provide input, and may also include one or more of a speaker for providing audio output and a video display device for providing textual, audiovisual and/or graphical output. Software may be stored within memory 111 and/or storage to provide instructions to processor 103 for enabling a simulation computing device 101 to perform various actions. For example, memory 111 may store software used by a simulation computing device 101, such as an operating system 113, application programs 115, and an associated internal database 117. The database 117 may include a second database (e.g., as a separate table, report, etc.) That is, the information may be stored in a single database, or separated into different logical, virtual, or physical databases, depending on system design. The various hardware memory units in memory 111 may include volatile and nonvolatile, removable and non-removable media implemented in any method or technology for storage of information such as computer-readable instructions, data structures, program modules, or other data. Simulation computing device 101 and/or computing devices 127, 129, 131 may also be mobile terminals (e.g., mobile phones, smartphones, personal digital assistants (PDAs), notebooks, etc.) including various other components, such as a battery, speaker, and antennas (not shown.)

Aspects described herein may also be operational with numerous other general purpose or special purpose computing system environments or configurations. Examples of other computing systems, environments, and/or configurations that may be suitable for use with aspects described herein include, but are not limited to, personal computers, server computers, hand-held or laptop devices, vehicle-based computing devices, multiprocessor systems, microprocessor-based systems, programmable consumer electronics, network personal computers (PCs), minicomputers, mainframe computers, distributed computing environments that include any of the above systems or devices, and the like.

Figure 2:
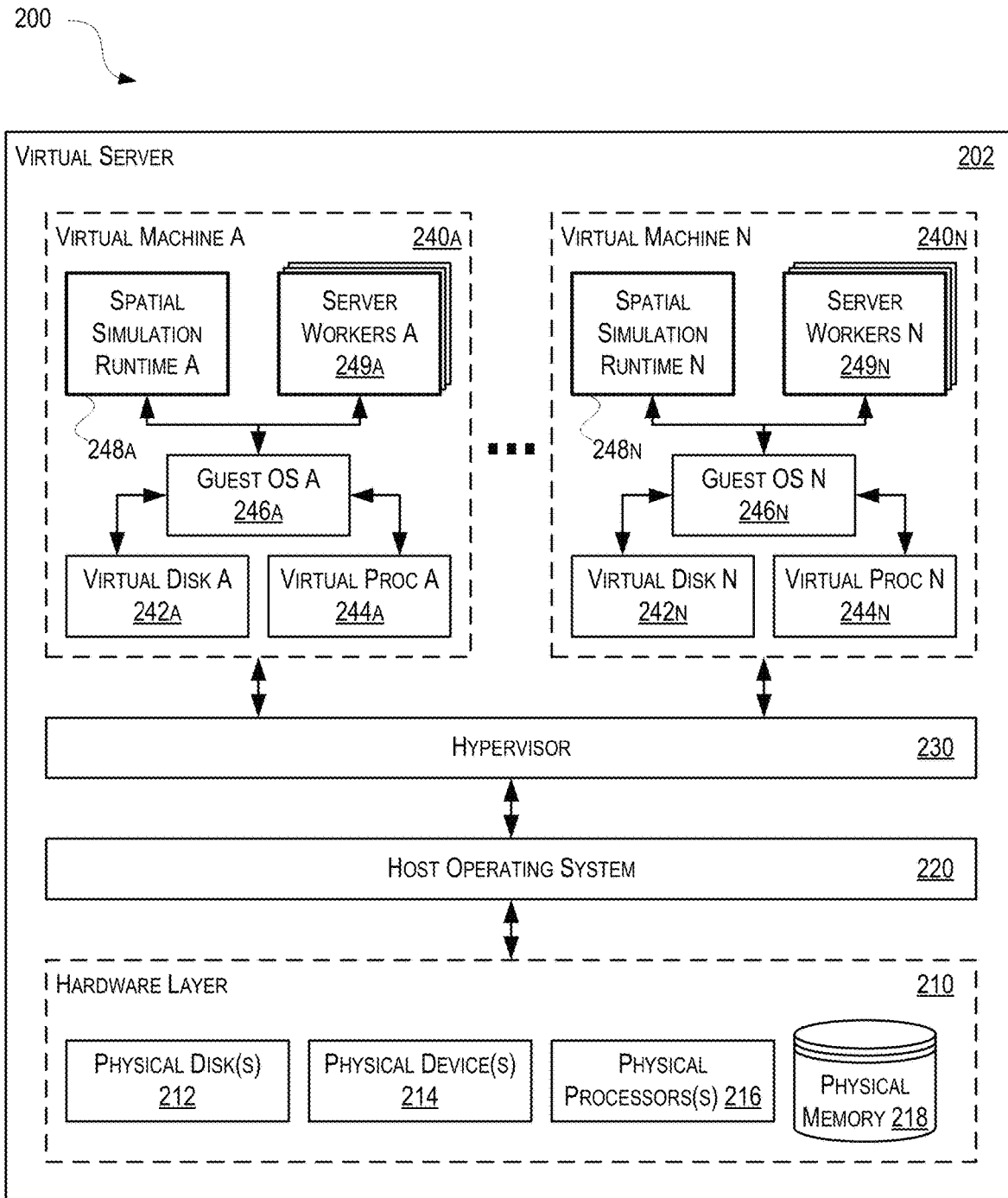
FIG. 2 depicts an illustrative virtualized (hypervisor) system architecture that may be used in accordance with one or more illustrative aspects described herein.

FIG. 2 shows a high-level architecture of an illustrative simulation system. The simulation system may be spatially-optimized. As shown, the simulation system 200 may be a single server system, a multi-server system, or a cloud-based system, including at least one virtual server 202 which may be configured to provide simulation functionality to the simulation system 200 and/or may provide access to the simulation system 200 to one or more client computing devices (e.g., computing devices 123, 125, 127, 129, 131.) A virtual server 202 may comprise one or more virtual machines 240a-240n (generally referred to herein as "virtual machine(s) 240"). Each virtual machine 240 may comprise an instance of a simulation runtime 248 for instantiating, managing, and monitoring one or more instances of server worker processes 249a-249n (generally referred to herein as "worker(s) 249.") As described in further detail below, the simulation runtime 248 may be configured to automatically spool up or spool down workers 249, as needed, based on the instantaneous workload of particular partitions of the simulated world generated by the simulation system. The partitions of the simulated world may be spatial, but need not be spatial.

The one or more instances of the simulation runtime 248 within a virtual server 202 may communicate with each other to determine an instance which may serve as a master. For example, the simulation runtime 248 instances may utilize a consensus protocol to determine a master. A master simulation runtime 248 instance may be responsible for routing communications between the other simulation runtime 248 instances within the virtual server 202 and other simulation runtimes 248 executing in other virtual servers 202. As will be explained in greater detail below, the simulation runtime 248 may allow for distributed simulations where simulation workload is automatically distributed across available virtual server(s) 202. The virtual server 202 illustrated in FIG. 2 may be deployed as and/or implemented by one or more embodiments of the simulation computing device 101 illustrated in FIG. 1 or by other known computing devices.

The virtual server 202 may comprise a hardware layer 210 with one or more hardware elements that communicate with the virtual server 202. Optionally, the hardware layer 210 may comprise one or more physical disks 212, one or more physical devices 214, one more physical processors 216, and one or more physical memories 218. Physical components 212, 214, 216, and 218 may include, for example, any of the components described above with respect to simulation computing device 101. In one example, physical devices 214 may include a network interface card, a video card, a keyboard, a mouse, an input device, a monitor, a display device, speakers, an optical drive, a storage device, a universal serial bus connection, a printer, a scanner, a network element (e.g., router, firewall, network address translator, load balancer, virtual private network (VPN) gateway, Dynamic Host Configuration Protocol (DHCP) router, etc.), or any device connected to or communicating with virtualization server 301. Physical memory 218 may include any type of memory. In another example, physical memory 218 may store data, and may store one or more programs, or set of executable instructions. Programs or executable instructions stored in the physical memory 218 may be executed by the one or more processors 216 of virtual server 202. Virtual server 202 may further comprise a host operating system 220 which may be stored in a memory element in the physical memory 218 and may be executed by one or more of the physical processors 216.

Hypervisor 230 may provide virtual resources to operating systems 246a-246n or to workers 249 executing on virtual machines 240 in any manner that simulates the operating systems 246 or workers 249 having direct access to system resources. System resources may include, but are not limited to, physical disks 212, physical devices 214, physical processors 216, physical memory 218, and any other component included in hardware layer 210. Hypervisor 230 may be used to emulate virtual hardware, partition physical hardware, virtualize physical hardware, and/or execute virtual machines that provide computing resources to simulation runtime 248 and workers 249. Hypervisor 230 may control processor scheduling and memory partitioning for a virtual machine 240 executing on virtual server 202.

Hypervisor 230 may be Type 2 hypervisor, where the hypervisor may execute within a host operating system 220 executing on the virtual server 202. Virtual machines 240 may then execute at a level above the hypervisor 230. The Type 2 hypervisor may execute within the context of a host operating system 220 such that the Type 2 hypervisor interacts with the host operating system 220. One or more virtual server 202 in a simulation system 200 may instead include a Type 1 hypervisor (not shown.) A Type 1 hypervisor may execute on a virtual server 202 by directly accessing the hardware and resources within the hardware layer 210. That is, while a Type 2 hypervisor 230 may access system resources through a host operating system 220, as shown, a Type 1 hypervisor may directly access all system resources without the host operating system 220. A Type 1 hypervisor 230 may execute directly on one or more physical processors 316 of virtual server 202, and may include program data stored in the physical memory 318.

The simulation runtime 248 may cause the hypervisor 230 to create one or more virtual machines 240 in which additional simulation runtime 248 and worker 249 instances may execute within guest operating systems 246. Hypervisor 230 may load a virtual machine image to create a virtual machine 240. The hypervisor 230 may execute a guest operating system 246 within virtual machine 240. Virtual machine 240 may execute guest operating system 246.

In addition to creating virtual machines 240, hypervisor 230 may control the execution of at least one virtual machine 240. Hypervisor 230 may present at least one virtual machine 240 with an abstraction of at least one hardware resource provided by the virtual server 202 (e.g., any hardware resource available within the hardware layer 210.) Hypervisor 230 may control the manner in which virtual machines 240 may access physical processors 216 available in virtual server 202. Controlling access to physical processors 216 may include determining whether a virtual machine 240 should have access to a processor 216, and how physical processor capabilities are presented to the virtual machine 240.

As shown in FIG. 2, virtual server 202 may host or execute one or more virtual machines 240. A virtual machine 240 is a set of executable instructions that, when executed by a processor 216, imitate the operation of a physical computer such that the virtual machine 240 may execute programs and processes much like a physical computing device. While FIG. 2 illustrates an embodiment where a virtual server 202 hosts two virtual machines 240, in other embodiments virtual server 202 may host any number of virtual machines 240. Hypervisor 230 may provide each virtual machine 240 with a unique virtual view of the physical hardware, memory, processor, and other system resources available to that virtual machine 240. Optionally, hypervisor 230 may provide each virtual machine 240 with a substantially similar virtual view of the physical hardware, memory, processor, and other system resources available to the virtual machines 240.

Each virtual machine 240 may include a virtual disk 242a-242n (generally 242) and a virtual processor 244a-244n (generally 244.) The virtual disk 242 may be a virtualized view of one or more physical disks 212 of the virtual server 202, or may be a portion of one or more physical disks 212 of the virtual server 202. The virtualized view of the physical disks 212 may be generated, provided, and managed by the hypervisor 230. Hypervisor 230 may provide each virtual machine 240 with a unique view of the physical disks 212. Thus, the particular virtual disk 242 included in each virtual machine 240 may be unique when compared with the other virtual disks 240.

A virtual machine 240a-240n may execute, using a virtual processor 244a-244n, one or more workers 249a-249n using a guest operating system 246a-246n. The guest operating system 246 may be any one of the following non-exhaustive list of operating systems: WINDOWS, UNIX, LINUX, iOS, ANDROID, SYMBIAN. Guest operating system 246 may be a purpose-built operating system based on one or more of the aforementioned operating systems. For example, guest operating system 246 may consist of a purpose-built version of LINUX which may comprise only the functional modules necessary to support operation of the workers 249. Optionally, and as described in further detail below, a virtual machine 240a-240n may execute one or more bridge modules (not shown) corresponding to the one or more workers 249a-249n executing in the virtual machine 240a-240n.

FIG. 2 illustrates just one example of a simulation system that may be used, and those of skill in the art will appreciate that the specific system architecture and computing devices used may vary, and are secondary to the functionality that they provide, as further described herein.

Figure 3:
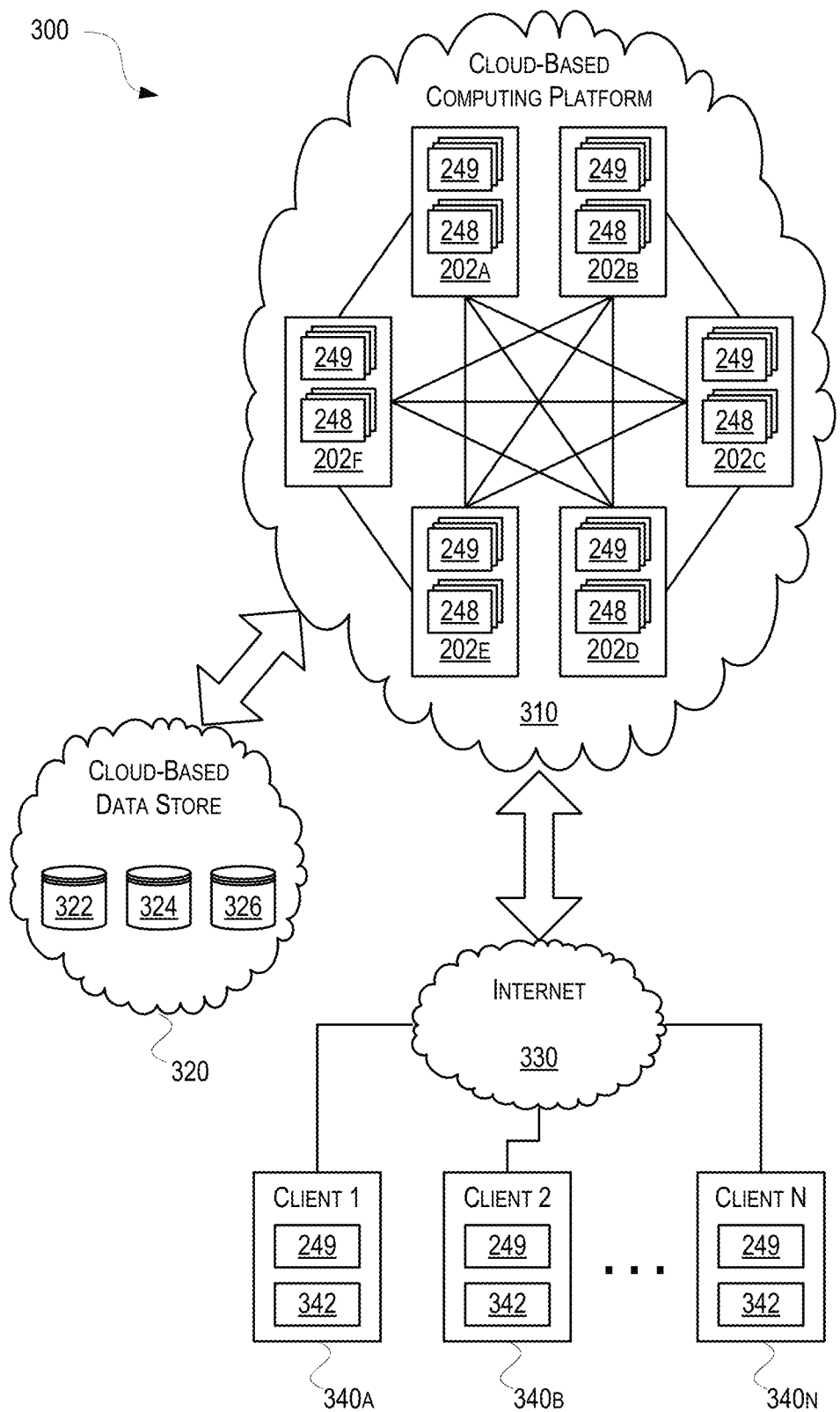
FIG. 3 depicts an illustrative cloud-based system architecture that may be used in accordance with one or more illustrative aspects described herein.

Referring to FIG. 3, some aspects described herein may be implemented in a cloud-based environment. FIG. 3 illustrates an example of a simulation environment (e.g., a development environment) based on a cloud-based computing platform system 300. The simulation environment based on the cloud-based computing platform system 300 may be spatially-optimized. As shown in FIG. 3, client computing devices 340a-340n (generally 340) may communicate via the Internet 330 to access the simulation executing on the virtual servers 202 (e.g., simulation runtime 248, server workers 249, bridge modules (not shown), etc. of the cloud-based computing platform 310.

The simulation runtime 248 contains the program code to implement the elements and components which comprise the simulation environment, as described in further detail herein. For example, the simulation runtime 248 may comprise implementation code for one or more of the bridge modules of the cloud-based computing platform 310, as further described herein and as illustratively shown in FIG. 7, as well as provide worker management functions (starting processes, stopping processes, etc.). Additionally and alternatively, the simulation runtime 248 may also expose an application programming interface (API) which may be utilized to monitor status, instantaneously and/or periodically, of the simulation environment. The monitoring API may also be utilized to debug the status and behavior of the simulation environment. In an illustrative embodiment, the simulation runtime 248 may be implemented as a JAR (Java ARchive).

The cloud-based computing platform 310 may comprise private and/or public hardware and software resources and components. For example, a cloud may be configured as a private cloud to be used by one or more particular customers or client computing devices 340 and/or over a private network. Public clouds or hybrid public-private clouds may be used by other customers over open or hybrid networks. Known cloud systems may alternatively be used, e.g., MICROSOFT AZURE (Microsoft Corporation of Redmond, Wash.), AMAZON EC2 (Amazon.com Inc. of Seattle, Wash.), GOOGLE COMPUTE ENGINE (Google Inc. of Mountain View, Calif.), or others.

The simulation development environment 300 may be deployed as a Platform-as-a-Service (PaaS) cloud-based computing service which may provide a platform for allowing a user to develop, run, and manage a simulation. This may allow a user or client to create a simulation without understanding the intricacies of distributed computation or requiring access to infrastructure teams or supercomputers. The simulation development environment 300 may be delivered as a public cloud service from a provider. In such a scenario, client organizations may provide pre-existing models, simulations, and/or databases which may be integrated with the simulation development environment 300. Alternatively, the simulation development environment may be delivered as a private service within a private network of a client organization.

The cloud-based computing platform 310 may comprise one or more virtual servers 202a-202f (generally 202) such as the virtual server 202 illustrated in FIG. 2. Optionally, the cloud-based computing platform 310 may comprise special-purpose virtual and/or physical computing resources which may be configured to provide simulation functionality as described herein. Although FIG. 3 illustrates six virtual servers 202 (i.e., 202a-202f), those of skill in the art will appreciate that cloud-based computing platform 310 may comprise any number of virtual servers 202. The virtual servers 202 may be interconnected via one or more networks in a manner that may allow each virtual server 202 to communicate directly with any other virtual server 202 in the cloud-based computing platform 310 in a peer-to-peer fashion. Optionally, virtual servers 202 may be arranged into a plurality of clusters of virtual servers. For example, clusters of virtual servers may be arranged based on a physical location of the physical computing resources used by the cloud-based computing platform 310. In such an example, one cluster may be a first cloud datacenter located in California, and another cluster may be a second cloud datacenter located in Ireland (these are merely illustrative locations). In another example, clusters of virtual servers may be arranged based on an allocation to a simulation. In such a scenario, one cluster may be comprised by a first subset of virtual servers 202 allocated to a first simulation and another cluster may be a second subset of virtual servers 202 allocated to a second simulation. A virtual server 202 may be manually or dynamically reassigned to a different cluster if or when the virtual server 202 is moved or if or when the computing resource requirements for the first simulation and the second simulation may change over time. Client computing devices 340 connecting to a virtual server 202 may be unaware of which cluster, if any, the virtual server 202 belongs to and may also be unaware whether the virtual server 202 may change membership from one cluster to another during the course of the connection.

The cloud-based computing platform system 300 may also comprise a cloud-based data store 320. The storage resources in the cloud-based data store 320 may include storage disks (e.g., solid state drives (SSDs), magnetic hard disks, etc.) and other storage devices. Alternatively, the cloud-based data store 320 may be provided by a known cloud-based storage provider, such as, AMAZON S3 (Amazon.com Inc. of Seattle, Wash.), GOOGLE CLOUD STORAGE (Google Inc. of Mountain View, Calif.), or others. Optionally, the cloud-based data store 320 may be implemented or deployed separately from cloud-based computing platform 310 as shown in FIG. 3. Optionally, the cloud-based data store 320 may be implemented or deployed within the cloud-based computing platform 310. For example, both the cloud-based computing platform 310 and the cloud-based data store 320 may be provided by a cloud systems provider as part of the resources assigned to the cloud system by the provider.

The cloud-based data store 320 may comprise one or more application assemblies 322. An application assembly 322 may comprise data which may define entities and components of a simulation, as well as, procedures which may define one or more behaviors of each of the entities and components in a simulation. Optionally, an application assembly 322 may comprise schemas, data structures, serialized objects, and the like which may define the entities and components which make up a simulation. Optionally, an application assembly 322 may comprise computer-readable code or instructions, scripts, statically-linked libraries, dynamically-linked libraries, and the like which may define one or more behaviors for the elements in the simulation. Virtual servers 202 in the cloud-based computing platform 310 may load an application assembly from the cloud-based data store 320. The simulation runtime 248 in each virtual server 202 may use the data and procedures comprised in an application assembly 322 to cause the execution of a distributed, persistent, and spatially-optimized simulation. The cloud-based data store 320 may also comprise initialization data and/or procedures 324 which may define a starting or initial condition for a simulation. For example, the cloud-based computing platform 310 may load initialization data 324 from the cloud-based data store 320 which may cause a predetermined number of entities and components to be instantiated and initialized to a predetermined initial state. In another example, the cloud-based computing platform 310 may load and may execute one or more initialization procedures 324 which may cause a predetermined number of entities and components to be instantiated and initialized to a predetermined state. In yet another example, the entities and the components may be instantiated and initialized to a predetermined state based on a combination of initialization data 324 and initialization procedures 324 loaded by the cloud-based computing platform 310 from the cloud-based data store 320.

The cloud-based data store 320 may comprise a snapshot 326 of a simulation. A simulation snapshot 326 may define a valid state of a simulation, and may comprise data and/or procedures which may return a simulation to that valid state if or when it is loaded and/or executed by the cloud-based computing platform 310 from the cloud-based data store 320. The valid simulation state defined by snapshot 326 may be a known state or a desired state of the simulation. Optionally, the simulation state defined by snapshot 326 may be a previously saved state of a running simulation. A snapshot 326 may store some state of a simulation, which might not be a complete representation of a simulation at a certain time. When such a snapshot is loaded by the cloud-based computing platform 310, the user code within the workers may be able to derive a valid state.

A portion of the cloud-based computing platform 310 may be related, for example, one or more virtual servers 202 may be executing a simulation on behalf of the same end user, or on behalf of different users affiliated with the same company or organization. In other examples, certain virtual servers 202 may be unrelated, such as users affiliated with different companies or organizations. For unrelated clients, information on the virtual servers 202 or cloud-based data store 320 of any one user may be hidden from other users.

In some instances, client computing devices 340 may implement, incorporate, and/or otherwise include one or more aspects of computing device 101 and computing device 202. Client computing devices 340 may be any type of computing device capable of receiving and processing input via one or more user interfaces, providing output via one or more user interfaces and communicating input, output, and/or other information to and/or from one or more other computing devices. For example, client computing devices 340 may be desktop computers, laptop computers, tablet computers, smart phones, or the like. In addition, and as illustrated in greater detail below, any and/or all of client computing devices 340 may, in some instances, be special-purpose computing devices configured to perform specific functions.

The client computing devices 340 may comprise a worker integration library 342 and an instance of a worker process 249. A client computing device 340 may utilize the worker integration library 342 and the worker process 249 to connect to a simulation executing in the cloud-based computing platform 310. As described in further detail below, a client computing device 340 may receive data from the cloud-based computing platform 310 describing relevant portions of the simulation. The worker process 249 executing in the client computing device 340 may utilize that received data to render the relevant portions of the simulation on a display or other user interface device. The client computing device 340 may also transmit data and commands to cloud-based computing platform 310 which may affect the state of the simulation. The data and commands may be transmitted in response to user input. Optionally, the transmitted data and commands may be generated in response to calculations performed by the worker integration library 342 or the worker process 249.

Advantageously, and as illustrated in greater detail above, a simulation developer using a simulation development environment may be able to scale up a game or simulation to be considerably larger than would be possible using a single machine. In addition, the simulation development environment may allow for an arbitrary number of user participants and data sources to integrate into the simulation. Furthermore, the simulation development environment may remove the need for a simulation developer to worry about scalability or data synchronization among different parts of the simulation.

FIG. 3 illustrates just one example of a simulation development environment that may be used, and those of skill in the art will appreciate that the specific system architecture and computing devices used may vary, and are secondary to the functionality that they provide, as further described herein.

Figure 4:
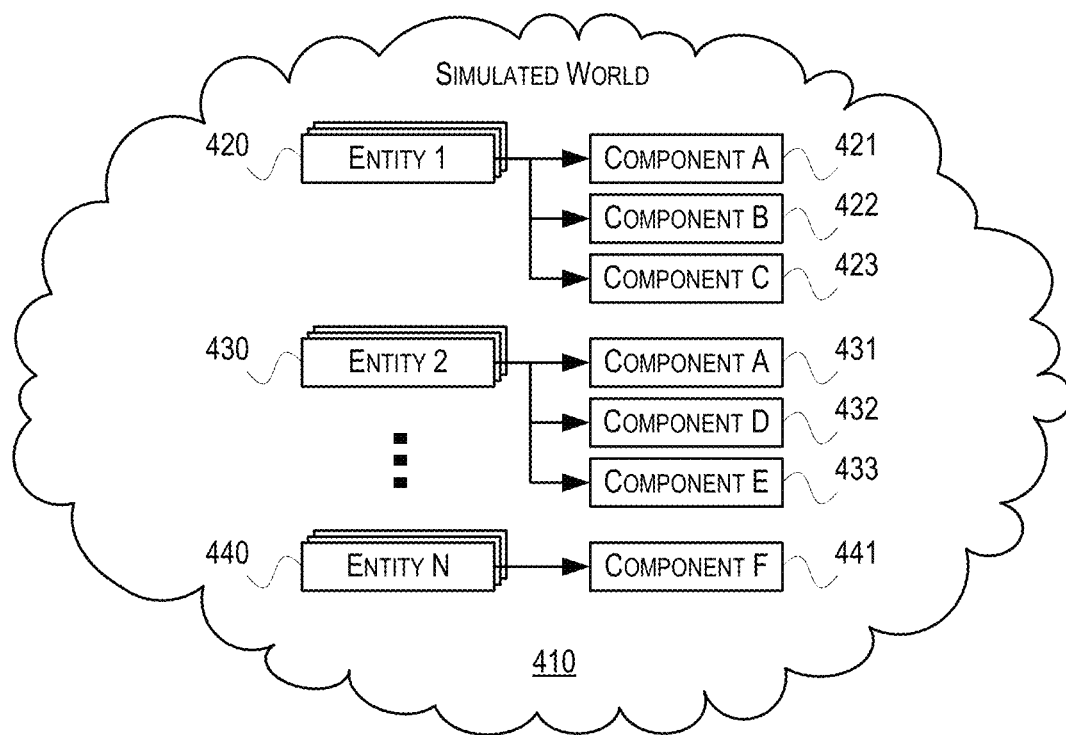
FIG. 4 depicts an illustrative entity architecture that may be used in accordance with one or more illustrative aspects described herein.

FIG. 4 illustrates one example of a block diagram of a simulation that may be implemented according to one or more illustrative examples of the disclosure. A simulated world 410 may comprise a collection of entities (e.g., entity 1 420, entity 2 430, and entity N 430.) An entity may represent a fundamental computational unit or other unit of simulated world 410. While FIG. 4 illustrates a simulated world 410 comprising three entity types, in other examples, a simulated world 410 may comprise any number of entity types. Additionally, simulated world 410 may comprise any number of instances of each entity type. For example, in a city simulation, simulated world 410 may comprise a car entity, a pedestrian entity, a traffic signal entity, a road entity, a building entity, and the like. In such a scenario, the city simulation may comprise large and different quantities of instances of each entity. In another example, in a video game world simulation, simulated world 410 may comprise a monster entity, a player entity, a weapon entity, a tree entity, a rock entity, and the like. The video game simulated world may comprise a handful of instances of the monster entity, one player entity instance for each player active in the game, and potentially millions of instances of the tree and rock entities. In yet another example, in a trading simulation, simulated world 410 may comprise a trader entity, a stock entity, a mutual fund entity, a market agent entity, and the like. The simulated trading world may comprise small numbers of trader and market agent entities and may also comprise thousands of stock and mutual fund entities.

The state and behavior of an entity (e.g., 420, 430, and 440) may be determined by the combination of components (e.g., 421, 422, 423, 431, 432, 433, and 441) comprised by the entity. Each component (e.g., 421, 422, 423, 431, 432, 433, and 441) may comprise a subset of the state and behavior attributed to the entity (e.g., 420, 430, and 440) as a whole. For example, as shown in FIG. 4, entity 1 420 may comprise component A 421, component B 422, and component C 423; entity 2 430 may comprise component A 431, component D 432, and component E 433; and entity N 440 may comprise component F 441. As will be appreciated by one of skill in the art, the number and types of components comprised by any one entity may be arbitrary and not limited to the example illustrated in FIG. 4. Optionally, two or more entities may comprise different instances of a particular component if or when the two or more entities have a set of properties and behaviors in common. For example, entity 1 420 may represent a rock in a video game simulation and entity 2 430 may represent a monster in the same simulation. Both entities (i.e., 420 and 430) may share a component A (e.g., 421 and 431) which may define the properties and behaviors for a rigid body, e.g., mass and velocity.

Entities (e.g., 420, 430, and 440) may comprise properties which may be common across all entities. For example, entities (e.g., 420, 430, and 440) may comprise an identifier value which may be used to uniquely identify each entity instance within simulated world 410. Entities (e.g., 420, 430, and 440) may comprise properties which may be shared across multiple components. For example, entities (e.g., 420, 430, and 440) in a video game simulation may comprise position and velocity values since it is likely that most components in such a simulation may require access to those values. Additionally, locating commonly used properties within an entity may reduce coupling between the components and facilitate communication between the components of an entity.

Figure 5:
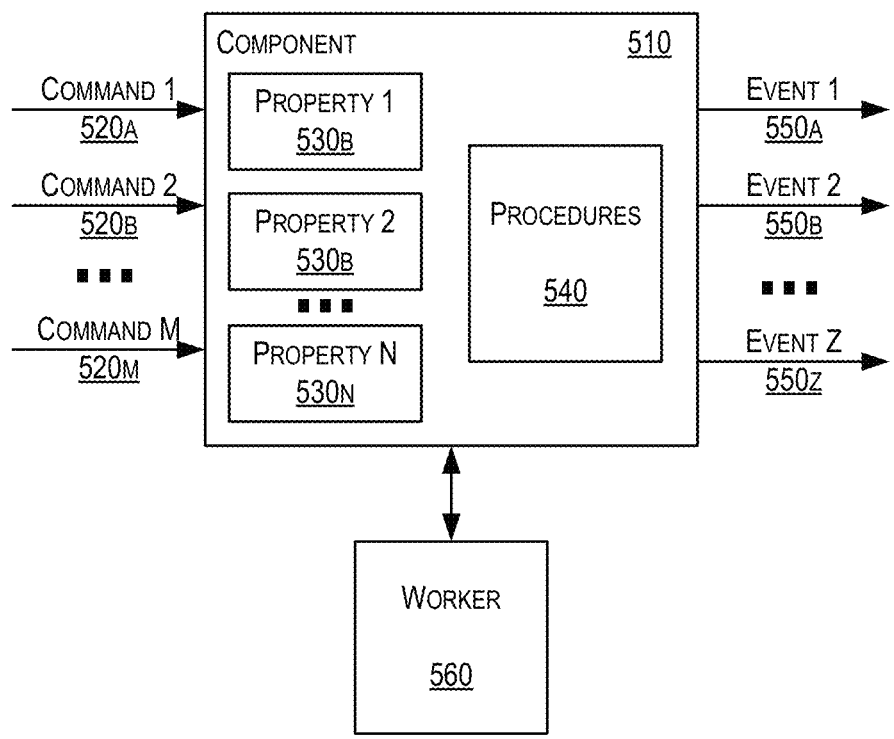
FIG. 5 depicts an illustrative component architecture that may be used in accordance with one or more illustrative aspects described herein.

Referring to FIG. 5, some aspects described herein may be implemented, incorporated, and/or otherwise included by one or more components 421, 422, 423, 431, 432, 433, and 441. FIG. 5 illustrates an example implementation of a component 510 in a simulation system as described herein, such as a spatially-optimized simulation system. A component 510 may comprise a collection of related persistent properties 530*a*-530*n* (generally 530) and events 550*a*-550*z* (generally 550.). Procedures 540 may execute, as part of a server worker 249*a*-249*n*, in a server such as one of the servers illustrated in FIGS. 2-3 (e.g., 240*a*-240*n*, 202*a*-202*f*, and 340*a*-340*n*.) Procedures 540 may be a part of a worker type of which an instance thereof is simulating an instance of a component belonging to a particular entity (e.g., an entity-component). Procedures 540 may change the value of the entity-component's properties and may generate events. A simulation runtime 248 or other software entity may delegate the write authority of the properties and event generation from the component 510 to a worker 560. Other components and/or workers executing within a simulation may cause or trigger updates in the state of component 510 via commands 520*a*-520*m* (generally 520.) Alternatively, no delegation may take place. Authority for a particular entity-component may be given to a different worker instance of a different worker type. Thus, the set of procedures associated with a particular entity-component may change according to the worker simulating it.

Components may comprise one or more properties 530. The state of a component 510 may be defined by the values held by the properties 530 comprised by the component 510. Similarly, the state of an entity may be defined by the values held by the properties 530 of all the components comprised by the entity. The value of a property may be, for example, a pointer or a URL to other data, e.g., a large asset. The state of a component 510 may be stored in local memory (e.g., 242*a*-242*n*, 244*a*-244*n*, 218) for access during execution of the simulation. Optionally, the state of a component 510 may be stored in cloud-based data store 320 as part of a snapshot 326 and thus may be persisted across simulation runs. The state of a component 510 may be stored periodically (e.g., continuously.) The rate at which the state of a component 510 is persisted may vary based on one or more factors. For example, if or when the state of a component 510 changes rapidly, the storage rate may also increase commensurate with the rate of change. In another example, the storage rate may be higher for properties which may require a higher degree of accuracy than other properties.

Where it is described that an entity or component may exhibit a certain behavior, it is to be understood that another element, such as a worker module, for example, may perform the required calculations on behalf of that entity or component and emit or receive the corresponding signals or data.

Events 550 may indicate the occurrence of a transient action on component 510. Component 510 may emit one or more events 550 in response to making a determination (or events 550 may be emitted for one or more components 510), reaching a particular result, receiving user input, or another type of trigger. Other components within the simulation may monitor the occurrence of an event 550 and update their state or perform an action in response to the event 550. The other components may be comprised by the same entity (e.g., a worker module) as the emitting component or may be comprised by other entities within the simulation. For example, a traffic signal entity in a city simulation may emit an event if or when the traffic signal indicator changes to red. A vehicle entity in the city emulation may receive the event and may come to a stop in response to the event. In another example, a rigid body component may emit an event if or when it has determined that it has collided with another object.

Optionally, procedures 540 may be used to update the values of properties 530, as well as, cause the component 510 to emit events 550. Procedures 540 may also receive and process commands 520 from other components and/or the simulation runtime 248. Thus, procedures 540 may define the behavior of component 510 within the simulation. Alternatively, a simulation runtime 248 may delegate to a worker 560 the implementation of the behavior of component 510. In such a scenario, simulation runtime 248 may delegate write access of properties 530 and events 550 from component 510 to worker 560. Component 510 may have at most one writer assigned to it at any one time. A worker may make component updates and trigger events for a component it is authoritative for. Any worker can send a command to a component belonging to a specific entity, and that command may be handled at the worker, which is authoritative for that component. Optionally, a worker 560 may implement the behavior of a component based on real-time and/or real-world behavior of a physical entity being simulated. For example, a worker 560 may periodically collect position, velocity, and direction data from one or more sensors mounted on a vehicle or other moving object and use that information to modify properties 530 and emit events 550 of component 510. In another example, a worker 560 may receive previously recorded real-world position, velocity, and direction data of a vehicle or other moving object and use that information to modify properties 530 and emit events 550 of component 510. Thus, a worker 560 may be used to incorporate real-time and/or real-world into the simulation. Any other real world objects, people, events, and/or systems may be used to generate data as input for a simulation.

Delegation may require specification of a worker constraint which may identify a type of worker capable of simulating the behavior of component 510. Worker 560 may be one of a plurality of worker types which may be specialized to perform certain kinds of computations. Workers 560 may only understand a subset of the components (e.g., 421, 422, 423, 431, 432, 433, and 441) that define entities (e.g., 420, 430, and 440) within a simulation 410. For example, in a city simulation, one worker type may simulate vehicle positions, another worker type may simulate traffic signals, and yet another type may simulate environmental emissions.

Worker 560 may comprise data structures and/or objects and software programs to simulate the behavior of a subset of the components (e.g., 421, 422, 423, 431, 432, 433, and 441) within a simulation 410. Worker 560 may be a process corresponding to one or more aspects of workers 249, as described in FIGS. 2 & 3. Thus, worker 560 may execute, as part of a server worker 249a-249n, in a server such as one of the servers illustrated in FIGS. 2-3 (e.g., 240a-240n, 202a-202f, and 340a-340n.) Worker 560 may read the properties 530 of any component (e.g., 421, 422, 423, 431, 432, 433, and 441) in simulation 410. However, worker 560 may only write the properties 530 of those components (e.g., 421, 422, 423, 431, 432, 433, and 441) that have delegated their write authority to worker 560. A worker 560 may be said to be authoritative for a component 510 if or when the runtime has delegated write authority of a component to worker 560. Worker 560 may be authoritative to one or more components of a subset of entities (e.g., 420, 430, and 440) within a simulation 410. Optionally, worker 560 may be authoritative to one or more entities which may be located close to each other within simulation 410.

In order to simulate the behavior of a component (e.g., 421, 422, 423, 431, 432, 433, and 441), worker 560 may need information (e.g., properties, events) from nearby entities (e.g., 420, 430, and 440) within simulation 410. For example, a worker simulating a traffic intersection in a city simulation may need information from vehicles in nearby intersections, but not from vehicles which are miles away from the intersection. The interest region for worker 560 may comprise all regions comprising nearby entities (e.g., 420, 430, and 440) from which the worker 560 needs information. The interest region for worker 560 may comprise entities (e.g., 420, 430, and 440) for which worker 560 is not authoritative. The simulation 410 may automatically synchronize the data between worker 560 and the other workers which are authoritative for the nearby entities.

Figure 6:
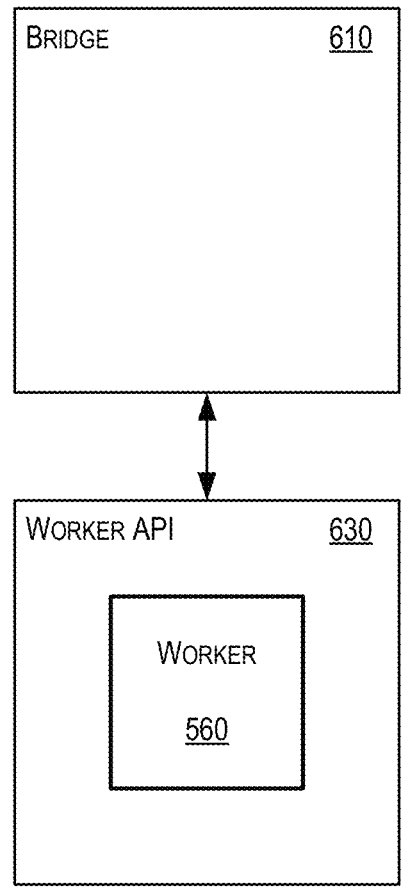
FIG. 6 depicts an illustrative worker architecture that may be used in accordance with one or more illustrative aspects described herein.

Worker 560 may communicate with the simulation 410 (e.g. with entities) via a bridge 610, as illustrated in FIG. 6. FIG. 6 illustrates an example implementation of a worker 560 communicating with a bridge 610 in a simulation 410 as described herein. A bridge 610 may be responsible for communicating relevant information (e.g., properties, events) from worker 560 to a database within a simulation 410, such as an entity database. The bridge 610 may be responsible for communicating commands from worker 560 to other interested workers within the simulation 410. The bridge 610 may also be responsible for communicating relevant information from the database to the worker 560 within the simulation 410. Bridge 610 may also be responsible for communicating relevant information from nearby entities within the interest region for worker 560. Bridge 610 may be assigned to only one worker 560 and worker 560 may communicate with only one bridge 610. That is, there may be a one-to-one relationship between bridge 610 and worker 560. In some examples, a process or machine comprising multiple workers may have multiple connections, each one using a separate bridge. Bridge 610 may execute, as part of a server worker 249a-249n, in a server such as one of the servers illustrated in FIGS. 2-3 (e.g., 240a-240n, 202a-202f, and 340a-340n.)

Communication between bridge 610 and worker 560 may be effectuated via a worker application programming interface (API). Optionally, worker 560 may include user code and potentially other frameworks that the code runs within.

The user code may use a worker API 630 to interact with the runtime, such as via the bridge. Worker API may allow a worker 560 which may have been developed independently from the simulation development environment to possibly function within and be managed by bridge 610. Optionally, the worker API may allow for the integration of pre-existing non-distributed simulation programs into a large-scale distributed simulation. For example, a game engine (e.g., UNITY by Unity Technologies SF of San Francisco, Calif.) may be integrated into a simulation to simulate rigid-body physics or to provide client-side rendering and navigation. In another example, a multi-modal traffic flow simulation software package (e.g., open source MATSIM, or other commercially available software packages) may be integrated into a city simulation. Other worker engines or programs may alternatively or also be used.

In another example implementation, worker 560 may require special-purpose hardware or other physical resources that might not be available within a cloud-based platform 310. In such a scenario, the worker API 630 and bridge 610 may reside on a computing device physically located remotely from the cloud-based platform 310 and may connect to the cloud-based platform 310 via the Internet or another type of network. Such a worker 560, which may reside outside of the cloud-based platform 310, (e.g., may execute on client devices 340a-340n) may be referred to as an external worker. And another worker 560, which may execute within the cloud-based platform 310, (e.g., may execute on servers 240a-240n, 202a-202f) may be referred to as an internal worker. Any one or more of the features described with reference to the cloud-based platform 310 may be used in or with this example implementation.

The worker API may allow a bridge to add or remove components of entities from the interest region of a worker (e.g., from the worker's view of the world), notify a worker of component state changes, delegate a component to a worker or to remove the delegation, signal component state changes for components on which the worker is authoritative, among other related functionality as described herein. In some examples, components of an entity's canonical representation may also be dynamically added to or removed from an entity database.

Among the functions provided by the worker API may be functions for adding or removing an entity. Optionally, worker API 630 may comprise a handler method to be called by bridge 610 when an entity enters the interest region of worker 560. For example, Method 1 is one example of a method signature that may be used to add an entity to the interest region of worker 560.

Method 1:
void OnEntityAdd (EntityId eid, EntityState initialState); where
eid is a value which may uniquely identify the entity being added; and
initialState is a data structure and/or object which may describe the initial state of the entity being added.

Although Method 1 is provided as an example for adding an entity to the interest region of worker 560, various other methods and/or functions may be used. For instance, other parameters may be included in the method without departing from the disclosure. Method 1 may then be passed to a RegisterEntityAddHandler( ) worker API function, which may cause the Method 1 handler to be called whenever an entity should be added.

Optionally, worker API 630 may comprise a handler method to be called by bridge 610 when an entity leaves the interest region of worker 560. For example, Method 2 is one example of a method signature that may be used to remove an entity from the interest region of worker 560.

Method 2:
void OnEntityRemove (EntityId eid); where
eid is a value which may uniquely identify the entity being removed.

Although Method 2 is provided as an example for removing an entity from the interest region of worker 560, various other methods and/or functions may be used. For instance, other parameters may be included in the method without departing from the disclosure. Method 2 may then be passed to a RegisterEntityRemoveHandler( ) worker API function, which may cause the Method 2 handler to be called whenever an entity should be removed.

The worker API may also comprise functions for notifying a worker that the properties of a component within the worker's interest region have changed state. For example, worker API 630 may comprise a handler method to be called by bridge 610 when the properties of a component within the interest region of worker 560 have changed state. Method 3 is one example of a method signature that may be used to notify worker 560 of the changed state.

Method 3:
void OnStateChanged_Component1(EntityId eid, SomeState state); where
eid is a value which may uniquely identify the entity which may comprise the component whose properties changed state; and
state is a data structure and/or object which may describe the state of the component.

Although Method 3 is provided as an example for notifying worker 560 of a changed state, various other methods and/or functions may be used. For instance, other parameters may be included in the method without departing from the disclosure. In some variants, the state parameter may comprise only the subset of properties of the component that have changed since the last update, for efficiency. Method 3 may then be passed to a AddComponentStateChangeHandler( ) worker API function, which may cause the Method 3 handler to be called whenever the properties of a component within the worker's interest region have changed state.

Among the functions provided by the worker API may be functions for dynamically changing component authority assignments. Worker API 630 may comprise a handler method to be called by bridge 610 when worker 560 may now be authoritative for a component. For example, Method 4 is one example of a method signature that may be used to delegate component authority to worker 560.

Method 4:
void OnComponentDelegate (EntityId eid, ComponentId cid); where
eid is a value which may uniquely identify the entity which may comprise the component being delegated; and
cid is a value which may uniquely identify the component being delegated.

Although Method 4 is provided as an example for delegating component authority to worker 560, various other methods and/or functions may be used. For instance, other parameters may be included in the method without departing from the disclosure. Method 4 may then be passed to a RegisterComponentDelegateHandler( ) worker API function, which may cause the Method 4 handler to be called whenever worker 560 may now be authoritative for a component.

Optionally, worker API 630 may comprise a handler method to be called by bridge 610 when worker 560 may no longer be authoritative for a component. For example, Method 5 is one example of a method signature that may be used to remove delegation authority for a component from worker 560.

Method 5:

void OnComponentUndelegate (EntityId eid, ComponentId cid); where eid is a value which may uniquely identify the entity which may comprise the component being undelegated; and cid is a value which may uniquely identify the component being undelegated.

Although Method 5 is provided as an example for removing delegation authority for a component from worker 560, various other methods and/or functions may be used. For instance, other parameters may be included in the method without departing from the disclosure. Method 5 may then be passed to a RegisterComponentUndelegateHandler( ) worker API function, which may cause the Method 5 handler to be called whenever worker 560 may no longer be authoritative for a component. In a distributed system, callbacks may be called sometime after the bridge has sent the corresponding messages. For example, this could mean that a worker may believe itself to be authoritative for a component when it no longer is, and vice-versa.

In yet other examples, worker API 630 may comprise a handler method to be called by bridge 610 for setting or unsetting a worker 560 as authoritative for a component. For example, Method 7 is one example of a method signature that may be used to set or remove delegation authority for a component for worker 560.

Method 6:

void SetIsAuthoritative (EntityId eid, ComponentId cid, Boolean isAuthoritative); where eid is a value which may uniquely identify the entity which may comprise the component;

cid is a value which may uniquely identify the component; and isAuthoritative is a true/false value which may indicate whether to set or unset worker 560 as authoritative for a component.

Although Method 6 is provided as an example for setting or unsetting a worker 560 as authoritative for a component, various other methods and/or functions may be used. For instance, other parameters may be included in the method without departing from the disclosure.

Changes to a database, such as an entity database, may be made by any process, such as a worker, some other external system, or the runtime system itself (e.g., load balancing enforcers, as will be described in further detail below). For example, a process may make changes to a canonical state in the database in response to some other change(s) in the canonical state. As another example, the entity database may have some internal systems that may update the canonical state, potentially based on some other state change. User code within a worker may be notified, via worker APIs, of the changes made to components that the worker is not authoritative for. Worker API 630 may comprise a method to be called by worker API 630 when the properties of a component for which worker 560 is authoritative have changed state. Method 7 is one example of a method signature that may be used to update the properties of the components for which worker 560 is authoritative.

Method 7:

void UpdateState_Component1(EntityId eid, SomeState state); where eid is a value which may uniquely identify the entity which may comprise the component whose properties changed state; and state is a data structure and/or object which may describe the updated state of the component.

Although Method 7 is provided as an example for updating the properties of the components for which worker 560 is authoritative, various other methods and/or functions may be used. For instance, other parameters may be included in the method without departing from the disclosure. Method 7 may be called whenever the properties of a component for which worker 560 is authoritative have changed state.

Optionally, worker 560 may be configured to periodically send a heartbeat signal to bridge 610. If or when worker 560 ceases to transmit heartbeat signals, bridge 610 may determine that worker process 560 may have terminated unexpectedly. In response to the determination, a higher-level system, such as a worker scheduler (as will be described in further detail below), may terminate the bridge 610 and request that a replacement worker process 560 (and new counterpart bridge 610) be allocated and instantiated.

Examples of Dynamic Load-Balancing of Data Subscriptions via Hierarchical Aggregators and Connection Migrations In a simulation, such as a computer game, the simulation may have some form of state, parts of which are to be available to participants in the simulation (e.g., players of a game). The state may continually change, and the changes may be shown to one or more participants. There may be many participants, states, and frequent changes to states. In an online game, for example, there may be many players, a lot of game state, and/or frequent changes to states. These changes may be caused by the players themselves and/or by internal systems, such as by an artificial intelligence (AI) system controlling the behavior of non-player characters (e.g., a monster entity, a tree entity, and the like).

Figure 9:
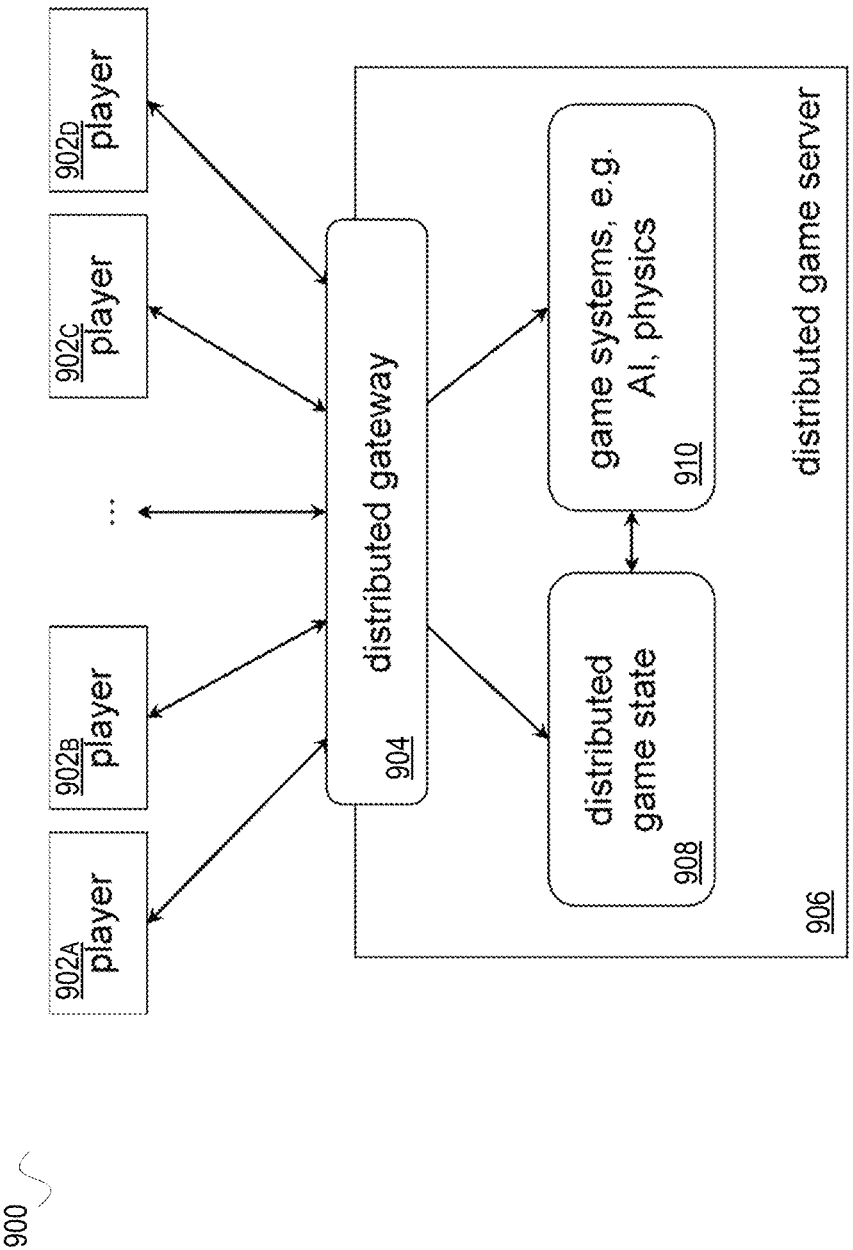
FIG. 9 shows an example of a game simulation in accordance with one or more illustrative aspects described herein.

FIG. 9 shows an example of a game simulation 900 in accordance with one or more illustrative aspects described herein. The game simulation 900 may comprise a plurality of players 902A, 902B, 902C, 902D, and/or other players. As previously explained, each player may be represented by, for example, a player entity in the game simulation 900. The game simulation 900 may comprise a distributed gateway 904, which may connect players to a distributed game server 906. The distributed gateway 904 may act as a set of connection end-points for clients (e.g., players). These end-points may be distributed among many machines, which may enable a scalable number of such end-points. The distributed gateway may act as a distributed proxy between, for example, workers and the rest of the services within a runtime. The distributed gateway may also act as a query load-balancing layer, as will be described in further detail below.

The game simulation 900 may comprise the distributed game server 906. The distributed game server 906 may be configured to provide simulation functionality for the players 902A-D and other players, non-player entities (e.g., monster entities, weapon entities, tree entities, etc.), and other portions of a game world. As previously explained, the game server 906 may comprise one or more physical servers, one or more virtual servers, or a combination thereof. The game server 906 may comprise distributed game states 908, which may represent the state of entities, such as player and non-player entities, and/or components for the entities. The game server 906 may also comprise game systems 910, such as AI for non-player entities, rigid-body physics for players and other entities, and other game systems. An efficient and scalable data distribution mechanism may be used to accommodate a large number of players, a lot of game state, and/or frequent changes to game state. Other types of simulations with many participants, states, and/or state changes (e.g., simulations of epidemics, city simulations, trading simulations, etc.) may similarly benefit from an efficient and scalable data distribution mechanism.

Simulation states and/or state changes may be made available to clients via a data source, which may be available on a single machine or a plurality of machines. The data that the data source stores and/or makes available to clients may be referred to as the data domain. Simulations may comprise pieces of data, and the data may be of different data types, such as scalar, spatial, proto, or other data types. Scalar data may comprise a scalar value, such as a single value, a double, or other scalar types. Spatial data may comprise a vector describing a point in space. For example, a spatial's x, y and z components may be given by $s_1$, $s_2$ and $s_3$ respectively. Proto data may comprise a protocol buffer (protobuf) comprising fields, each of which may be a piece of data. Proto data may contain other proto data. An entity may be a piece of data of type proto. The fields of this proto may be the entity's states, and the subfields of those states may be properties. One of the entity's states may be a position or spatial location within the simulated world.

A query may refer to a particular subdomain in a data domain. For example, a query may comprise a predicate that matches some data items. If a query q matches some piece of data x, we write q(x), and if it does not we write ¬q(x). Various query types may be supported, including numeric ranges, bounding boxes, bounding spheres, projections, Boolean combinations, etc. Numeric ranges may be represented by the expression in range (lo, hi). This query may match a scalar if and only if (scalariff) it is within the given range: $q(x) \equiv x \in [lo,hi]$. lo and/or hi can be infinite, which may allow expression of a numeric range such as x≤10 as inrange(-\infty, 10). Bounding boxes may be represented by the expression bbox(bl, tr). This query may match a spatialiff it is within the bounding box with bottom left corner bl and top right corner tr: $q(x) \equiv \forall 1 \leq i \leq 3. bl_i \leq x_i \leq tr_i$. Bounding spheres may be represented by the expression distance (center, radius). This query may match a spatialiff it is within the bounding sphere with the given center and radius: $q(x) \equiv \|x - centre\| \leq radius$. Projections may be represented by project(field, q'). This query may match a protoiff the field of that proto matches the query q': $q(x) \equiv q'(x.field)$. For Boolean combinations, the simulation may take arbitrary Boolean combinations of queries, e.g., $q_1 \wedge q_2$, $q_1 \vee q_2$, ¬q, TRUE, FALSE. An example query is InSphere(position: (40, 85, 48), radius: 20 m) AND HasComponent(Inventory). Another example query is InCone(position: (10, 50, 23), range: 100 m, fov: 100 deg) AND Health.current_health<50.

A query language may be used to express a sub-domain or query of a data domain, such as the data of a data source. The data source (e.g., an entity database, as will be described in further detail below) may support a query language to define queries that may refer to a subset of the data source's state. For example, a query may correspond to a view of the data source, and the view may comprise a subset of the data source's state. The data source may be optimized for certain types of queries, such as for queries that refer to a particular region of a simulated space.

An SQL-like language may be used to express queries. For example, the expression:

SELECT*FROM Entity WHERE states.position WITHIN(Vector3(0, 0, 0), Vector3(10, 10, 10))

may be used to match entities whose position is within a bounding box [(0,0,0), (10,10,10)].

A plurality of clients, which may be running on different machines, may connect to the data source (e.g., an entity database) via a network. The data source may support subscriptions. After connecting to the data source, a client may subscribe to one or more queries, such as by using a query language. A query may comprise a streaming query. For a streaming query, an update to the data source may result in an update being sent to a client if the update changes data corresponding to a streaming query subscribed to by the client. For example, after a client subscribes to a streaming query, the client may continually receive, from the data source, data that is within the domain of the streaming query. The client may receive data via a subscription if there is an update to the data. Additionally or alternatively, the client may periodically receive data via its subscription. The client may build up a view of the data source for the streaming query or queries the client is subscribed to. Because the data at the data source may be updated at any point, such as by the clients themselves or by some other means (e.g., other clients, internal systems, etc.), the clients may continually receive updates relevant for their streaming query subscriptions. The process may aim (e.g., continually) to synchronize the view at the client to the view at the data source corresponding to the streaming query or queries. A client may close a streaming query, so that updates for that streaming query are no longer sent back to the client. A client may also modify a streaming query and may receive database updates corresponding to the modified streaming query. In some scenarios, an update sent to a client might not be an update received by the client with a streaming query subscription. For example, the update may arrive at some point later in time, potentially merged with and/or overwritten (e.g., partially or completely overwritten) by one or more other updates that followed that update, potentially from different senders.

Figure 10:
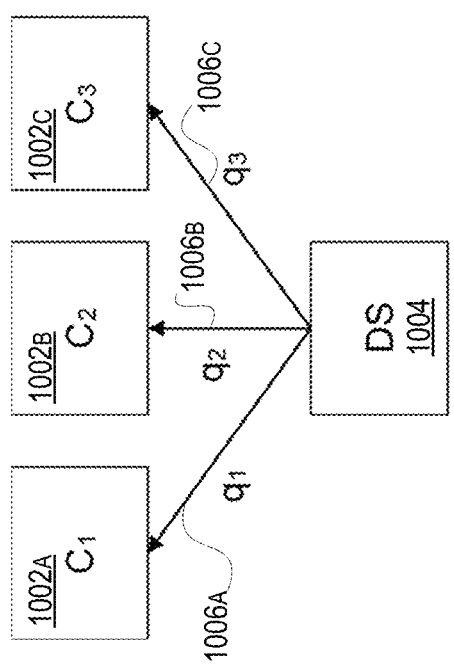
FIG. 10 shows an example of a plurality of clients and a data source in accordance with one or more illustrative aspects described herein.

Clients may directly connect to a data source and subscribe to one or more queries offered by the data source. FIG. 10 shows an example of a plurality of clients 1002A ($C_1$), 1002B ($C_2$), and 1002C ($C_3$) and a data source 1004 (DS) in accordance with one or more illustrative aspects described herein. The clients 1002A, 1002B, and 1002C may be connected to the data source 1004. The client 1002A may be subscribed to a query 1006A ($q_1$); the client 1002B may be subscribed to a query 1006B ($q_2$); the client 1002C may be subscribed to a query 1006C ($q_3$). A client may also dynamically change its subscription from one query to any other query. For example, the client 1002A may change its subscription from the query 1006A ($q_1$) to the query 1006B ($q_2$). Alternatively, the client 1002A may change its subscription to any other query, such as a query that overlaps the query 1006B ($q_2$), a query that is mutually exclusive from the query 1006B ($q_2$), etc. Changing the subscription may have the effect of the client 1002A receiving initial data matching the data for query 1006B ($q_2$) minus the data for query 1006A ($q_1$) because the client 1002A may already have the data for query 1006A ($q_1$). The client 1002A may later receive any subsequent updates for query 1006B ($q_2$). A client may also subscribe to multiple queries. If the query language supports a disjunction or something similar, subscribing to multiple queries may correspond to subscribing to a single query, which may be a disjunction of those multiple queries. The total amount of data sent out to clients by a data source may be the sum of data sent to each client. The amount of data sent out to a client may be proportional to the size of the data matching the query that the client is subscribed to and the size of the updates that happen to that data. Compression techniques may be used to reduce the amount of data sent to each client and/or the total amount of data sent to the clients.

In some examples, aggregators may act as a proxy between clients and a data source. Clients may connect to the data source via one or more of the aggregators and subscribe to one or more queries offered by the data source using the one or more aggregators. Sending data out may be a resource-intensive task, which may cause a bottleneck in the system. In order to reduce the amount of data sent out to clients by a data source, another layer of machines (e.g., aggregators) may be used to aggregate queries. For example, an aggregator may combine a client's queries and subscribe to a combined query that includes the queries of the clients connected to the aggregator, as will be described in further detail below.

Figure 11:
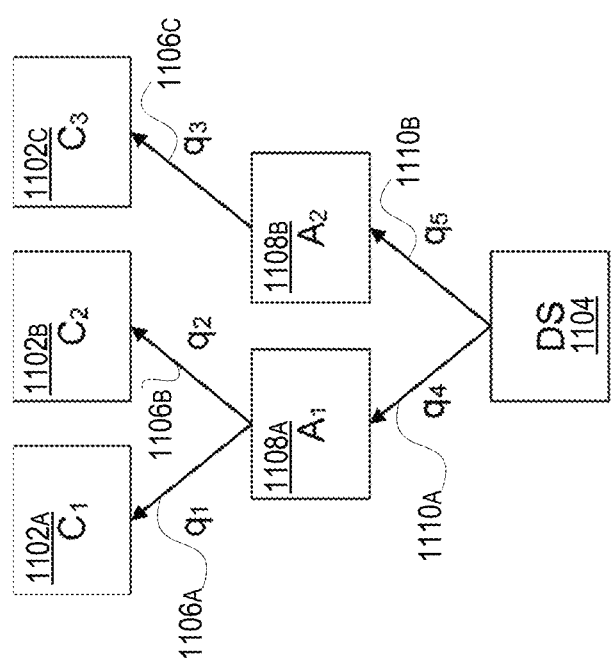
FIG. 11 shows an example of a plurality of clients, a plurality of aggregators, and a data source in accordance with one or more illustrative aspects described herein.

FIG. 11 shows an example of a plurality of clients 1102A ($C_1$), 1102B ($C_2$), and 1102C ($C_3$), a plurality of aggregators 1108A ($A_1$) and 1108B ($A_2$), and a data source 1104 (DS) in accordance with one or more illustrative aspects described herein. The data source 1104 may be connected to the aggregators 1108A ($A_1$) and 1108B ($A_2$). The clients 1102A and 1102B may be connected to the aggregator 1108A ($A_1$), and the client 1102C may be connected to the aggregator 1108B ($A_2$). Aggregator 1108A may subscribe to a query 1110A ($q_4$), which may be an aggregation of a query 1106A ($q_1$) and a query 1106B ($q_2$). For example, each element of the union of the query 1106A ($q_1$) and the query 1106B ($q_2$) may be included in the query 1110A ($q_4$) (e.g., $q_4 \supseteq q_1 \cup q_2$).

Figure 12:
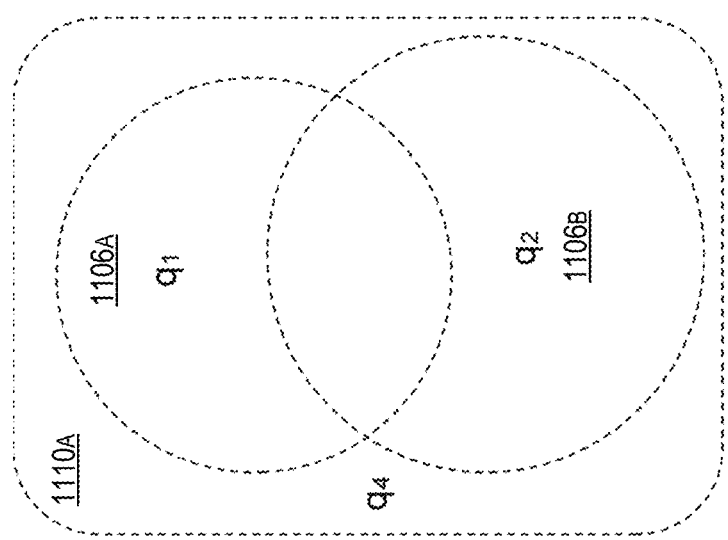
FIG. 12 shows an example of an aggregation of queries in accordance with one or more illustrative aspects described herein.

FIG. 12 shows an example of an aggregation of queries in accordance with one or more illustrative aspects described herein. For example, the query 1106A ($q_1$) and the query 1106B ($q_2$) may express subdomains of the data domain, and the query 1110A ($q_4$) may express a subdomain that includes the subdomains of both the query 1106A ($q_1$) and the query 1106B ($q_2$). The size of the subdomain ($q_4-q_1-q_2$) may be made small to reduce the amount of data being sent and/or synchronized, such as by excluding data not needed by clients 1102A ($C_1$) or 1102B ($C_2$). However, the size of the subdomain may be set so that query 1110A ($q_4$) can be efficiently executed on the data source 1104. For example, spatial queries that cover the world may be predefined. These spatial queries may be logical (e.g., not executed). These spatial queries may overlap, but also might not overlap. These queries may be larger than the average actual queries so that when actual queries are received, the larger logical query that contains the actual query may be chosen and subscribed to. Spatial queries may be beneficial if density is high (e.g., there is a lot of spatial locality). As another example, smaller queries may be combined into larger queries. For example, assume that there are two box queries that are close-by and possibly overlapping. The system may subscribe to a minimal box that contains both queries rather than separately subscribing to the two queries.

Returning to FIG. 11, the client 1102A may be subscribed to the query 1106A ($q_1$); the client 1102B may be subscribed to the query 1106B ($q_2$); the client 1102C may be subscribed to a query 1106C ($q_3$). Each client may randomly connect to an aggregator. As will be described in further detail below, the system may alternatively control which aggregator for each client to connect to. The clients may use the same or similar protocol to connect, subscribe, and receive data as if the client connected directly to the data source 1104. For example, each aggregator may act as a data source for and on behalf of its clients, and each aggregator may itself be a client of the actual data source 1104. For view synchronization, the aggregators 1108A and 1108B may synchronize their views with the data source 1104, and the clients 1102A, 1102B, and 1102C may synchronize their views with the aggregators 1108A and 1108B based on the queries each is subscribed to. Data matching the intersection of query 1106A ($q_1$) and the query 1106B ($q_2$) (e.g., $q_1 \cap q_2$) may be sent approximately one fewer time from the data source 1104 compared to if the clients 1102A and 1102B were connected directly to the data source 1104. The amount of data that the clients 1102A, 1102B, and 1102C receive may be the same or similar for both the example shown in FIG. 11 and the example shown in FIG. 10. However, the amount of data sent by the data source 1104 in the example shown in FIG. 11 may be reduced due to query overlap that may occur between clients connected to the same aggregator (e.g., aggregator 1108A).

Overlap of clients' queries may be increased to reduce the amount of data being transmitted between clients and data source(s) and to conserve bandwidth. For example, the overlap of clients' queries connected to an aggregator can be increased by controlling which aggregator each client connects to. An aggregator controller, which may comprise a software module that may be located on a separate machine, may be used to modify the connections. For example, an aggregator controller may be aware of the number of aggregators, and the aggregator controller may logically split a data domain into a number of sub-domains the same as the number of aggregators. Accordingly, a mapping from the sub-domain (which can be expressed as a query) to an aggregator may be created. Instead of pre-splitting a data domain into a fixed number of sub-domains (e.g., of equal sizes), the aggregator controller may dynamically partition the data domain according to incoming client queries so that roughly the same number of clients are connected to each aggregator.

Figure 13B:
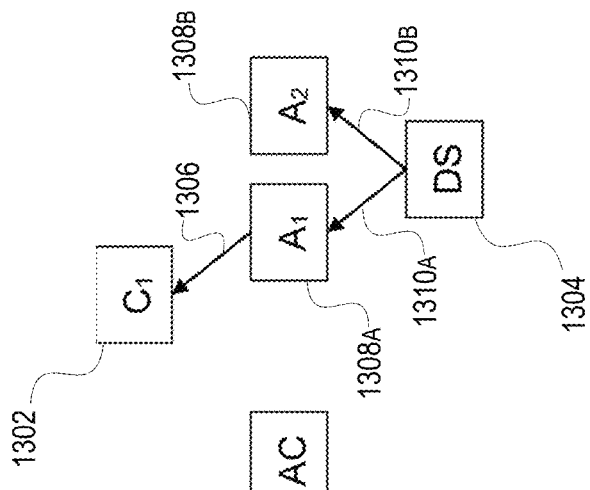
FIGS. 13A-B show an example system comprising an aggregator controller in accordance with one or more illustrative aspects described herein.
Figure 13A:
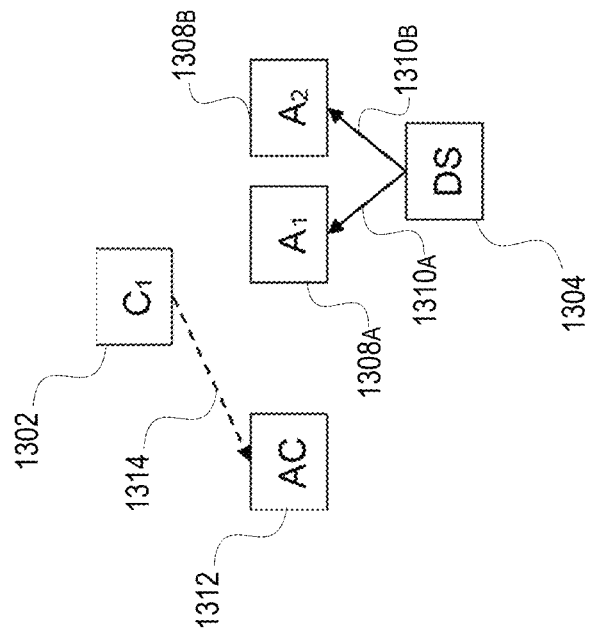

FIGS. 13A-B show an example system comprising an aggregator controller 1312 in accordance with one or more illustrative aspects described herein. With reference to FIG. 13A, before connecting to an aggregator, a client 1302 ($C_1$) may send 1314 a request to the aggregator controller 1312 to determine which aggregator (e.g., aggregator 1308A or aggregator 1308B) the client 1302 is to connect to. The request may indicate which query or queries the client 1302 desires to subscribe to. Based on the request, the aggregator controller 1312 may determine an aggregator for the client 1302 and its desired queries. For example, the aggregator controller 1312 may tell the client to connect to the aggregator that corresponds to a sub-domain query with which the client's query has the largest overlap. The aggregator controller 1312 may take past client-to-aggregator allocations into account. For example, the aggregator controller 1312 may dynamically partition the data domain according to incoming client queries so that roughly the same number of clients are connected to each aggregator as previously explained. Alternatively, the aggregator controller 1312 may return a random aggregator for the client to connect to. Other clients (not shown) may similarly request the aggregator controller 1312 to assign an aggregator, and the aggregator controller 1312 may determine the appropriate aggregator.

Assume, for example, that the aggregator controller 1312 determines that the client 1302 is to connect to the aggregator 1308A. After the aggregator controller 1312 determines the aggregator for the client 1302, the aggregator controller 1312 may send, to the client 1302 and/or the aggregator 1308A, a response indicating that the client 1302 is to connect to the aggregator 1308A. Based on the response, the client 1302 may connect to the aggregator 1308A, as shown in FIG. 13B. The client 1302 may be subscribed to a query 1306 from the aggregator 1308A. The data source 1304 may be connected to the aggregators 1308A ($A_1$) and 1308B ($A_2$). Aggregator 1308A may subscribe to a query 1310A, and aggregator 1308B may subscribe to a query 1310B. By using the aggregator controller 1312 to determine connections between clients and aggregators, improved query overlaps may result, and less traffic may be sent from the data source 1304. However, clients may change their queries. As clients change their queries, the query overlap may decrease over time if assignments between clients and aggregators are not updated.

In some examples, clients may be dynamically reconnected to different aggregators. FIGS. 14A-B show an example system comprising an aggregator controller 1412 in accordance with one or more illustrative aspects described herein. The aggregator controller 1412 (AC) may determine which aggregator for each client to connect to. With reference to FIG. 14A, a client 1402A ($C_1$) and a client 1402B ($C_2$) may be connected to an aggregator 1408A ($A_1$). A client 1402C ($C_3$) may be connected to an aggregator 1408B ($A_2$). For example, the aggregator controller 1412 may have directed client 1402B to connect to aggregator 1408A and directed client 1402C to connect to aggregator 1408B.

The aggregator controller 1412 may connect to and communicate with the aggregator 1408A, the aggregator 1408B, or other aggregators (not shown) to, for example, i) determine a good partitioning of their clients, and ii) to tell clients (e.g., indirectly) which aggregator to connect or switch to. The aggregator controller 1412 may also be connected to a data source 1404, depending on whether the aggregator controller 1412 can get information from the data source 1404 to execute its partitioning strategy.

The aggregator controller 1412 may dynamically redistribute clients among the aggregators in order to reduce traffic sent by the data source 1404. For example, queries may be mostly spatial. A query may be spatial when the query in one way or another restricts the simulation space of the data domain. For example, if a query contains InSphere (<center>, <radius>), it may restrict the data domain to that subset of the simulation space. If the queries are mostly spatial, then a possible algorithm for redistribution may (i) distribute the space among the available aggregators, and (ii) dynamically tell each client to connect to the aggregator that corresponds to a center point of the client's query or queries. For example, the client may connect to the aggregator that corresponds to the sub-domain query with which the client's query has the largest overlap. Because clients may dynamically change their queries, clients may be dynamically told to reconnect to a different aggregator.

As another example, the aggregator controller may logically partition the data domain among the aggregators according to the type of information. For example, if a client (e.g., a worker) connects and is interested in only component X of any entity, regardless of where this entity is in the simulation space, the aggregator controller may tell the client to connect to the aggregator responsible for component X. This way, if, for example, 100 such clients connect to that aggregator, the aggregator might only receive a single stream of updates for component X from its data source.

Figure 15:
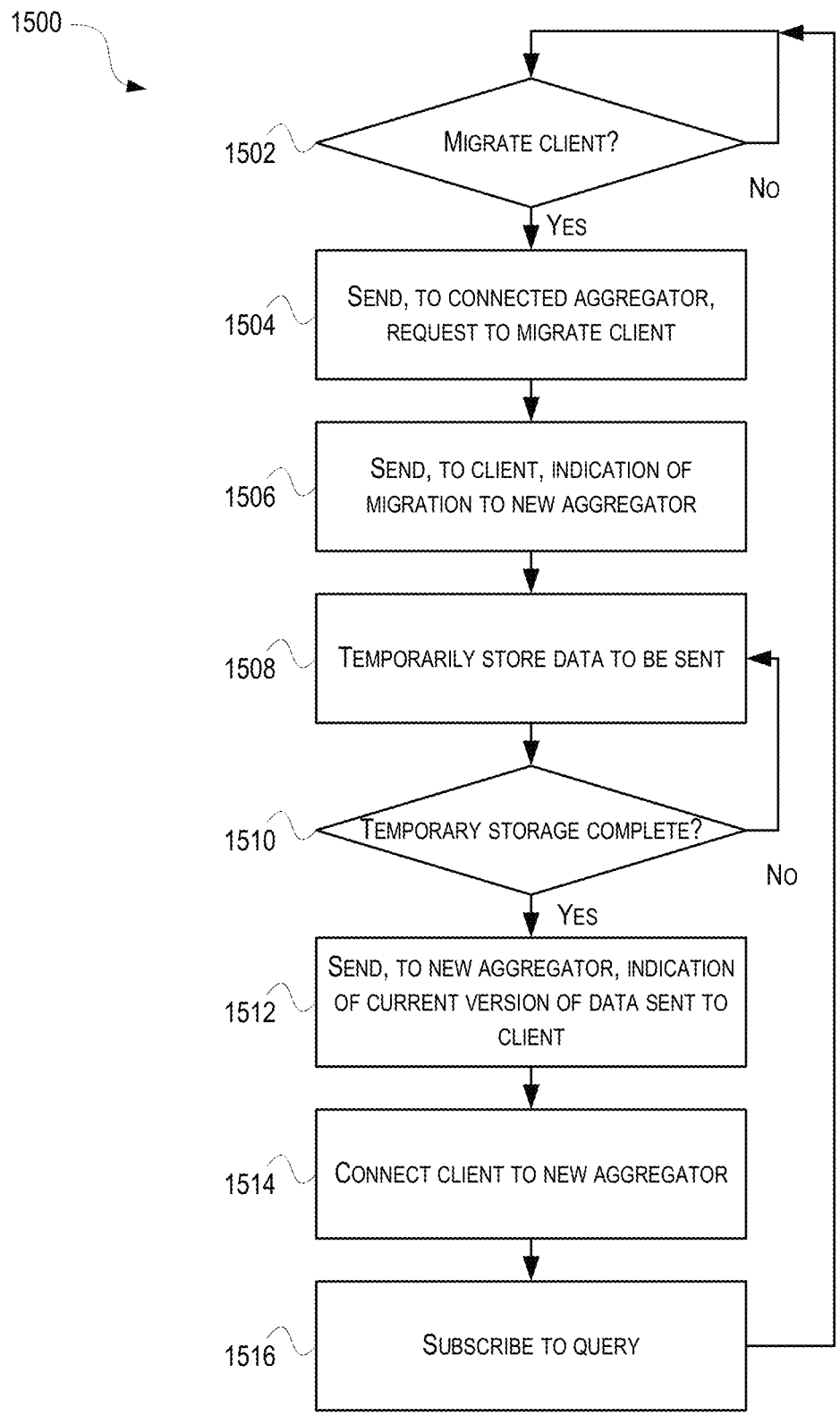
FIG. 15 illustrates an example method of client connection migration according to one or more illustrative aspects described herein.

FIG. 15 illustrates an example method 1500 of client connection migration according to one or more illustrative aspects described herein. Assume that during a simulation runtime (e.g., a spatial simulation runtime 248 or another simulation runtime), the connections between client(s), aggregator(s), and data source(s) is as shown in FIG. 14A. For example, the client 1402B may be connected to an aggregator 1408A. The aggregator controller 1412 may receive data from the aggregators 1408A or 1408B, the clients 1402A, 1402B, or 1402C, and/or the data source 1404. Returning to FIG. 15, in step 1502, the aggregator controller 1412 may determine whether to migrate a client to a different aggregator. For example, client 1402B's query may continually change during a simulation. As client 1402B's query changes, the amount of overlap between client 1402B's query and the queries of other client(s) connected to the same aggregator (e.g., aggregator 1408A) may decrease. On the other hand, the amount of overlap between the client 1402B's query and the queries of other client(s) connected to a different aggregator (e.g., aggregator 1408B) may increase. At some point, the aggregator controller 1412 may determine to migrate the client 1402B to the different aggregator 1408B based on an increase in the amount of overlap between the client 1402B's query and the query of another client (e.g., client 1402C) connected to the aggregator 1408B and/or based on a decrease in the amount of overlap between the client 1402B's query and client 1402A's query. If the aggregator controller 1412 determines not to migrate a client connection to a different aggregator (step 1502: N), the aggregator controller 1412 may continue to run one or more partitioning algorithms to determine whether to migrate a client connection. If the aggregator controller 1412 determines to migrate a client connection to a different aggregator (step 1502: Y), the method may proceed to step 1504. For example, the aggregator controller 1412 may determine to migrate the client 1402B from the aggregator 1408A to the aggregator 1408B.

In step 1504, the aggregator controller 1412 may send, to the aggregator 1408A, a request for the client 1402B connected to the aggregator 1408A to migrate to a different aggregator 1408B. In step 1506, the aggregator 1408A may send, to the client 1402B an indication that the client 1402B will soon be connected to the aggregator 1408B. The indication may indicate the aggregator 1408B and/or indicate a time for the migration.

In step 1508, the client 1402B may begin temporarily storing (e.g., buffering) data to be sent. After the client 1402B receives the migration message (e.g., in step 1506), the client 1402B may stop sending updates to the aggregator 1408A and instead may start buffering the updates. In some examples, the client 1402B may immediately stop sending updates to the aggregator 1408A, e.g., on the order of a round trip time (RTT). The client 1402B may also tell the aggregator 1408A that it has started buffering updates. The client 1402B may enter a different mode of operation for the transition period, where updates are buffered instead of sent. The data that the client 1402B buffers may comprise data that the client 1402B is continually sending (e.g., updates to the data store 1404).

In step 1510, the aggregator 1408A may determine whether temporary storage of client 1402B's data has been completed. For example, the client 1402B may notify the aggregator 1408A when the client 1402B has completed its buffering process. The aggregator 1408A may also stop sending data, such as data associated with queries, to the client 1402B. If temporary storage at the client 1402B is not complete (step 1510: N), the aggregator 1408A may wait until temporary storage is complete. If temporary storage at the client 1402B is complete (step 1510: Y), the method may proceed to step 1512.

In step 1512, the aggregator 1408A (e.g., a source aggregator) may send, to the aggregator 1408B (e.g., a target aggregator), information indicating the current (e.g., latest) version or view of the data that the aggregator 1408A sent to the client 1402B or otherwise knows about for the subscription. For example, the aggregator 1408A may send, to the aggregator 1408B, information about the connection state with the client 1402B (e.g., information about which parts of the query view(s) have been synchronized). By sending this information, the need to resend some information (e.g., information that the client 1402B already has) may be reduced, saving network bandwidth for other uses. The aggregator 1408A may communicate this information directly with the aggregator 1408B, or may indirectly communicate with the aggregator 1408B, such as via the aggregator controller 1412. The aggregator 1408A may also send, to the client 1402B, a request for the client 1402B to connect to the new aggregator 1408B.

In step 1514, the client 1402B may disconnect from the aggregator 1408A and connect to the new aggregator 1408B. With brief reference to FIG. 14B, the client 1402B may disconnect from the aggregator 1408A and connect to the aggregator 1408B. Returning to FIG. 15, in step 1516, the client 1402B may subscribe to a query with the aggregator 1408B. Because the client 1402B's query may be continually changing, the client 1402B may subscribe to the same query that it most recently subscribed to with the aggregator 1408A. Alternatively, the client 1402B may subscribe to a query different from the query the client 1402B was subscribed to before with the aggregator 1408A. For example, the desired query may have changed during the migration process. The method may return to step 1502 to determine whether there is another client to migrate to a different aggregator.

As previously explained, the aggregator 1408B may receive (e.g., in step 1512) information indicating the current version of the data that the client 1402B has, such as its view. The aggregator 1408B might not need to resend the same data to the client 1402B now connected to the aggregator 1408B, resulting in less data being transmitted and more efficient usage of available network bandwidth. By performing one or more of the steps shown in FIG. 15, the system may dynamically adjust client partitioning to reduce the amount of traffic flowing from the data source 1404. Because the approach may be dynamic, the approach may (i) deal with cases where clients change their queries, and (ii) work well with cases where aggregators are dynamically added or removed from the system. In this system, the client also might not need to ask which aggregator to connect when first connecting, because the client may be told to reconnect (e.g., reconnect immediately) according to the query it subscribes to.

Figure 16:
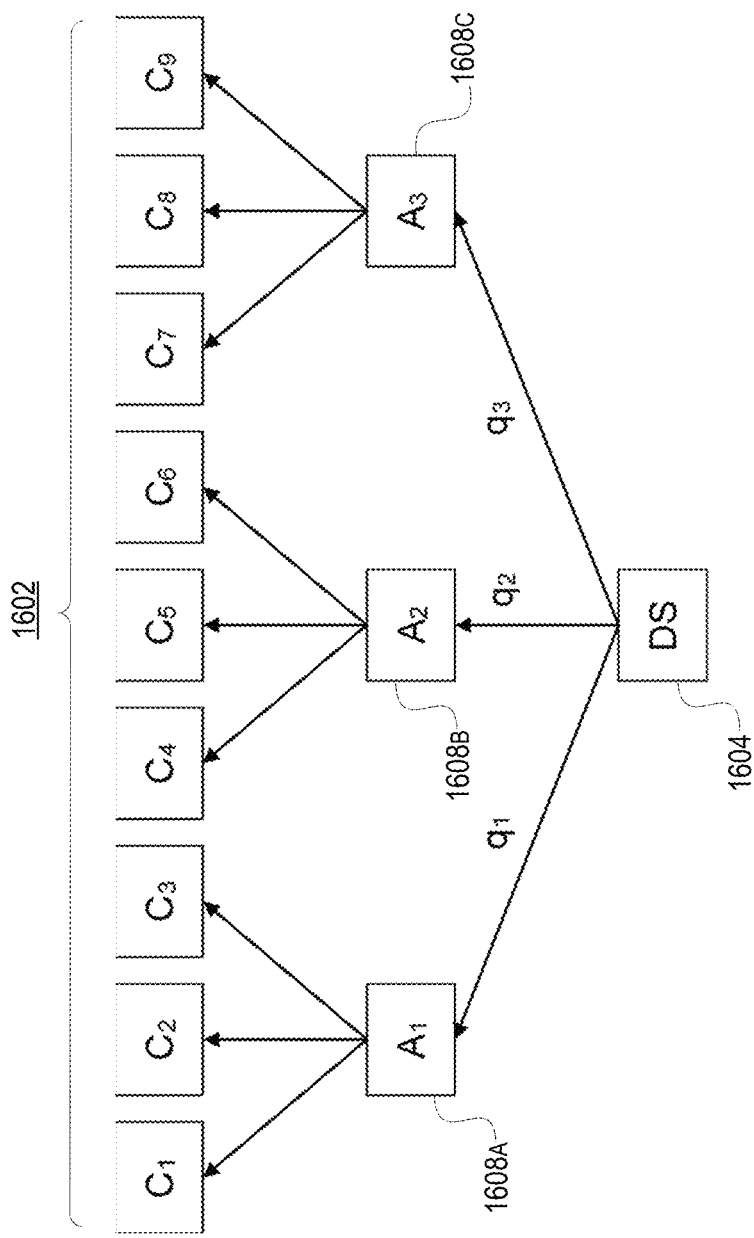
FIG. 16 shows an example of a plurality of clients, a plurality of aggregators, and a data source in accordance with one or more illustrative aspects described herein.

FIG. 16 shows an example of a plurality of clients, a plurality of aggregators, and a data source in accordance with one or more illustrative aspects described herein. For example, the system may comprise three aggregators 1608A ($A_1$), 1608B ($A_2$), and 1608C ($A_3$). Each aggregator may have, for example, three clients 1602 connected to the aggregator. The system may comprise a data source 1604 for sending updates for three queries. While an aggregator controller is not shown in FIG. 16, an aggregator controller may be included to control connection migration. As previously explained, the aggregator controller may be connected to one or more (e.g., all) of the aggregators 1608A-C. The aggregator controller may also be connected to the data source 1604. In some scenarios, aggregators may be combined, for example, if the data source 1604 is overloaded. The data source may run on a machine (e.g., a virtual machine), and perform numerous operations, such as receiving and/or deserializing data, indexing, applying queries to the data, serializing and sending data, or other operations that use processing resources (e.g., CPU). As the data source performs operations, CPU usage may reach or exceed a certain threshold CPU usage, and the data source may be considered overloaded. The aggregator controller may attempt to combine two or more of the aggregators, such as aggregator 1608A and 1608B to reduce the load on the data source 1604 in these scenarios.

Figure 17:
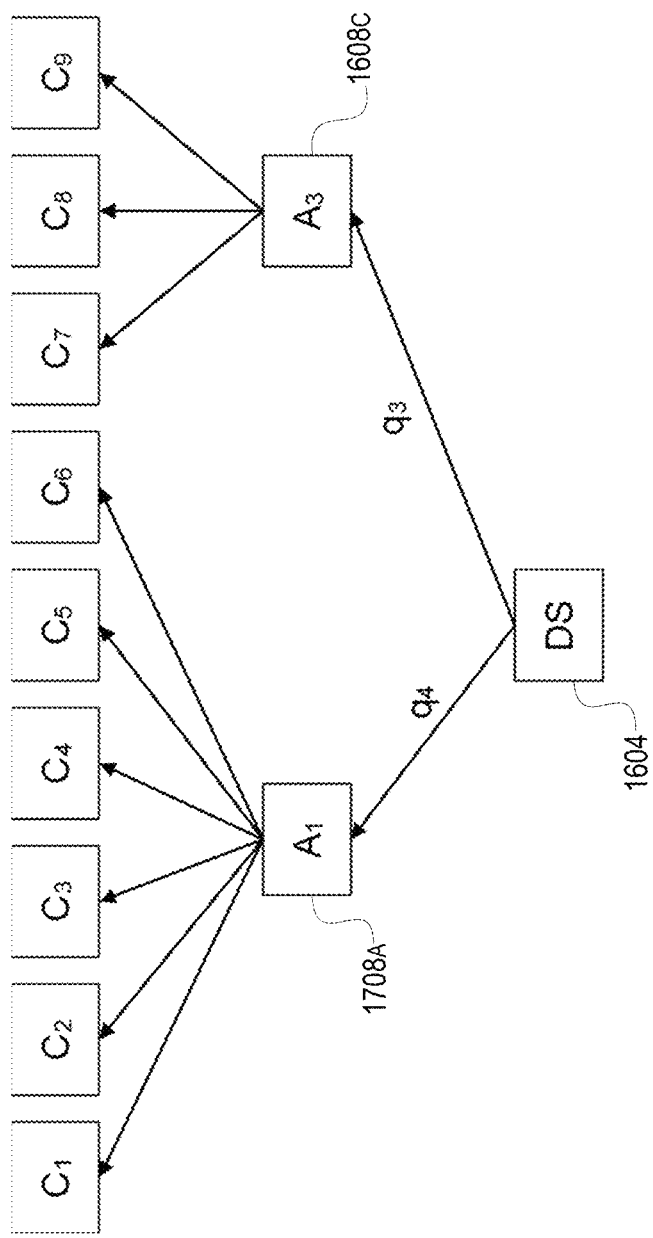
FIG. 17 shows an example of combining aggregators in accordance with one or more illustrative aspects described herein.

FIG. 17 shows an example of combining aggregators in accordance with one or more illustrative aspects described herein. An aggregator controller (not shown) may combine aggregator 1608A and aggregator 1608B shown in FIG. 16 to generate the aggregator 1708A shown in FIG. 17. For example, the aggregator controller may remove the aggregator 1608B and instruct the clients $C_{4-6}$ previously connected to the aggregator 1608B to connect to the aggregator 1608A. In this example, the aggregator 1708A shown in FIG. 17 may be the aggregator 1608A shown in FIG. 16. Alternatively, the aggregator controller may remove the aggregator 1608A and instruct the clients $C_{1-3}$ to connect to the aggregator 1608B. The aggregator controller may remove both aggregators 1608A and 1608B, and instantiate a new aggregator 1708A. The aggregator controller may instruct the clients $C_{1-6}$ to connect to the aggregator 1708A.

The aggregator controller may also adjust the queries based on the new connections. For example, queries $q_1$ and $q_2$ shown in FIG. 16 may be combined to form the query $q_4$ shown in FIG. 17. Each element of the union of the query $q_1$ and the query $q_2$ may be included in the query $q_4$ (e.g., $q_4 \supseteq q_1 \cup q_2$). Combining the two queries may reduce the load on the data source 1604 because the data source 1604 may send, to the aggregator 1708A, data that matches $q_1 \cap q_2$ one fewer time.

In some scenarios, combining aggregators may cause an aggregator to be overloaded. For example, the aggregator controller may know that combining aggregator 1608A and 1608B would cause the combined aggregator 1708A to be overloaded. The aggregator controller may track (e.g., through the help of the aggregators) how much data is going through the different connections that match the different queries involved, such as the connections between the aggregators and the data source and/or the connections between the aggregators and the clients. As will be described in further detail below, there may be multiple layers of aggregators (e.g., two layers, three layers, ten layers, etc.). The aggregator controller may also track how much data is going through the different connections between aggregators, which may be in different layers. Based on the amount of data going through one or more of the connections, the aggregator controller may determine a target configuration (e.g., the number of aggregators and the connections of the aggregators). For example, the aggregator controller may attempt to keep, for one or more of the connections, the amount of data going through the connection below a threshold amount of data. As will be described in further detail below, the aggregator controller(s) may also attempt to keep the total amount of data going through a plurality of connections (e.g., the connections for the configuration or the connections for a portion of the configuration) below a threshold amount of data. In some examples, the aggregator controller may receive an indication that the combined aggregator 1708A is overloaded after (e.g., immediately after) the combination. For example, the aggregator 1708A may now send, to clients $C_{1-6}$, the same amount of data as both aggregators 1608A and 1608B together before. The system may introduce another level of aggregator(s) to alleviate the load of the overloaded aggregator.

Figure 18:
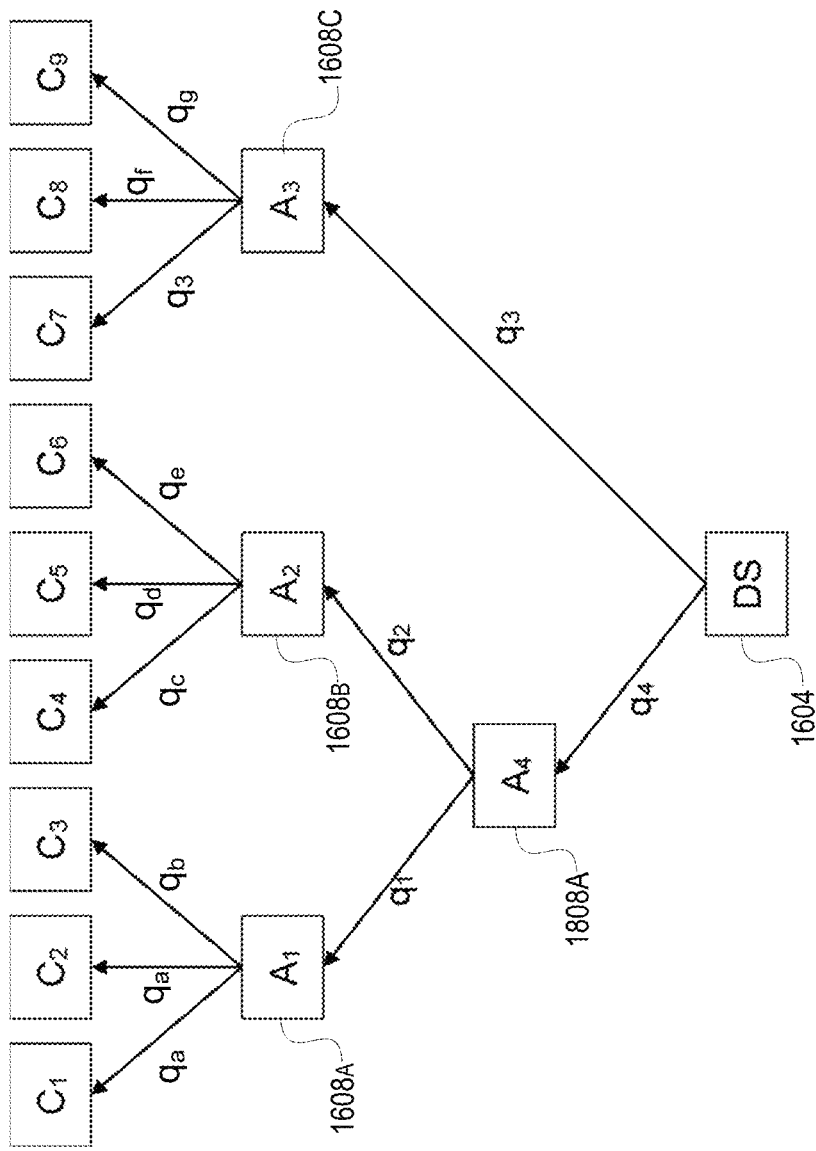
FIG. 18 shows an example of adding a level of aggregator(s) in accordance with one or more illustrative aspects described herein.

FIG. 18 shows an example of adding a level of aggregator(s) in accordance with one or more illustrative aspects described herein. The aggregator controller (not shown) may add a level of aggregator(s), such as by introducing an aggregator 1808A. The load of the data source 1604 may be the same as in the example shown in FIG. 17. For example, the data source 1604 may send a streaming query $q_4$ to the aggregator 1808A and a streaming query $q_3$ to the aggregator 1608C, similar to the streaming query $q_4$ sent to the aggregator 1708A shown in FIG. 17 and the streaming query $q_3$ sent to the aggregator 1608C. Moreover, the loads on aggregators 1608A and 1608B may be the same as in the example shown in FIG. 16. For example, the aggregator 1808A may send a streaming query $q_1$ to the aggregator 1608A and a streaming query $q_2$ to the aggregator 1608B, similar to the streaming query $q_1$ sent to the aggregator 1608A shown in FIG. 16 and the streaming query $q_2$ sent to the aggregator 1608B shown in FIG. 16.

As described above, the aggregator controller may change the configuration of aggregators from the configuration shown in FIG. 16 to the configuration shown in FIG. 17. If the new configuration shown in FIG. 17 is still overloaded, the aggregator controller may determine to change from the configuration shown in FIG. 17 to the configuration shown in FIG. 18. Alternatively, the aggregator controller may go directly from the configuration shown in FIG. 16 to the configuration shown in FIG. 18 or to other configurations.

In general, extra layer(s) in an aggregator hierarchy may be introduced as necessary and/or to improve the efficiency of the system by removing overload scenarios. An aggregator controller may be connected to the aggregators (e.g., all of the aggregators) and/or the data store. The aggregator controller may determine (i) an overall layout of aggregators, (ii) whether to add and/or remove any aggregators, and/or (iii) whether to change what a client or an intermediate aggregator is connected to. The intermediate aggregator may use the same or a similar reconnection protocol as described for clients above.

Figure 19:
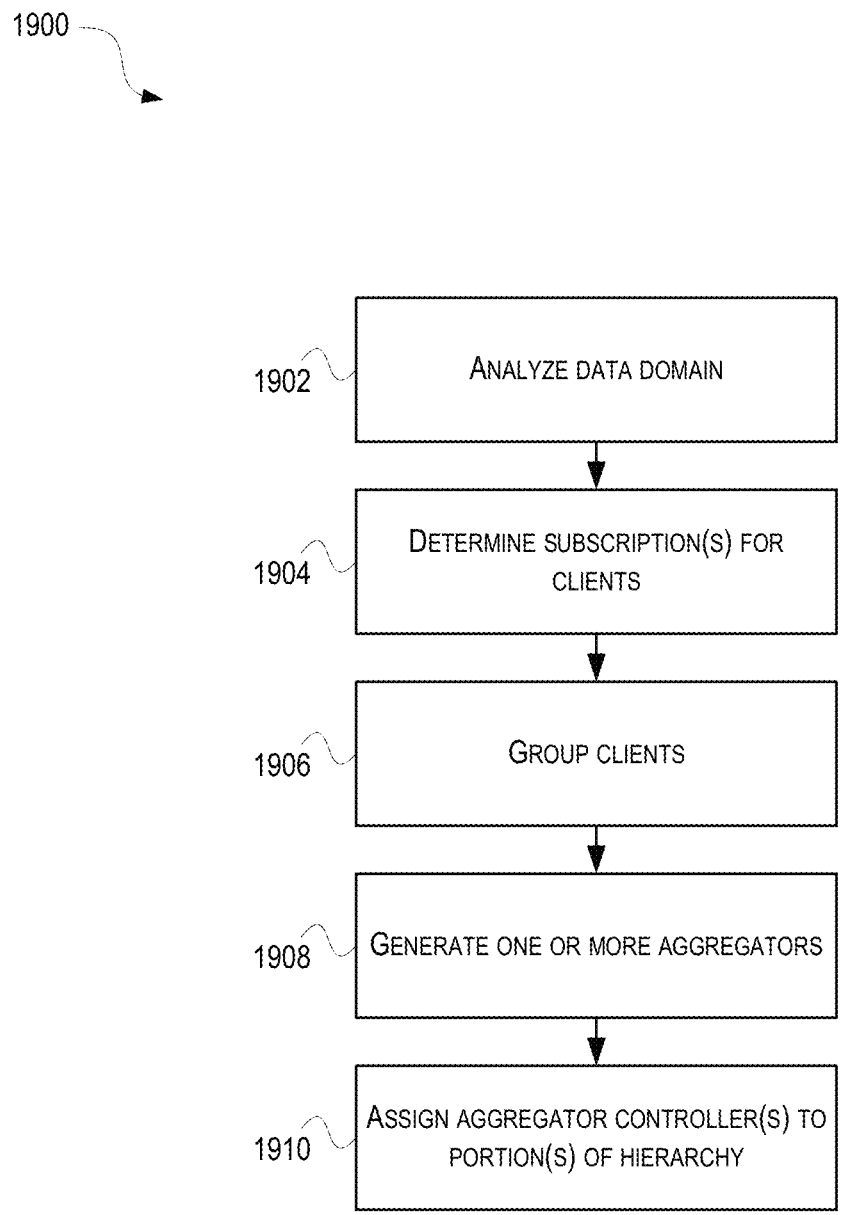
FIG. 19 illustrates an example method of generating and assigning aggregators according to one or more illustrative aspects described herein.

A plurality of aggregator controllers may be used, such as if there is too much work for a single aggregator controller. Each of the plurality of aggregator controllers may handle a portion of the aggregator hierarchy. FIG. 19 illustrates an example method 1900 of generating and assigning aggregators according to one or more illustrative aspects described herein. In step 1902, the data domain is analyzed. For example, a developer may analyze the data domain with respect to a specific use case, and may statically define the bottom layer(s) of the aggregators. Several aggregator controllers may be created and assigned to these aggregators and its sub-tree to the clients. As another example, a master aggregator controller may be responsible for the data store and the immediate aggregators connected to the data store. The master aggregator controller may dynamically determine whether to create more or fewer aggregator controllers (e.g., depending on whether the master aggregator is overloaded) to delegate management for parts of the tree to other aggregator controllers.

In step 1904, the queries or subdomain(s) that clients subscribe to may be determined (e.g., by a developer or a master aggregator controller). Clients may choose their own queries, and the types of queries that clients choose may depend on particular use cases. For example and with reference to FIG. 18, the system may determine that the client $C_1$ is subscribed to query $q_a$, the client $C_2$ subscribed to query $q_a$, and the client $C_3$ subscribed to query $q_b$. The system may determine that the client $C_4$ subscribed to query $q_c$, the client $C_5$ subscribed to query $q_d$, and the client $C_6$ is subscribed to query $q_e$. The system may determine that the client $C_7$ subscribed to query $q_3$, the client $C_8$ subscribed to query $q_f$, and the client $C_9$ subscribed to query $q_g$. In some examples, the queries or subdomains may be identified such that any client is unlikely to be subscribed to more than one query or subdomain at a time. This process may depend on the specific use case of the data domain in question. For example, in a simulation where clients are workers, some of which represent players, the clients may subscribe to small spatial areas. The developer or master aggregator controller may split the simulation space into a small number of sub-spaces, each expressed as a query, and associate each sub-space with an aggregator. In this case, each client might be unlikely to be subscribed to a query that overlaps multiple queries corresponding to sub-spaces.

Returning to FIG. 19, in step 1906, the system may group clients and their corresponding queries. With reference to FIG. 18, the system may group together clients $C_1$ and $C_2$ because their queries ($q_a$) match or are very similar. The system may also group client $C_3$ with clients $C_1$ and $C_2$ because the query $q_b$ may overlap with query $q_a$, e.g., by a predetermined amount. The system may similarly group together clients $C_4$, $C_5$, and $C_6$ based on the overlap in their respective queries. The system may also group together clients $C_7$, $C_8$, and $C_9$ based on the overlap in their respective queries. For example, each element of query $q_f$ may be included in the query $q_3$, and each element of the query $q_g$ may also be included in the query $q_3$ (e.g., $q_3 \supseteq q_f \cup q_g$), so the system may group the three queries $q_3$, $q_f$, and $q_g$ together. Alternatively, the query subscribed to by the aggregator 1608C may include a larger data set (e.g., a slightly larger data set) than the query $q_3$ subscribed to by client $C_7$.

As previously explained, in addition to analyzing the amount of query overlap, the aggregator controller may analyze how much traffic matches each sub-part of the queries involved. How much queries overlap may be an indication of how much less data could be sent by combining the queries. For example, if two queries overlap, but no data going through the connection matches the conjunction or overlap of the two queries, there might not be a savings. If, on the other hand, all or a substantial amount of data going through matches the overlap, combining the queries may result in traffic savings, even when the overlap is small. As explained above, the aggregator controller(s) may attempt to reduce the total amount of data going through a plurality of connections (e.g., the connections for a particular configuration of aggregators or the connections for a portion of the configuration).

In general, the system, such as via one or more aggregator controllers, may consider one or more different factors to determine a configuration of aggregators and connections for the system. The aggregator controller(s) may attempt to cause correct delivery of updates, from senders to data source(s) and/or from data source(s) to end-clients. For example, the aggregator controller(s) may attempt to avoid overloading data source(s) and/or any intermediate aggregators. The aggregator controller(s) may do this by reducing or minimizing the amount of traffic being sent from a data source or an aggregator to its clients. This, in turn, may be done by dynamically analyzing and exploiting the patterns of data being sent and moving clients' connections in order to get the benefit from clients' query overlaps for the data being sent. In other words, the system may attempt to minimize the amount of duplicate information being sent in order to achieve scalability. As previously explained, the amount of query overlap and the amount of data being transmitted through each connection may be used to determine the configuration to reduce the transmission of duplicate information. An estimation of how much less or more data would be sent by combining or splitting queries and how overloaded or underloaded the corresponding parts of the system are may determine whether to introduce or remove a node (e.g., an aggregator) from the system or combine nodes in the system. The aggregator controller(s) may also attempt to use fewer machines (e.g., as few machines as possible) to reduce or minimize costs.

Figure 8:
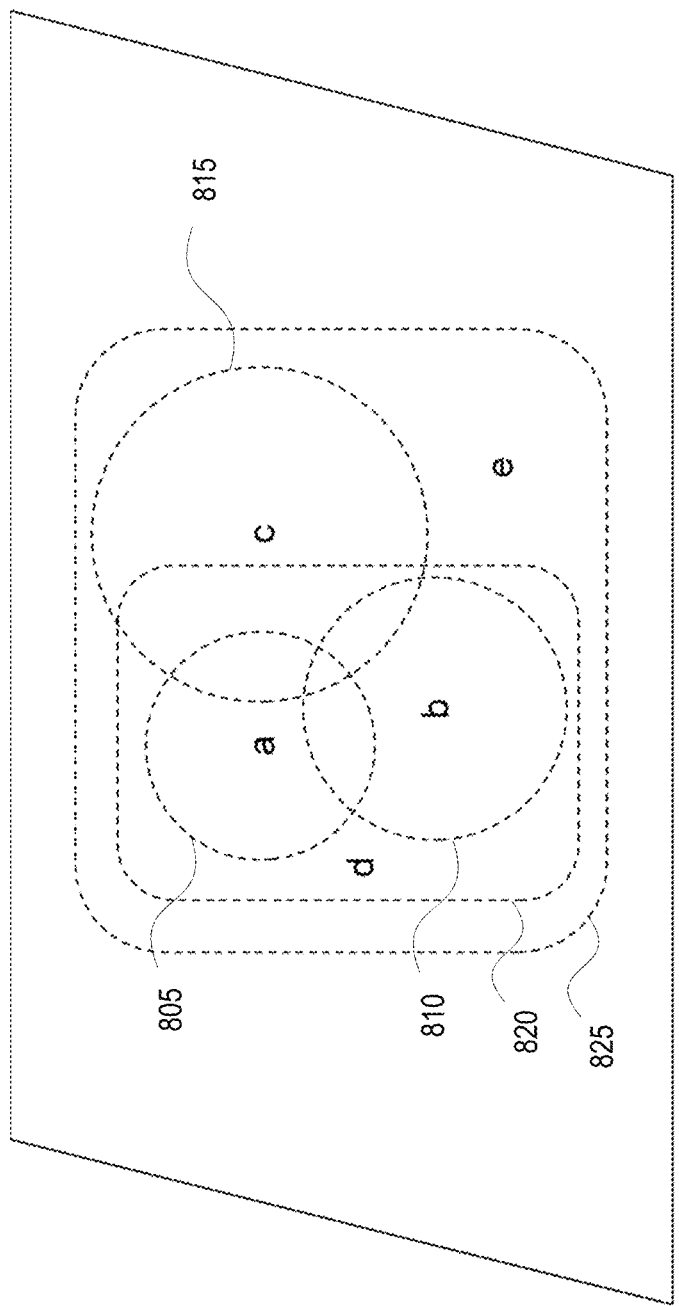
FIG. 8 shows an example of an aggregation of queries in accordance with one or more illustrative aspects described herein.

With brief reference to FIG. 8, assume that a client $C_1$ is subscribed to a streaming query a (805), a client $C_2$ is subscribed to a streaming query b (810), and a client $C_3$ is subscribed to a streaming query c (815). Based on the amount of overlap between streaming queries of clients $C_1$, $C_2$, and $C_3$, the aggregator controller may determine to combine the streaming queries of the clients to result in a favorable aggregation. For example, query a, query b, and query c may be combined, and a combined query e (825) may be generated. Clients $C_1$, $C_2$, and $C_3$ may be instructed to connect to the same aggregator, and the aggregator may subscribe to the combined query e (825).

The aggregator controller may evaluate the traffic corresponding to the sub-queries making up the combined query, such as at an instance in time or over a period of time. The aggregator controller may determine the amount of transmitted data corresponding to overlapping portions of the combined streaming query. For example, the aggregator controller may determine the amount of transmitted traffic corresponding to the overlap of query a and query b, the amount of transmitted traffic corresponding to the overlap of query a and query c, the amount of transmitted traffic corresponding to the overlap of query b and query c, and/or the amount of transmitted traffic corresponding to the overlap of query a, query b, and query c.

The aggregator controller may additionally or alternatively determine the amount of transmitted data corresponding to the non-overlapping portions of the combined streaming query. For example, the aggregator controller may determine the amount of transmitted data corresponding to query a (but not query b or query c), the amount of transmitted data corresponding to query b (but not query a or query c), and/or the amount of transmitted data corresponding to query c (but not query a or query b). Assume that, based on the determination of the amount of transmitted data, the aggregator controller determines that in practice, while the overlap of the streaming query for client $C_3$ between clients $C_1$ and $C_2$ is favorable, the data throughput corresponding to the overlapping portions of the query c with query a and query b has minimal overlap. For example, the distribution of updates to queries might not be uniformly distributed across queries. The aggregator controller may determine to remove client $C_3$ from the group, and the aggregator with clients $C_1$ and $C_2$ connected may subscribe to a different streaming query, such as query d (820). For client $C_3$, the aggregator controller may calculate heuristics for other potential groups and may assign client $C_3$ to a different group it deems favorable or may assign client $C_3$ to its own aggregator.

As previously explained, the amount of query overlap and/or the amount of transmitted data may be used to determine the proper configuration of aggregators and connections. One or more other factors may be used to determine the configuration. For example, the aggregator controller may consider resource usage on the aggregator. If an aggregator is overloaded or running near capacity (e.g., memory and/or CPU usage), the aggregator controller might not add further queries or clients to the aggregator. The aggregator controller may also consider constraints on certain connections from client to aggregator, aggregator to aggregator, or aggregator to data source. For example, the aggregator controller may consider whether a connection has a maximum threshold bandwidth, and the aggregator controller might not add another query that would cause the amount of transmitted data to exceed the threshold bandwidth. The aggregator controller may also consider the geographic distribution of served clients. For example, if an aggregator is serving several clients, it may be desirable for the purposes of consistent latency to assign clients from the same geographic region to the same aggregator or groups of aggregators.

Returning to FIG. 19, in step 1908, the system may generate one or more aggregators to handle the queries or subdomain(s) for the clients. The aggregators may be generated based on the grouping of clients. For example, one aggregator may be generated for each group of clients. The system may assign each group of clients to its corresponding aggregator. With reference to FIG. 18, the system may assign the group of clients $C_1$, $C_2$, and $C_3$ to the aggregator 1608A. The system may assign the group of clients $C_4$, $C_5$, and $C_6$ to the aggregator 1608B. The system may assign the group of clients $C_7$, $C_8$, and $C_9$ to the aggregator 1608C. Because the elements of each of queries $q_f$ and $q_g$ are included in the query $q_3$, the aggregator 1608C may subscribe to the query $q_3$ from the data source 1604.

The system may also generate one or more other aggregators, which may be at a different layer. For example, the system may generate an aggregator 1808A shown in FIG. 18 at a layer just above the data source 1604. As previously explained with reference to FIG. 17 and FIG. 18, additional layers of aggregators may be generated to prevent aggregators from being overloaded. Each aggregator may be made responsible for one or more of the subdomains or queries.

Returning to FIG. 19, in step 1910, the system may assign one or more aggregator controllers to portions of the hierarchy of aggregators. For example, one aggregator controller may be assigned to all of the aggregators 1608A, 1608B, 1608C, and 1808A (and their corresponding clients and/or queries) shown in FIG. 18. Alternatively, a plurality of aggregator controllers may be used for the hierarchy. For example, one aggregator controller may be responsible for the aggregators 1608A, 1608B, and 1608C, and another aggregator controller may be responsible for the aggregator 1808A. As another example, one aggregator controller may be responsible for the aggregators 1608A and 1608B, and another aggregator controller may be responsible for the aggregators 1608C and 1808A. As previously explained, determining which portions of the tree are assigned to which aggregator controllers may be done statically. For example, a developer may configure the system, such as for only a few of the aggregators (and their sub-trees) that are close to the data source. Alternatively, an aggregator controller (e.g., a master aggregator controller) may create more aggregator controllers depending on how busy the master aggregator controller was itself. For example, the master aggregator controller may create a child aggregator controller and make the child aggregator controller responsible for the busiest sub-tree of the master aggregator controller's own sub-tree. The busiest sub-tree may be determined based on the amount of traffic going through it (and possibly the number of clients connected to it). After clients have been grouped and aggregators and aggregator controllers have been assigned, the system may continue to monitor data to determine whether to migrate clients, generate additional aggregators, remove aggregators, etc. to reduce the load on each component of the system, as previously described. For example, the method may proceed to step 1502 shown in FIG. 15 to determine whether to migrate a client connection to a different aggregator.

As previously explained, a query aggregation may comprise a widening of a set of queries. For example, given a set of queries Q={$q_1, q_2, \ldots$}, a widening $\Delta Q$ (also written as, for example, $\Delta_i q_i$) may be determined. A widening of a set of queries may itself be a query that satisfies:

$$\forall x \cdot \forall q \in Q \cdot q(x) \Rightarrow (\Delta Q)(x)$$

In other words, for each piece of data x, if there is some query in Q that matches x, then $\Delta Q$ also matches x. For example, $\Delta Q$ may overapproximate the set Q. A consequence may be:

$$\neg(\Delta Q)(x) \Rightarrow \neg \exists q \in Q \cdot q(x)$$

For example, if some data x does not match $\Delta Q$ then no $q \in Q$ matches x either. A widening can match many more data items than the original set of queries did. In particular, TRUE may be a valid widening for any set of queries.

For example, assume the existence of queries Q={inrange(0,10), inrange(15, 20)}. Some possible widenings of Q may be:

$$\Delta Q = \text{inrange}(0,10) \lor \text{inrange}(15,20)$$

$$\Delta Q = \text{inrange}(0,20)$$

$$\Delta Q = \text{inrange}(0,\infty)$$

$$\Delta Q = \text{TRUE}$$

Widening for query and data indices may also be defined. For a query index, it may be the widening of the set of queries in the index, and for a data index D:

$$\forall x \cdot x \in D \Rightarrow (\Delta D)(x)$$

As before, $\Delta D$ may overapproximate D. If some data item x does not match $\Delta D$ then $x \notin D$. Similarly, $\Delta D$ may be as precise as desired. For example, $\Delta D$ may match exactly the items in D; $\Delta D$ may match everything; or $\Delta D$ may be anything in between.

For example, assume the existence of the data index D={0,4,10}. Some possible widenings of D may be:

$$(\Delta D)(x) \equiv x=0 \lor x=4 \lor x=10$$

$$\Delta D = \text{inrange}(0,10)$$

$$\Delta D = \text{TRUE}$$

An entity cache may contain some subset of the entities in the world. A cache may have local processes that write directly to the data in the cache. Caches may be connected together into a network. Pairs of caches may share some subset of entities. Writes can occur at any cache in the network. Caches may exchange messages in order to synchronize data between themselves. For example, a cache $C_1$ may send a message to another cache $C_2$, instructing the cache $C_2$ to update its view of the state of the world. These messages may comprise commands. As another example, a local process may add an entity with ID 1337 to cache $C_1$. Cache $C_1$ may send an AddEntity(id=1337) message to $C_2$, instructing the cache $C_2$ to add the entity to its view of the world.

A cache may also emit events describing mutations that have occurred to the cache. For example, a local process may update the position of entity 1337 from (0,0,0) to (0,0,1) in cache $C_1$. Cache $C_1$ may emit the event, e.g.:

StateUpdated(id: 1337, old_state: {position: (0, 0, 0)}, new_state: {position: (0, 0, 1)}, update: {entity_id: 1337, position: (0, 0, 0)}

The events emitted by a cache may comprise the cache's event stream.

Figure 20:
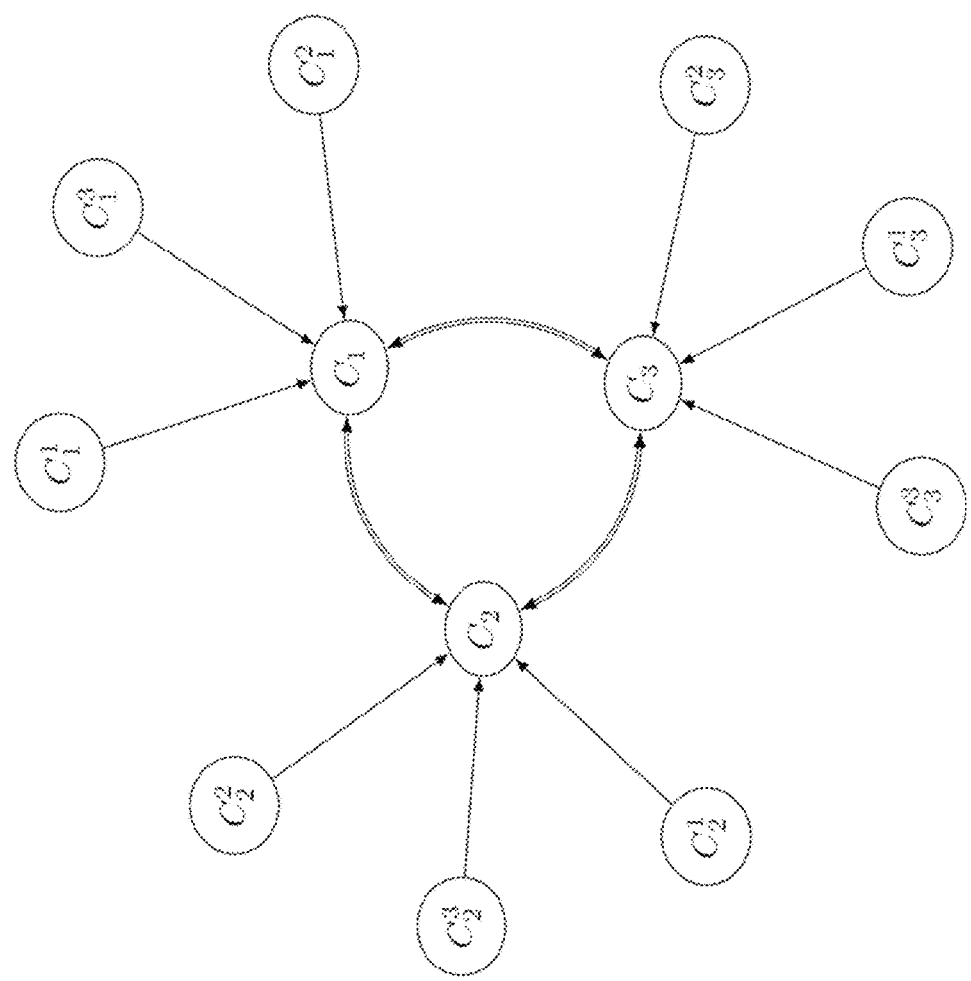
FIG. 20 shows a network of data caches in accordance with one or more illustrative aspects described herein.

Networks of caches may be synchronized. FIG. 20 shows a network of data caches in accordance with one or more illustrative aspects described herein. Caches may be connected together into networks. Each aggregator, as discussed above, may be viewed as a cache, and an aggregator may act as a data source for its direct clients. Connected caches may be connected as peers or be connected in a client/server relationship. In FIG. 20, connections between peers, such as $C_1$, $C_2$, and $C_3$ may be indicated by double line links, and connections between clients and servers may be indicated by single line links. For example, $C_1^1$, $C_1^2$, and $C_1^3$ may be clients of $C_1$; $C_2^1$, $C_2^2$, and $C_2^3$ may be clients of $C_2$; $C_3^1$, $C_3^2$, and $C_3^3$ may be clients of $C_3$. Peers may be connected together in a star topology (e.g., every peer is connected directly to every other peer). Server/client links, on the other hand, may form trees. Other groupings are possible. For example, all the caches at a certain level of a tree may form a group of peers. If a cache $C_2^1$ is a client of $C_2$, then $C_2$ may synchronize $C_2^1$ with the rest of the network. If $C_1$ and $C_2$ are peers, $C_1$ may synchronize $C_2$ with events that originated locally at $C_1$.

Recursive queries may be used. For a cache $C_i$ to synchronize its clients $C_i^j$ with other caches in the system, cache $C_i$ may subscribe to its peers with a sufficiently large query that each event happening elsewhere in the system may be routed to $C_i$ and hence to its interested clients. For a cache $C_i$ with clients $C_i^j$, the cache's query may be given by:

$$q_i = \Delta_j q_i^j$$

The server $C_i$ may subscribe to the TRUE query on each of its clients so that events originating on a client (e.g., in the tree rooted at $C_i$) make their way to $C_i$. Server $C_i$ may also construct an up to date of the union of the data in its tree.

Synchronized caches may be implemented. A cache may contain some set of entities, and the cache may know about some set of other caches. Each of these caches may be subscribed to a particular query. Local processes may search the data of the entities in the cache and may mutate the data of entities in the cache. This may be implemented efficiently by using a data index to store the entities and a query index to store the queries for each connected cache. If a client cache updates its query, the server cache may recalculate its widened query and (if it has changed), update its own query amongst its peers. For example, the client's updated query might include data not within the previous widened query. When a client or peer updates its query from q to q', the system may determine whether there are new entities to add or remove. To find the entities to add, the query $q' \land \neg q$ may be executed against the data index. To find the entities to be removed, the query $\neg q' \land q$ may be executed.

A cache or local process may subscribe to a cache's event stream (e.g., a streaming query). As previously described, the subscriber may subscribe to a query on the subscribee. The query may be matched against each emitted event, and matching events may be translated into commands that the subscribee may send to the subscriber. The commands may describe the changes the subscriber is to apply in order to reflect the state described by the event. For example, a cache $C_1$ may want to know about position updates happening to spiders in the bounding box [(0,0,0), (10,10,10)] at the cache $C_2$. The cache $C_1$ may subscribe to the following query:

SELECT update.position FROM SyncEvent WHERE new_state.position WITHIN((0, 0, 0), (10, 10, 10)) AND new_state.is_spider=TRUE As another example, a local process may want to be sent a message whenever a light switch is turned on while a cable is attached, or when a cable is attached to an on switch. It may subscribe to the query:

SELECT update FROM SyncEvent WHERE NOT (old_state.switch=TRUE AND old_state.cable=TRUE) AND (new_state.switch=TRUE AND new_state.cable=TRUE)

As yet another example, a cache $C_1$ may want to receive about 10% of the position updates from entities between 1 km and 5 km away from (0, 0, 0). It may subscribe to the query:

SELECT update FROM SyncEvent WHERE INRANGE (new_state.position, (0, 0, 0), 5000) AND NOT (INRANGE (new_state.position, (0, 0, 0), 1000)) AND RAND( )<0.1

Examples of Architecture(s) used for Query-Based Simulations

Figure 7:
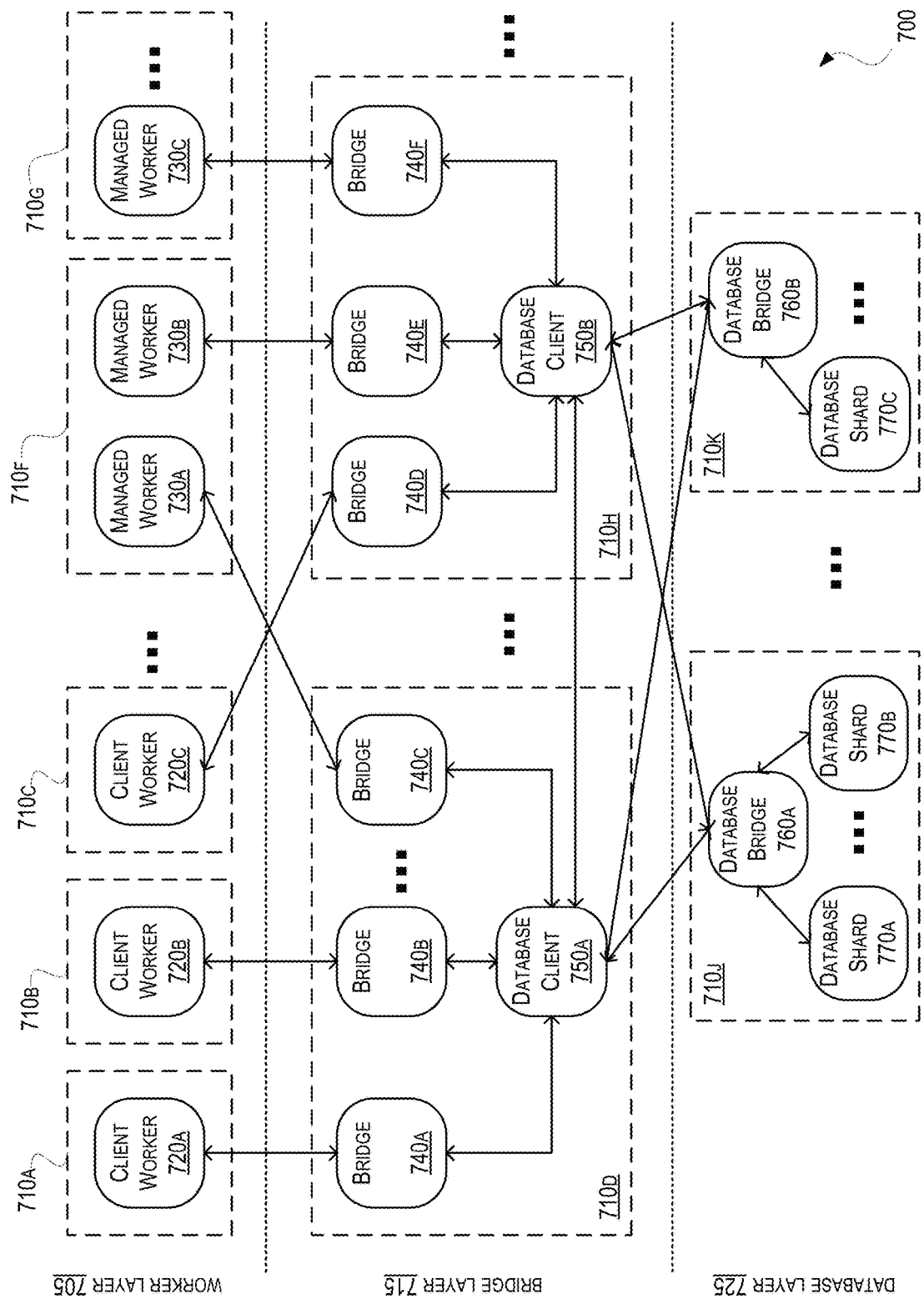
FIG. 7 shows a high-level architecture of an illustrative query-based simulation development environment in accordance with one or more illustrative aspects described herein.

FIG. 7 shows a high-level architecture of an illustrative query-based simulation development environment in accordance with one or more illustrative aspects described herein. The architecture may be split into, for example, three layers: a worker layer 705, a bridge layer 715, and a database layer 725. Each layer may be scalable in terms of machines used for the layer and/or in terms of components on each machine, as shown by dots in various places in FIG. 7.

The worker layer 705 may comprise a plurality of workers. The workers may comprise managed workers, such as managed workers 730a-730c, and unmanaged workers, such as client workers 720a-720c. Managed workers may be managed by the platform, such as for the managed worker's lifetime. Managed workers may run on machines, such as virtual machines. The simulation runtime may decide which managed workers run on which virtual machines. The simulation runtime may also move a worker from one virtual machine to another, such as by stopping one and starting another. An unmanaged worker may be controlled externally, such as for the unmanaged worker's lifetime. For example, an unmanaged worker may comprise an external worker that an end-user of an application runs to connect to a simulated world. Each client machine may comprise one client component, or may comprise multiple client machines. Managed and unmanaged workers may connect to the platform.

Client workers 720 and managed workers 730 may incorporate and/or otherwise include one or more aspects of worker 560 as illustrated in FIGS. 5 and 6. Client worker 720a may execute within a client computing device and/or a virtual machine 710a; client worker 720b may execute within a client computing device and/or a virtual machine 710b; and, client worker 720c may execute within a client computing device and/or a virtual machine 710c. Client computing devices 710a-710c may incorporate and/or otherwise include one or more aspects of client computing devices 340 as illustrated in FIG. 3. Managed worker 730a and 730b may execute within a computing device or virtual machine 710f; managed worker 730c may execute within a computing device or virtual machine 710g. Computing devices 710f and 710g may comprise a server such as the server illustrated in FIGS. 2-3 (e.g., 240a-240n, 202a-202f), as well as other systems having different architectures (e.g. all or part of FIG. 1).

Through a worker's connection or otherwise, the worker may act as a client, such as a client of a database. For example, the worker may subscribe to zero or more database subscriptions or queries in order to update its local view or views of the world. In addition, the worker may request updates to the database via its connection. Changing the number and/or sizes of machines, such as virtual machines, in each layer may be achieved by, for example, moving components from one machine to another. For example, managed workers may be moved by killing one and starting an equivalent.

The bridge layer 715 may comprise a plurality of bridges. The bridge layer 715 may act as a distributed gateway, such as the distributed gateway 904 shown in FIG. 9, for workers to connect to. Bridges in the bridge layer 715 may be used as endpoints that workers connect to. The bridge layer 715 may also act as a proxy between the workers and a database layer 725. As previously explained, each worker may have a bridge, and the bridge may act as a connection endpoint for the specific worker. As shown in FIG. 7, client workers 720a, 720b, and 720c may communicate with bridges 740a, 740b, and 740d respectively. Similarly, managed workers 730a, 730b, and 730c may communicate with bridges 740c, 740e, and 740f respectively. Bridges 740a-f may incorporate and/or otherwise include one or more aspects of bridge 610 as illustrated in FIG. 6. Bridges 740a-f may also communicate with each other. Each bridge may provide an up-to-date view of the world to its worker, and allow the worker to modify certain entities within the world.

Each bridge may hold, for example, two views of the world: one view of the entities that its worker is interested in seeing as the entities exist in the database layer 725, and one view of the entities as they are seen by the bridge's worker. The bridge may be responsible for making the two views consistent with each other, figuring out which side needs to be told what for the views to agree on the state of the world. A worker view may comprise the bridge's knowledge about what the worker has already been told about (e.g., for the query or queries it is subscribed to). A database view may comprise the bridge's knowledge about what the worker view is to be. For example, the bridge may receive, from the database, an update to the database view. The bridge may accept the database view, store the database view, and/or compare the database view to the worker view. If the worker view differs from the database view, the bridge may send, to the worker, an update with the new or updated values from the database view. The bridge may also update its view of what the worker sees (e.g., the worker view) to correspond to the database view.

If the worker sends an update to its bridge, the bridge may send the update to the database for updating the canonical state of the database. For example, the update from the worker may bypass the database view and the worker view and be sent directly to the database. If the update is successfully applied at the database, the database may propagate its updated view back to the bridge, such as if the subscribed query matches the update sent. The bridge may receive the update to the database view and perform one or more of the steps previously described. For example, the bridge may store the updated database view, compare the database view to the worker view, send an update to the worker and/or update the worker view if the worker view differs from the updated database view, etc.

The bridge layer 715 may comprise a plurality of database clients, such as database client 750a, database client 750b, or other database clients. The database clients may comprise software components that connect bridges to one, some, or all database shards in the database layer 725. As shown in FIG. 7, bridges 740a-740c may communicate with database client 750a in the simulation environment 700, each via a communication channel. Bridges 740a, 740b, 740c, and database client 750a may run within a machine 710d, such as a virtual machine. Bridges 740d-740f may communicate with database client 750b in the simulation environment 700, each via a communication channel. Bridges 740d, 740e, 740f, and database client 750b may run within a machine 710h, such as a virtual machine. Each of the virtual machines 710d and 710h may be a bridge service. A deployment may contain a plurality of bridge services, which together may act as a distributed gateway for workers. A bridge service may combine or aggregate the subscriptions or queries of the workers connected to it and may act as a single, more efficient database client, e.g., in order to avoid duplicated traffic.

Some of the components shown in FIG. 7 may communicate as peers, and some of the components may communicate as server/clients. For example, database clients 750a and 750b may communicate as peers. Bridges 740a-c may be clients of database client 750a. Similarly, bridges 740d-f may be clients of database client 750b. Workers may be clients of bridges. For example, client worker 720a may be a client of bridge 740a, client worker 720b may be a client of bridge 740b, managed worker 730a may be a client of bridge 740c, and so on.

Changing the number and/or sizes of machines, such as virtual machines, in each layer may be achieved by, for example, moving components from one machine to another. For example, bridges may be modified via bridge migration. During a simulation, the runtime may perform a bridge migration. For example, the runtime may tell a worker to dynamically connect to a different bridge, which may be on a different bridge service. As the simulation 700 progresses, bridge 740a may be designated to be migrated from machine 710d to machine 710h. In such a scenario, a new bridge instance (not shown) may be instantiated in machine 710h, and client worker 720a may be temporarily connected to both bridge 740a and the new bridge instance while the bridge migration is effectuated. Once the migration is completed, client worker 720a may be disconnected from bridge 740a, and bridge 740a may be terminated. Alternatively or additionally, bridge 740a may be terminated in machine 710d and restored on machine 710h. For example the bridge may be restored from data temporarily stored within the runtime, or from data stored in the database (e.g., entity database). Snapshots, such as snapshot 326, may generally be used for taking a backup copy of the entity database (e.g., the whole entity database) on a semi-regular basis, e.g., every 10 minutes or some other interval.

As previously explained, the runtime simulation may put bridges of workers, which may have overlapping subscription queries, on the same bridge service. Accordingly, the runtime may reduce traffic from database shards in the database layer 725 to bridge services 710d and 710h by reducing duplication. This may be done by aggregating queries into a single (e.g., larger) query. When an aggregator (e.g., a bridge service holding multiple bridges) receives data from one of its data sources (e.g., a database shard through the database bridge) matching its query, the aggregator may forward this data to its clients of which queries also match the received data.

FIG. 8 shows an example of an aggregation of queries in accordance with one or more illustrative aspects described herein. Each of the bounded areas may represent a query. For example, the bounded area 805 may represent query a; the bounded area 810 may represent query b; the bounded area 815 may represent query c; the bounded area 820 may represent query d; and the bounded area 825 may represent query e. Query d may comprise an aggregation of queries a and b, which may be a widening of a query. Query e may comprise an aggregation of queries a-d, which may also be considered a widening of a query. In some examples, queries may be spatial. In other examples, queries might not be spatial. In yet other examples, some queries may be spatial and other queries might not be spatial.

Returning to FIG. 7, worker 720a may be connected via bridge 740a. Assume that worker 720a has subscriptions to queries a and b shown in FIG. 8. Worker 720b may be connected via bridge 740b. Assume that worker 720b has a subscription to query c shown in FIG. 8. Bridge 740a and bridge 740b may be located on the same bridge service 710d. Moreover, some of the queries a-c may be overlapping, and queries may be aggregated to reduce the amount of traffic between workers and bridges and/or between bridges and/or data shards. For example, bridge 740a may aggregate queries a and b, creating a combined query d. Query d may be greater than the union of queries a and b, as shown in FIG. 8. Bridge 740b might not aggregate queries because worker 720b might be subscribed to only query c. The bridge service 710d, via the database client 750a, may aggregate queries c and d, creating a combined query e. Query e may be greater than the union of queries c and d as shown in FIG. 8. FIG. 12 shows another example of an aggregation of queries. Other examples of query aggregation were previously described. In some examples, the database clients (e.g., 750a or 750b) may be the aggregators previously described with reference to FIGS. 11-19. The workers (e.g., client workers 720a-c or managed workers 730a-c) and/or their corresponding bridges (e.g., bridges 740a-f) may be the clients previously described with reference to FIGS. 11-19. The database layer 725 may correspond to the data sources previously described with reference to FIGS. 11-19.

The database layer 725 may comprise, for example, a distributed, in-memory database for a simulation. For example, the database may comprise an entity database, a portion or all of the states of a simulation's entities may be stored in the entity database. The entity database may be persisted (e.g., regularly) as snapshots to disk or another medium for longer-term storage. The entity database may also be restored from a snapshot. The entity database may also store the platform's internal information. Various examples of entity databases are described in U.S. application Ser. No. 16/042,068, filed Jul. 23, 2018, and entitled "ENTITY DATABASE," which is herein incorporated by reference in its entirety.

The database layer 725 may comprise a plurality of machines 710j, 710k, etc., which may comprise virtual machines. Each virtual machine may comprise one or more components running within the virtual machine. For example, the virtual machine 710j may comprise a plurality of database shards, such as database shard 770a, database shard 770b, or other database shards. The virtual machine 710k may comprise a database shard 770c and/or other database shards. Each database shard may hold data corresponding to a distinct subset of the data domain. This may be achieved by splitting the data domain by entity ID (e.g., modulo the number of database shards). Each database shard may then act as a root data source, such as the data sources described above (e.g., data source 1004, 1104, 1304, 1404, or 1604). Thus while the system of FIG. 7 includes one aggregation layer (e.g., one layer of bridges), the system of FIG. 7 may include one or more extra aggregation layers between the bridge layer 715 and the database layer 725, as previously described.

Each virtual machine may comprise a database bridge, which may comprise a connection endpoint for the database clients (e.g., database clients 750a, 750b, etc.) on one side and database shards (e.g., database shards 770a-c) on the other. Clients of the database may connect to some or all entity database shards in order to, for example, make reads or writes to the database. For example, the database bridge 760a may connect the database client 750a to the database shard 770a and/or the database shard 770b. Similarly, the database bridge 760a may connect the database client 750b to the database shard 770a and/or the database shard 770b. The database bridge 760b may connect the database client 750a to the database shard 770c. Similarly, the database bridge 760b may connect the database client 750b to the database shard 770c. While the database clients 750a and 750b may each be connected to database bridge 760a and database bridge 760b, the database clients 750a and 750b might not receive all messages from both bridges. For example, the database clients 750a and 750b may receive messages comprising updates to queries subscribed to by the corresponding workers.

Changing the number and/or sizes of virtual machines in each layer may be achieved by moving components from one virtual machine to another. For example, the number and/or sizes of database shards may be changed by merging or splitting the shards (and the data that the shard is responsible for). The database may be sharded by, for example, entity ID. The database may also support updates to its state. These updates may be atomic across multiple components of the same entity or even across multiple entities, depending on database sharding strategy.

Examples of Distributable and Customizable Load-Balancing

As previously explained, a simulation (e.g., a simulated world) may comprise entities, and these entities may have one or more components. The components may comprise data fields that may be changed. The simulation platform described herein may allow for running of code (e.g., user code) in workers in order to, for example, modify the component data fields. A worker may have authority over an entity-component, such as having write access to that entity-component. An entity-component may be assigned to a worker or may be simulated by a worker when that worker has authority over the entity-component. The authority information may be stored as, for example, part of an entity's data. Additionally or alternatively, authority may be transient, and authority may be sent to workers as a message on change of authority.

Figure 21:
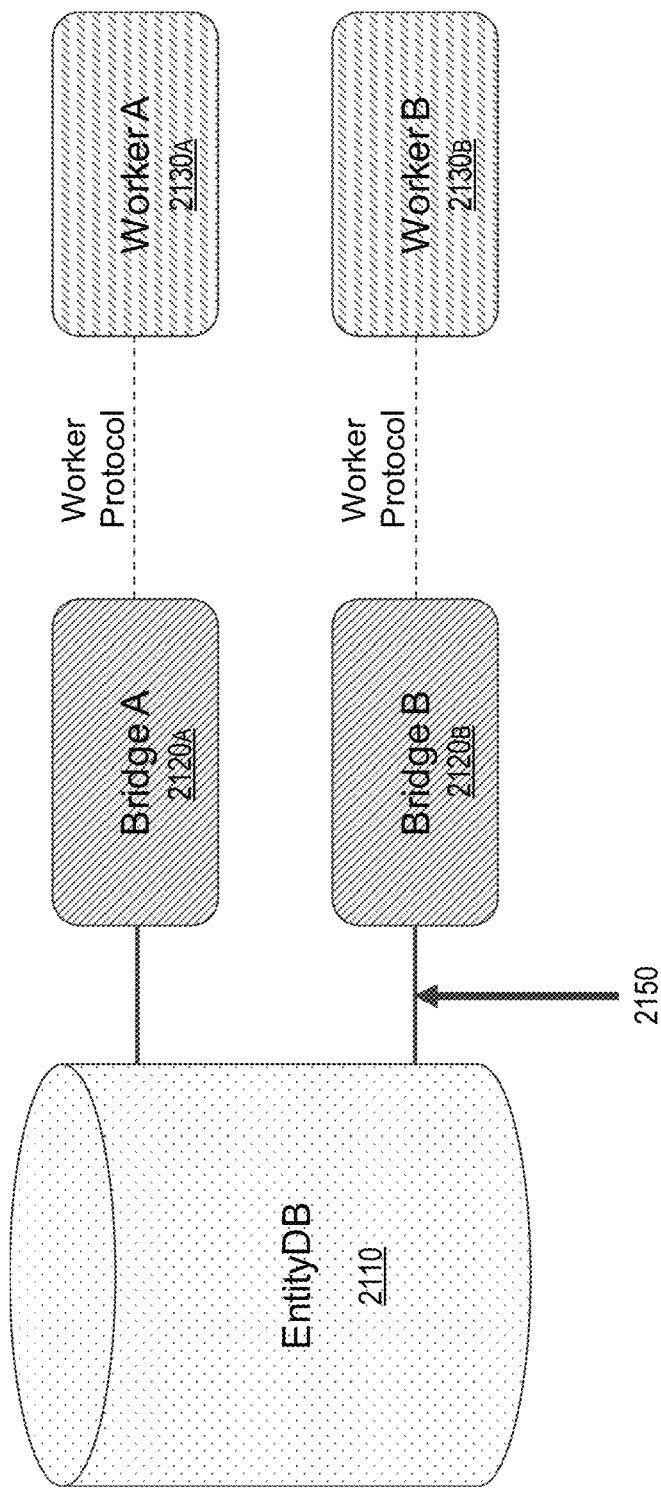
FIG. 21 shows a portion of an architecture of an illustrative simulation environment in accordance with one or more illustrative aspects described herein.

FIG. 21 shows a portion of an architecture of an illustrative simulation environment in accordance with one or more illustrative aspects described herein. As previously explained, bridges and/or workers may subscribe to queries from the database 2110, such as an entity database. Bridges may handle what workers can see. For example, the bridge 2120a may be connected to the worker 2130a, and the bridge 2120a may act as a gateway between the database 2110 and the worker 2130a. Similarly, the bridge 2120b may be connected to the worker 2130b, and the bridge 2120b may act as a gateway between the database 2110 and the worker 2130b. As previously explained, each entity may comprise a plurality of components. One of the components may comprise an authority component. The authority component of an entity may indicate which worker is authoritative over the other components of the entity. For example, an entity 1234 may comprise the following data:

```
Entity 1234
    Metadata:
        Name: "tree"
        Position:
            x: 102
            y: 302
            z: 4
    Mass: 12
    Authority:
        Position -> "Worker B"
        Mass -> "Worker B"
        Metadata -> ...
```

The authority component may indicate for the entity 1234 which worker is authoritative over the other components of the entity 1234. For example, Worker B (e.g., worker 2130b shown in FIG. 21) may be authoritative over the position component of entity 1234. Worker 2130b may also be authoritative over the mass component of entity 1234. The authority component may similarly indicate authority over other components of entity 1234.

Bridges may subscribe to queries from the database 2110, which may return entities the corresponding workers are authoritative over. For example, the bridge 2120b may subscribe to a query 2150 to return entities that the worker 2130b is authoritative over. An example query may be:

Subscription query (SELECT*FROM entities WHERE authority='Worker B')

The database 2110 may return, for example, data indicating that the worker 2130b is authoritative over the position component of entity 1234, the mass component of the entity 1234, and other entity-components that worker 2130b is authoritative over.

Worker load-balancing may be used to determine which worker is to be responsible for each component on each entity and/or to balance loads so that there are the right number of workers to simulate a world correctly. In particular, worker load-balancing may comprise a suite of tools and/or strategies that may help with one or more of the following: (i) how to perform lifecycle management of workers (e.g., starting, stopping, restarting on crash, etc. of workers), (ii) how to give a worker authority over an entity-component to allow the worker to simulate it, (iii) how to determine which workers are to be authoritative for which entity-components, or (iv) how to determine the number and which types of worker(s) are to be running in a given deployment of the simulation platform.

Figure 22:
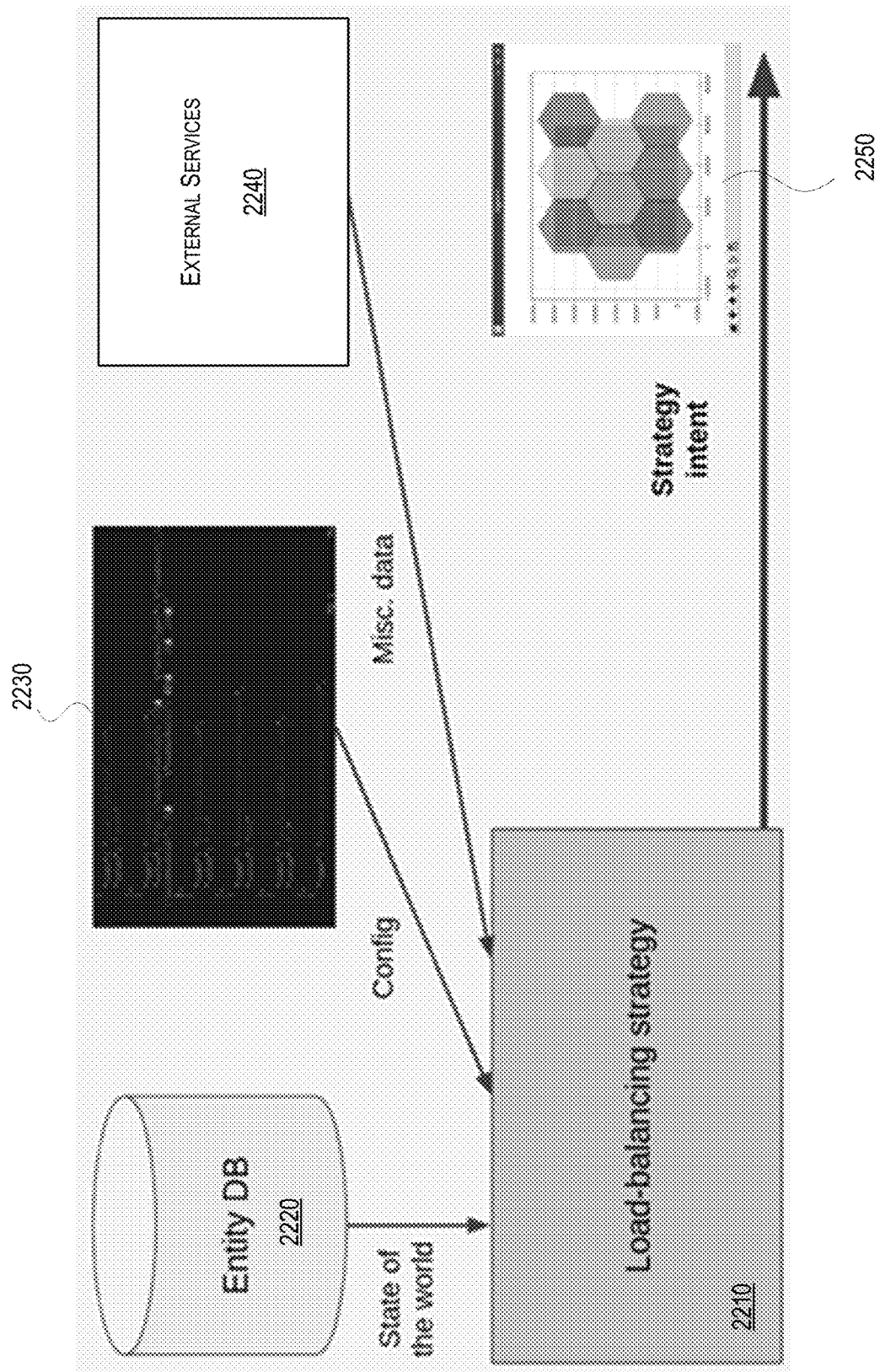
FIG. 22 shows an example load-balancing strategy system in accordance with one or more illustrative aspects described herein.

FIG. 22 shows an example load-balancing strategy system in accordance with one or more illustrative aspects described herein. A load-balancing strategy 2210 may comprise an algorithm that produces a strategy intent 2250. The strategy intent 2250 may be realized by an enforcement service. The load-balancing strategy 2210 may query, from the entity database 2220, the state of the simulation. The load-balancing strategy 2210 may also query configuration data from a configuration data source 2230. The load-balancing strategy 2210 may also query external services 2240 for miscellaneous data, such as data that varies over time, weather data, etc. The load-balancing strategy 2210 may receive data from the various data strategies and make partitioning decisions. As an example of using in-deployment data, entity database data for player locations may be used to determine where dense clusters of players are found. Appropriate regions for boundaries between workers may be determined based on, for example, a Voronoi tessellation. As an example of using outside-of-deployment data, analytics might suggest that a game will be more active on a rainy day. Thus weather data could be used to pre-provision additional workers for a more active deployment. The load-balancing strategy 2210 may output a strategy intent 2250 indicating which entities are to be assigned to which workers. For example, the output may indicate a set of partitions and/or virtual workers.

Strategy intent enforcement may be performed per simulation layer (e.g., physics and chat), and the load-balancing strategy may be split into distinct parts, with each part managing a different layer of the simulation. For example, assume that a simulation has three layers: one for physics, one for simulating weather, and one for a chat system. These layers may be configured and load balanced independently of each other. For example, the layers might not share workers. This may allow for choosing different strategies for each layer. For example, the physics and weather workers may be set up to have the world divided up by physical space, but the chat system may be divided up by user (e.g., player) ID ranges instead. Because a strategy intent may be a representation of how a simulated world is to be load-balanced, it can be configured (dynamically) by developers on the simulation runtime. This may allow developers to write their own load-balancing strategies.

Figure 23:
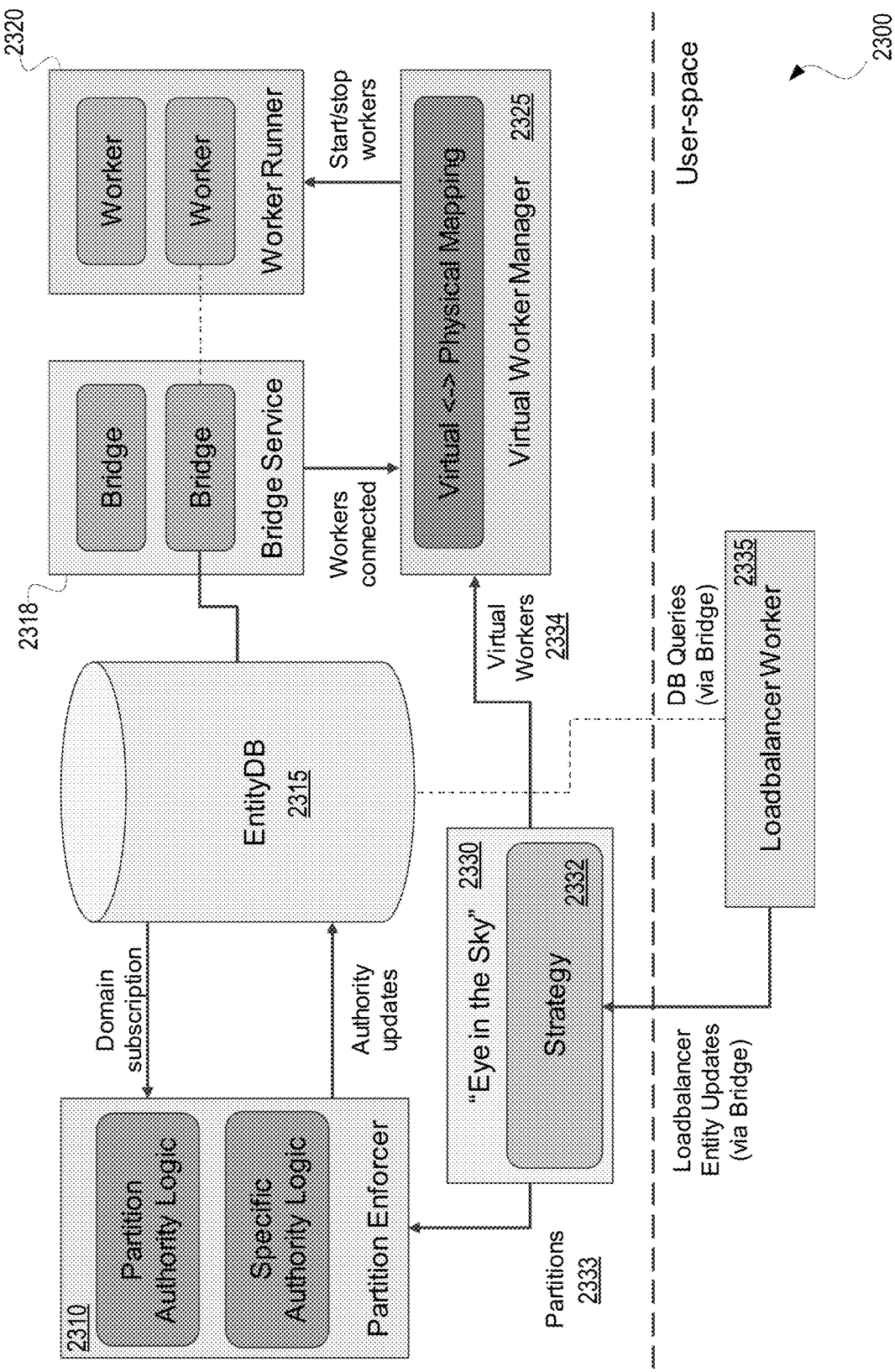
FIG. 23 shows a high-level architecture of an illustrative load-balancing system in accordance with one or more illustrative aspects described herein.

FIG. 23 shows a high-level architecture of an illustrative load-balancing system 2300 in accordance with one or more illustrative aspects described herein. The system 2300 may comprise a database 2315, such as an entity database. As previously explained, the entity database may store the states of a simulation's entities, and bridges, workers, or other elements may subscribe to the database. The system 2300 may comprise a bridge service or layer 2318, which may comprise a plurality of bridges. As previously explained, bridges may act as a distributed gateway to connect workers to the database 2315. The system 2300 may comprise a worker runner or layer 2320. As previously explained, workers may comprise managed workers or unmanaged workers, and may subscribe to one or more queries offered by the database 2315.

The system 2300 may comprise one or more enforcement services used to implement load-balancing in a simulation, such as a large virtual world simulation. An enforcement service may take a strategy intent and may apply it to entities within its domain. As previously explained, a domain may comprise a subset of the entities in the world and may be defined through a query (e.g., an entity database query). In some examples, each enforcement service may act on a unique domain that is different from the domain that other enforcement services act on. Using a single enforcement service to act on a unique domain may prevent the enforcement services from interfering with each other. Because the simulated world may dynamically change its size and computational requirements, domains may be modified dynamically.

A strategy intent may map intended workers to their partitions. A strategy intent may comprise data with, for example, two (or more) fields: an entity database query (e.g., an entity query constraint) and an intended worker (e.g., a virtual worker) for that query (e.g., worker that components satisfying the query are to be assigned to). An enforcement service may be used so that entities within its domain, which match a particular partition query, are delegated to the corresponding worker.

Intent may be separated from enforcement or action for assigning authority over entity-components to workers. For example, one part of the system may be responsible for intent (e.g., determining how many and which kinds of workers are used to simulate the world), while another part of the system may be responsible for enforcement (e.g., starting and stopping workers). The technique may be used for managing workers. For example, both unmanaged workers and managed workers may be assigned to virtual workers. The following table shows an example of intent and action for simulating entities and for having workers.

| | Intent | Action |
|---|---|---|
| Simulating Entities | Entity 1 is be simulated by Worker A | Assign Entity 1 to Worker A |
| Having Workers | There is to be a 'physics' worker | Start a worker that can simulate 'physics' |

Intent may be implemented by load balancing decision-making, as previously explained. Action may be implemented by load balancing enforcement. The intended existence of a worker may be referred to as a virtual worker. A worker scheduler service may be responsible for starting, stopping, and/or restarting workers to make sure that the virtual workers have corresponding workers running. Because the strategy intent may specify the intended worker for each partition, the list of virtual workers for the simulation may be derived from the strategy intent.

With reference to FIG. 23, the system 2300 may comprise an eye in the sky device 2330, which may be used to run a load-balancing strategy algorithm 2332. The eye in the sky device 2330 may be co-located with other services to save on the number of servers used or might not be co-located with other services. As previously explained, the load-balancing strategy algorithm 2332 may receive data from the entity database 2315 (e.g., the state of the simulation), configuration data, external services (e.g., for miscellaneous data, such as data that varies over time), etc. The load-balancing strategy algorithm 2332 may output a strategy intent that indicates which entities are to be assigned to which workers. The strategy intent may be stored in the entity database 2315 and/or provided to the partition enforcers directly. For example, load-balancing strategy algorithm 2332 may send, to a partition enforcer 2310, a set of partitions 2333. The load-balancing strategy algorithm 2332 may also send, to a virtual worker manager 2325, a set of virtual workers 2334.

The system 2300 may comprise the partition enforcer 2310 or a plurality of partition enforcers, which may be spread across several servers. These partition enforcers may share servers with other services to reduce the number of virtual machines used to run a simulation. Alternatively, the partition enforcers may reside in their own servers, such as to isolate computing capacity. Each partition enforcer, of a plurality of partition enforcers in the simulation, may have a domain, which may be spatial, entity id range, or some other way of sharding out partition enforcement such that the partition enforcers do not interfere with each other. A partition enforcer 2310 may receive, from the load-balancing strategy algorithm 2332, the set of partitions 2333. Each partition may indicate a query that specifies a subset of entity-components in a simulation.

Partition authority logic in the partition enforcer 2310 may be used to implement the load-balancing strategy (e.g., as determined by the eye in the sky device 2330). Specific authority logic in the partition enforcer 2310, on the other hand, may be used if a component desires a specific authority assignment. Entities may carry a self-defining read/write permission that describes who is eligible to gain authority over their components. This may either describe a specific type of simulation (e.g., "I require simulation by something belonging to the physics layer") or a specific connected worker (e.g., "I require simulation by the worker with id 1234"). In the latter case, the component in question might not be participating in the load balancing system because it requires a specific authority assignment (e.g., worker with id 1234). Accordingly, the assignment for this component might bypass going through partition authority logic in the partition enforcer 2310.

The partition enforcer 2310 may send, to the database 2315, authority updates (if any), based on the output of the load-balancing strategy algorithm 2332. Each partition enforcer 2310 may subscribe to a query or data domain corresponding to the partition or partitions the partition enforcer is responsible for. The partition enforcer 2310 may receive, from the database 2315, data corresponding to one or more domain subscriptions. For example, the query may be a streaming query, and the partition enforcer 2310 may receive updates each time there is an update to an entity that satisfies the streaming query. Alternatively, the partition enforcer 2310 may periodically query the database 2315 for updates to entities in its partition. A domain may define a query that the partition enforcer 2310 subscribes to. The entity database 2315 may fulfill that subscription with entity update data. The entity database 2315 may send data corresponding to the query subscribed to by the partition enforcer 2310. The subscriptions can be provided as an initial configuration, or dynamically configured via a service.

A partition enforcer may need to know about the partitions relevant to its domain. The partition enforcer may filter out partitions that are not relevant to its domain, so that the simulation may be more easily scaled. If a domain query does not overlap with a partition query, it may be filtered out. For example, if the domain of a partition enforcer is "entities with an odd entity id" and the partition is "entities with an even entity id," the query may be filtered out. More sophisticated filters may be used for more sophisticated domains or partitions (e.g., regions of 3D space that do not overlap). As another example, for component and/or position based queries and where partition enforcers are responsible for regions of space, the enforcers may throw away any partitions that do not apply to the components they care about or to the region of space they care about. The partition enforcer may attempt to determine which entities in its domain have component assignments that do not match any partitions. For those entities with an invalid assignment, the partition enforce may set the intended worker component to have a matching partition. Different methods may be used to achieve this. For example, the partition enforcer may subscribe to an entity database query that returns the count of entities that are within the partition enforcer's domain and incorrectly assigned. The partition enforcer may react when this count is not zero. As another example, the partition enforcer may subscribe to all entities within its domain and make the partition validity checks within the enforcer.

The system 2300 may comprise the virtual process manager 2325 (e.g., a virtual worker manager). Similar to the eye in the sky device 2330, the virtual worker manager 2325 may be co-located with other services to save on the number of servers used or might not be co-located with other services. The virtual worker manager 2325 may receive, from the load-balancing strategy algorithm 2332, the set of virtual processes (e.g., workers) 2334. The set of virtual processes 2334 may comprise a list of virtual processes that are to exist, and the virtual process manager 2325 may determine whether the physical processes exist and start and stop processes as necessary. The virtual worker manager 2325 may manage a virtual to physical mapping between workers. For example, the virtual worker manager 2325 may communicate with the worker runner or layer 2320 to start and stop workers and create new workers as needed. The virtual worker manager 2325 may start and stop physical processes to run the virtual workers. The virtual worker manager 2325 may also receive, from the bridge server or layer 2318 (or one or more other services), information about the state of the worker, such as whether it is connected, whether it has crashed, whether the latency is low, whether there are resources to run it with, etc. For example, a physical process satisfying a virtual worker may crash during a simulation, and the virtual worker manager 2325 may start up another physical process to replace the crashed physical process. The virtual worker manager 2325 may also receive information indicating the number and types of workers connected to the bridges in the bridge layer 2318. The partition enforcer 2310 and the virtual worker manager 2325 may be used to implement the strategy intent determined by the load-balancing strategy algorithm 2332 and based on data received from the load-balancing strategy algorithm 2332.

Figure 24:
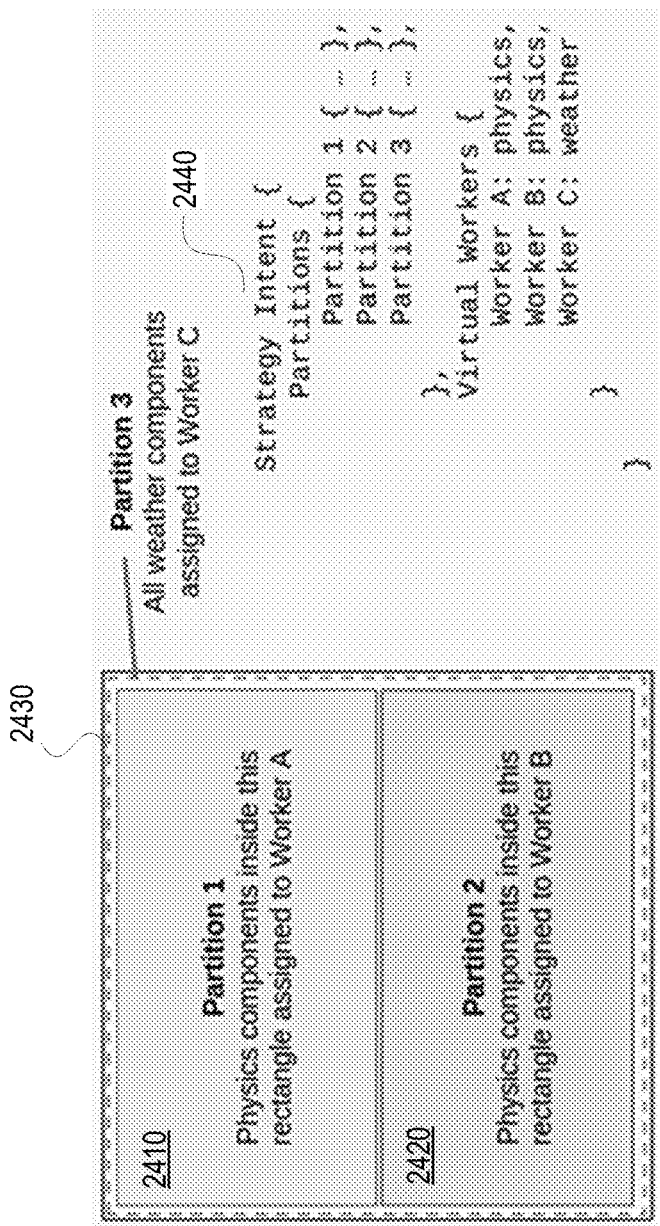
FIG. 24 shows an example of partitions and strategy intent in accordance with one or more illustrative aspects described herein.

FIG. 24 shows an example of partitions and strategy intent in accordance with one or more illustrative aspects described herein. A partition 1 may comprise physics components inside the rectangle 2410 (or other shape) assigned to a worker A. A partition 2 may comprise physics components inside the rectangle 2420 (or other shape) assigned to worker B. A partition 3 2430 may comprise weather components assigned to worker C. The strategy intent 2440 for the example partitions shown in FIG. 24 may comprise, for example:

```
Strategy Intent {
    Partitions {
        Partition 1 { ... },
        Partition 2 { ... },
        Partition 3 { ... },
    },
    Virtual Workers {
        Worker A: physics,
        Worker B: physics,
        Worker C: weather
    }
}
```

Figure 25:
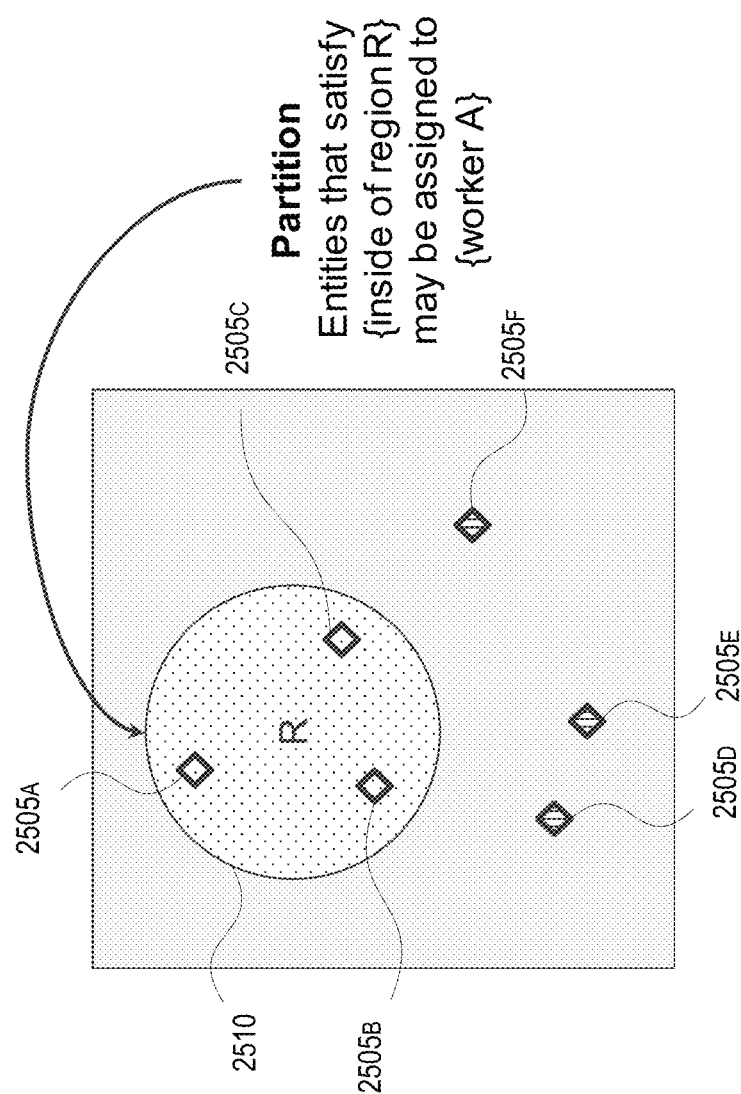
FIG. 25 shows an example of a plurality of entities and entity assignments in accordance with one or more illustrative aspects described herein.

FIG. 25 shows an example of a plurality of entities and entity assignments in accordance with one or more illustrative aspects described herein. The strategy intent for this example may map entities that are within the partition R 2510, such as entities 2505a-c, to worker A. Other entities, such as entities 2505d-f, may be mapped to other workers.

In general, a simulated world may have a plurality of partitions, and each partition may correspond to a different metric that entities may satisfy. For example, partitions may be bounded regions, such as spheres, cylinders, boxes, rectangles, or other shapes. FIGS. 24 and 25 described above show examples of different bounded regions, such as rectangle 2410, rectangle 2420, or circle 2510. Entities may satisfy a metric of a partition. In the example of partitions being bounded regions, an entity may be located in a first bounded region and thus satisfy the metric for the first bounded region. During the simulation, the entity may move in the simulated world and may end up in a second bounded region different from the first. In this scenario, the entity might no longer satisfy the metric for the first bounded region, but may satisfy the metric for the second bounded region. Other metrics for partitions may be used. For example, as described above for FIG. 24, metrics may be different types of components, such as a physics component, a weather component, or any other type of component. Combinations of different metrics may be used. Again with reference to FIG. 24, the metric for partition 1 may be physics components within rectangle 2410, the metric for partition 2 may be physics components within rectangle 2420, and the metric for partition 3 may be all weather components. The simulated world may be divided into numerous different partitions. Partitions may use any number of different types of metrics, and entities satisfying these metrics at a point in time may be assigned to the corresponding partition(s) at that point in time.

Returning to FIG. 23, the system 2300 may comprise a load balancer worker 2335. The load balancer worker may be external (e.g., in a user-space), and may allow users to develop or add to the load balancing strategy. For example, the load balancer worker 2335 may replace the eye in the sky device 2330 in some scenarios. Similar to the eye in the sky device 2330, the load balancer worker 2335 may determine a strategy intent to be used by the partition enforcer(s) 2310 and/or the virtual worker manager 2325. The load balancer worker 2335 may exist where any other kind of worker could run. In some scenarios, a plurality of load balancer workers may contribute to a global strategy intent, and the load balancer workers may do so from several different machines. Use of one or more load balancer worker(s) 2335 may be beneficial because a user may have additional knowledge of their specialized use case that can result in better load balancing algorithm decisions. The load balancer worker 2335 may be able to query or subscribe to a simulation, know about the user's schema, and/or change some state within the simulation runtime. The load balancer worker 2335 may subscribe, via its bridge (not shown), to one or more queries from the database 2315. The load balancer worker 2335 may send, to the load-balancing strategy algorithm 2332 and via its bridge, load balancer entity updates.

Figure 26:
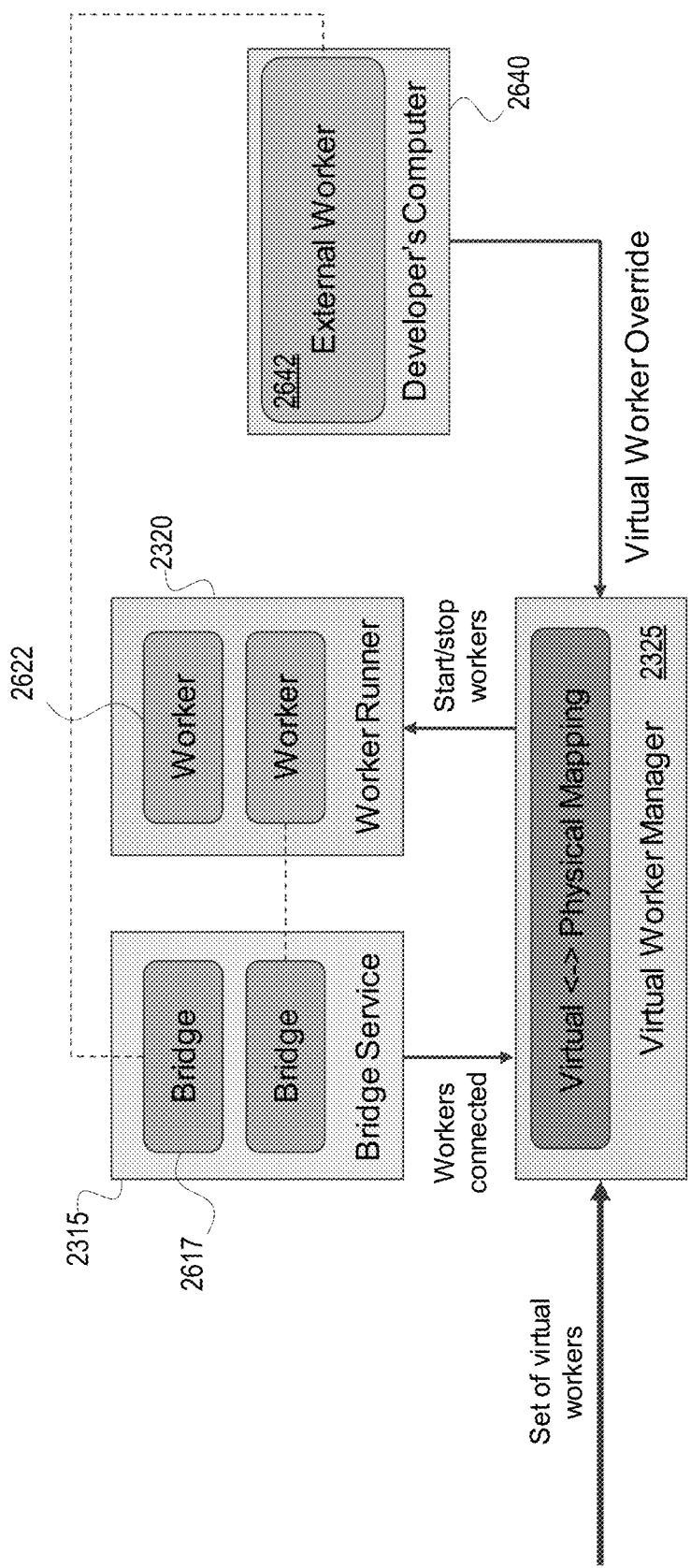
FIG. 26 shows an example of replacing a worker in accordance with one or more illustrative aspects described herein.

FIG. 26 shows an example of replacing a worker in accordance with one or more illustrative aspects described herein. A developer's computer 2640 may run an external worker 2642. If the developer desires to replace an existing worker with the external worker 2642 running on the developer's computer 2640, the developer's computer 2640 may send, to the virtual worker manager 2325, a virtual worker override command. Based on the command, the virtual worker manager 2325 may replace a worker 2622 with the external worker 2642. For example, the virtual worker manager 2325 may send, to the worker layer 2320, a request to stop the worker 2622 or have the worker disconnect from the bridge 2617. The external worker 2642 may then connect to and use the bridge 2617 previously used by the worker 2622. By going through this worker replacement process, the entity components assigned to the managed worker 2622 may now be handled by the external worker 2642. Replacing workers may help users to experiment with load balancing configurations and debug scenarios with multiple workers more easily. For example, a user might observe a bug in their simulation, which may be associated with a particular part of the world assigned to a specific managed worker. The user may connect a worker to a running deployment and have the new worker take over the load from an existing worker in the deployment, replacing the existing worker's role in the load balancer's strategy. The user may connect a worker with additional profiling enabled to track down an issue the previous worker was experiencing, or with entirely different logic. By replacing the managed worker with one under their own control, the user can modify the logic used by the worker, add additional logging and debugging, and/or otherwise investigate the cause of the bug.

Partition components may be placed on different kinds of entities. For example, assume that the simulation comprises a plurality of managed physics workers, one managed auction house worker that is to be global, and a plurality of players. Each player entity (or each player's client's virtual worker entity) may have a partition component, which may be used so that the player gets authority over his or her controls. An example partition component on a player entity or player's client's virtual worker entity is as follows:

```
partition {
    intended_worker: "PlayerClient0",
    query: "PlayerControls component on entity 65"
}
```

There may be a partition component on several load-balancing entities placed throughout the world to spatially distribute physics workers. An example partition component on a load-balancing entity is as follows:

```
partition {
    intended_worker: "Worker2",
    query: "parent entity within the rectangle (0,0,100,100)"
}
```

There may be a partition component on a virtual worker entity for a singleton auction house worker. An example partition component on the auction house worker is as follows:

```
partition {
    intended_worker: "AuctionHouseWorker0",
    query: "BuyOrder components or SellOrder components"
}
```

As explained above, a partition component may be placed on different kinds of entities, depending on the particular load-balancing case the system is dealing with. For unmanaged workers (e.g., players), the lifetime of the partition may correspond to the lifetime of the player. This example may assume that the player entity goes away when the player disconnects. However, if the player entity does not go away when the player disconnects, the partition may be placed on a worker entity associated with the player client. For spatially load-balanced workers (e.g., physics), activities may occur in terms of regions of space, so the load-balancing entities in the world may describe the local partitions. For singleton or global workers, the partition may be placed on the singleton's virtual worker entity itself.

Use of partition components may allow for worker load-balancing. This may also provide a way of baking coarse-grained load-balancing intent into a snapshot, which may allow the simulation to handle snapshots taken in the middle of load-balancing transitions more gracefully. The partition component expressing load-balancing may also allow building tooling around it (e.g. rendering partitions in an inspector). The partition component of load-balancing intent may also allow building internal runtime features more easily. For example, a worker manager may easily determine the workers that need starting in order to fulfill a partition set.

A subscription policy (e.g., checkout policy) of managed workers may be based on the region they are intended to be authoritative on, rather than the entities they are currently authoritative on. This may mean that the scenario of managed workers unnecessarily checking in and out entities may be avoided. For example, if a managed worker knows not only about the immediate entities it has ownership over to simulate, but potentially a larger query describing what it might simulate, the managed worker can pre-load assets or pre-populate caches so that simulating entities in the regions of the query (but not near the existing entities) may be easier.

In some scenarios, two or more partitions may overlap. An enforcement service may be used to decide which of the corresponding intended workers to assign. A conflict resolution approach that may be used may be to change worker assignment when the current assignment does not match any of the intended workers that qualify. This way, oscillation between different intended workers may be avoided, which gives hysteresis and may be good for performance reasons (e.g., since switching authority may have an associated cost). Each partition enforcer may be aware of partitions in the world, such as all of the partitions.

Many of the entity components may belong to a single partition, but some entity components may belong to a plurality of partitions, resulting in overlapping partitions. A desired behavior for overlapping partitions may be defined. For example, transitions of an entity component between different partitions may be determined.

Figure 27:
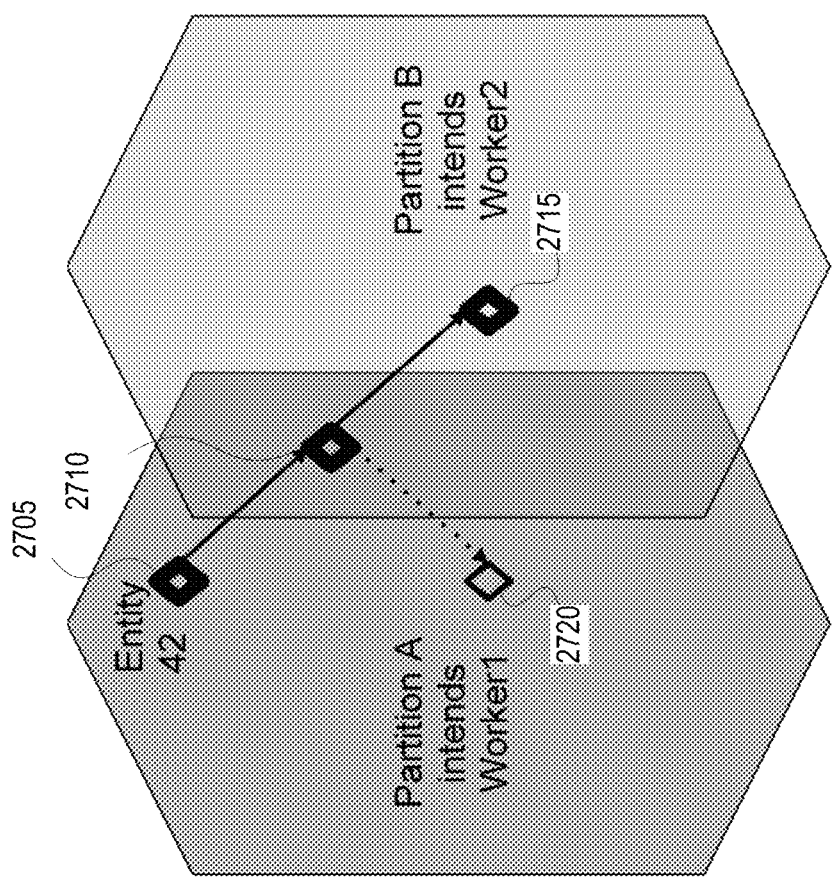
FIG. 27 shows an example of an overlap of partitions in accordance with one or more illustrative aspects described herein.

FIG. 27 shows an example of an overlap of partitions in accordance with one or more illustrative aspects described herein. For example, Entity 42 may be initially assigned to Worker 1 while the Entity 42 is at a position 2705. When Entity 42 moves to a region of overlapping partitions, such as position 2710, Entity 42 might not get reassigned to Worker 2, as partition A may still be valid. If Entity 42 continues out of partition A into the region where partition B is valid (but partition A is not), such as position 2715, Entity 42 may be reassigned to Worker 2. However, if while at position 2710, Entity 42 returns to a region where partition A is valid (but partition B is not), such as position 2720, the system might not have wanted to change authority to Worker 2.

Users may configure overlapping intended authority bands to prevent authority thrashing (e.g., spatial hysteresis), such as to address the scenario that multiple partitions are valid. If the intended behavior is instead for there to be only one worker authoritative for one region of space, then the configuration may be set up with no overlapping partitions.

Whilst the embodiments and aspects have been described in relation to virtual hardware servers, the methods and systems may also be used with other hardware or servers including local or physical servers.

Although the subject matter has been described in language specific to structural features and/or methodological acts, it is to be understood that the subject matter defined in the appended claims is not necessarily limited to the specific features or acts described above. Rather, the specific features and acts described above are described as example implementations of the following claims.

What is claimed is:

1. One or more non-transitory computer readable media storing computer executable instructions that, when executed, cause a system to perform a computer simulation by:

receiving an indication of a streaming query for each worker of a plurality of workers in a worker layer of the computer simulation;

running, on a plurality of machines, a plurality of bridges in a bridge layer of the computer simulation, wherein the plurality of bridges are configured to facilitate data communications between the plurality of workers in the worker layer and one or more databases in a database layer of the computer simulation;

assigning each worker of the plurality of workers to a different bridge of the plurality of bridges; and based on the streaming query for each worker, grouping the plurality of bridges into different groups of bridges, wherein each group of bridges is running on a different machine of the plurality of machines.

2. The one or more non-transitory computer readable media of claim 1, wherein the plurality of bridges comprise a first plurality of bridges, the one or more non-transitory computer readable media storing computer executable instructions that, when executed, cause the system to perform the computer simulation by:

running, on a second plurality of machines, a second plurality of bridges, wherein the first plurality of bridges are configured to facilitate data communications between the plurality of workers in the worker layer and the second plurality of bridges, and wherein the second plurality of bridges are configured to facilitate data communications between the first plurality of bridges and the one or more databases.

3. The one or more non-transitory computer readable media of claim 1, wherein a first worker, of the plurality of workers, comprises an unmanaged worker, and wherein a second worker, of the plurality of workers, comprises a managed worker.

4. The one or more non-transitory computer readable media of claim 1, wherein the one or more databases comprise a plurality of database shards, wherein each database shard is configured to store data from distinct data domains.

5. The one or more non-transitory computer readable media of claim 1, wherein grouping the plurality of bridges into different groups of bridges is based on an amount of data corresponding to an overlapping portion of streaming queries in each of the different groups of bridges.

6. The one or more non-transitory computer readable media of claim 1, storing computer executable instructions that, when executed, cause the system to perform the computer simulation by:

running, on a machine of the plurality of machines, a database client, wherein each bridge running on the machine is connected to the database client, and wherein the database client is configured to subscribe to a streaming query for receiving, from the one or more databases, streaming data corresponding to the streaming query.

7. The one or more non-transitory computer readable media of claim 6, storing computer executable instructions that, when executed, cause the system to perform the computer simulation by:

combining streaming queries on the machine into a combined streaming query, wherein the database client is configured to subscribe to the combined streaming query for receiving, from the one or more databases, streaming data corresponding to the combined streaming query.

8. The one or more non-transitory computer readable media of claim 6, wherein the database client is configured to divide the streaming data corresponding to the streaming query into a plurality of portions of streaming data, and wherein the database client is configured to send, to each bridge running on the machine, one of the plurality of portions of the streaming data.

9. The one or more non-transitory computer readable media of claim 1, storing computer executable instructions that, when executed, cause the system to perform the computer simulation by:
determining to migrate, to a first machine of the plurality of machines, a first bridge of the plurality of bridges and running on a second machine of the plurality of machines, wherein a first worker is assigned to the first bridge;
running, on the first machine of the plurality of machines, a second bridge; and
assigning, to the second bridge running on the first machine, the first worker.

10. The one or more non-transitory computer readable media of claim 9, wherein determining to migrate the first bridge is based on an amount of data corresponding to an overlapping portion of a streaming query for the first worker with streaming queries for workers assigned to bridges running on the first machine.

11. The one or more non-transitory computer readable media of claim 1, wherein the plurality of machines comprise a plurality of virtual machines.

12. A method comprising:
receiving, by a computing device, an indication of a streaming query for each worker of a plurality of workers in a worker layer of a computer simulation;
running, on a plurality of machines, a plurality of bridges in a bridge layer of the computer simulation, wherein the plurality of bridges are configured to facilitate data communications between the plurality of workers in the worker layer and one or more databases in a database layer of the computer simulation;
assigning, by the computing device, each worker of the plurality of workers to a different bridge of the plurality of bridges; and
based on the streaming query for each worker, grouping, by the computing device, the plurality of bridges into different groups of bridges, wherein each group of bridges is running on a different machine of the plurality of machines.

13. The method of claim 12, wherein the plurality of bridges comprise a first plurality of bridges, the method further comprising:
running, on a second plurality of machines, a second plurality of bridges, wherein the first plurality of bridges are configured to facilitate data communications between the plurality of workers in the worker layer and the second plurality of bridges, and wherein the second plurality of bridges are configured to facilitate data communications between the first plurality of bridges and the one or more databases.

14. The method of claim 12, wherein a first worker, of the plurality of workers, comprises an unmanaged worker, and wherein a second worker, of the plurality of workers, comprises a managed worker.

15. The method of claim 12, wherein the one or more databases comprise a plurality of database shards, wherein each database shard is configured to store data from distinct data domains.

16. The method of claim 12, wherein grouping the plurality of bridges into different groups of bridges is based on an amount of data corresponding to an overlapping portion of streaming queries in each of the different groups of bridges.

17. An apparatus comprising:
one or more computer processor controlling some operations of the apparatus; and
memory storing computer-executable instructions that, when executed by the one or more computer processor, cause the apparatus to:
receive an indication of a streaming query for each worker of a plurality of workers in a worker layer of a computer simulation;
run, on a plurality of machines, a plurality of bridges in a bridge layer of the computer simulation, wherein the plurality of bridges are configured to facilitate data communications between the plurality of workers in the worker layer and one or more databases in a database layer of the computer simulation;
assign each worker of the plurality of workers to a different bridge of the plurality of bridges; and
based on the streaming query for each worker, group the plurality of bridges into different groups of bridges, wherein each group of bridges is running on a different machine of the plurality of machines.

18. The apparatus of claim 17, wherein the memory stores computer-executable instructions that, when executed by the one or more computer processor, cause the apparatus to:
run, on a machine of the plurality of machines, a database client, wherein each bridge running on the machine is connected to the database client, and wherein the database client is configured to subscribe to a streaming query for receiving, from the one or more databases, streaming data corresponding to the streaming query.

19. The apparatus of claim 18, wherein the memory stores computer-executable instructions that, when executed by the one or more computer processor, cause the apparatus to:
combine streaming queries on the machine into a combined streaming query, wherein the database client is configured to subscribe to the combined streaming query for receiving, from the one or more databases, streaming data corresponding to the combined streaming query.

20. The apparatus of claim 18, wherein the database client is configured to divide the streaming data corresponding to the streaming query into a plurality of portions of streaming data, and wherein the database client is configured to send, to each bridge running on the machine, one of the plurality of portions of the streaming data.

* * * * *